(12) United States Patent
Liu et al.

(10) Patent No.: US 12,346,541 B2
(45) Date of Patent: Jul. 1, 2025

(54) SYSTEMS, METHODS, AND GRAPHICAL USER INTERFACES FOR ADAPTIVE DESIGN EXPLORATION AND MODEL MANAGEMENT

(71) Applicant: JMP Statistical Discovery LLC, Cary, NC (US)

(72) Inventors: Peng Liu, Naperville, IL (US); Rajneesh Rajneesh, Cary, NC (US); Caleb Bridges King, Roanoke, VA (US); Ryan Adam Lekivetz, Cary, NC (US); Jacob Davis Rhyne, Dallas, NC (US)

(73) Assignee: JMP Statistical Discovery LLC, Cary, NC (US)

(*) Notice: Subject to any disclaimer, the term of this patent is extended or adjusted under 35 U.S.C. 154(b) by 0 days.

(21) Appl. No.: 18/933,296

(22) Filed: Oct. 31, 2024

(65) Prior Publication Data
US 2025/0147642 A1 May 8, 2025

Related U.S. Application Data

(63) Continuation of application No. 18/932,923, filed on Oct. 31, 2024.

(60) Provisional application No. 63/557,589, filed on Feb. 25, 2024, provisional application No. 63/613,184, filed on Dec. 21, 2023, provisional application No. 63/603,036, filed on Nov. 27, 2023, provisional application No. 63/547,780, filed on Nov. 8, 2023.

(51) Int. Cl.
G06F 3/0482 (2013.01)
G06F 3/0484 (2022.01)
G06F 30/12 (2020.01)

(52) U.S. Cl.
CPC .......... *G06F 3/0484* (2013.01); *G06F 3/0482* (2013.01); *G06F 30/12* (2020.01)

(58) Field of Classification Search
CPC ................................................. G06F 3/048–05
See application file for complete search history.

(56) References Cited

U.S. PATENT DOCUMENTS

| | | | |
|---|---|---|---|
| 6,990,238 B1 * | 1/2006 | Saffer | G06F 16/34 707/E17.093 |
| 7,827,527 B1 * | 11/2010 | Chiluvuri | G06F 8/36 717/109 |
| 10,970,651 B1 * | 4/2021 | Barker | G06N 20/10 |
| 11,526,261 B1 * | 12/2022 | Leach | G06F 17/18 |
| 2005/0246331 A1 * | 11/2005 | De Vorchik | G06F 16/168 |
| 2006/0031187 A1 * | 2/2006 | Pyrce | G06F 3/04815 |
| 2009/0024411 A1 | 1/2009 | Albro et al. | |

(Continued)

*Primary Examiner* — Daniel Rodriguez
(74) *Attorney, Agent, or Firm* — Padowithz Alce; Alce PLLC

(57) ABSTRACT

A computer-implemented system, computer-implemented method, and computer-program product includes receiving, via a graphical user interface, a request to generate an initial design of experiment plan based on one or more experiment factors; generating a first plan settings container object that represents the initial design of experiment plan in computer memory; and instantiating, within the graphical user interface, a plan explorer section that includes a plan settings graphical entry that displays a graphical representation of a plan factors data object and a plan model data object associated with the first plan settings container object.

30 Claims, 38 Drawing Sheets

(56) References Cited

U.S. PATENT DOCUMENTS

| | | |
|---|---|---|
| 2009/0125270 A1 | 5/2009 | O'Shea et al. |
| 2012/0232858 A1* | 9/2012 | Zhou ................ G06F 30/23 |
| | | 703/2 |
| 2013/0132872 A1* | 5/2013 | Milirud ............. H04L 43/045 |
| | | 715/764 |
| 2013/0268839 A1* | 10/2013 | Lefebvre ............. G06F 40/10 |
| | | 715/254 |
| 2014/0033079 A1* | 1/2014 | Sage .............. G06Q 10/06393 |
| | | 715/760 |
| 2017/0140007 A1 | 5/2017 | Agarwal et al. |
| 2017/0140319 A1 | 5/2017 | Gottemukkala et al. |
| 2017/0160733 A1* | 6/2017 | Oostendorp .......... G06Q 50/04 |
| 2018/0253194 A1* | 9/2018 | Javadi ................. G06F 8/38 |
| 2019/0064116 A1* | 2/2019 | Liu ................... G01N 27/82 |
| 2019/0227994 A1* | 7/2019 | Haag ............... G06F 16/1744 |
| 2021/0109894 A1 | 4/2021 | Ramesh et al. |
| 2021/0365842 A1* | 11/2021 | Parker ................ G06F 18/40 |
| 2022/0074837 A1* | 3/2022 | Beretta ................ G01N 3/08 |
| 2022/0368607 A1 | 11/2022 | Rubarkh et al. |
| 2024/0210913 A1* | 6/2024 | Nemani ........... G05B 19/4065 |
| 2024/0212049 A1 | 6/2024 | Ghelichi et al. |

\* cited by examiner

```
Constant Stress ALT Design(  ← 846A
        Factors(
846B →      Factor(
                    Factor Name( "Temp" ),
                    Number of Levels( 3 ),
                    Factor Transformation( "Arrhenius Fahrenheit" ),
                    Low Usage Condition( 20 ),
                    High Usage Condition( 30 ),          ← 806A
                    Low Usage Condition( 90 ),
                    High Usage Condition( 110 )
            ),
            Factor(
                    Factor Name( "Voltage" ),
                    Number of Levels( 3 ),
                    Factor Transformation ( "Log" ),     ← 806B
                    Low Usage Condition( 20 ),
                    High Usage Condition( 30 ),
                    Low Usage Condition( 90 ),
                    High Usage Condition( 110 )
            )
        ),
        ALT Plan(
846C →          "Plan Settings 1",
                Plan Factors(   ← 812A
                    Factor(
                            Factor Name( "Temp" ),
                            Number of Levels( 3 ),
                            Factor Transformation( "Arrhenius Celsius" ),
                            Low Usage Condition( 20 ),
                            High Usage Condition( 30 ),
                            Low Usage Condition( 90 ),
                            High Usage Condition( 110 )
                    ),
                    Factor(
                            Factor Name ( "Voltage" ),
                            Number of Levels( 3 ),
                            Factor Transformation( "Log" ),
                            Low Usage Condition( 20 ),
                            High Usage Condition( 30 ),
                            Low Usage Condition( 90 ),
                            High Usage Condition( 110 )
                    )
```

FIG. 8L

```
                    High Usage Condition( 30 ),
                    Low Usage Condition( 90 ),
                    High Usage Condition( 110 )
            ),
            Factor(
                    Factor Name( "Voltage" ),
                    Number of Levels( 3 ),
                    Factor Transformation( "Log" ),
                    Low Usage Condition( 20 ),
                    High Usage Condition( 30 ),
                    Low Usage Condition( 90 ),
                    High Usage Condition( 110 )
            )
    ),
    Plan Model(    ←—814B
            Distribution Choice( "Lognormal" ),
            Optimality Criterion( "Quantile" ),
            Probability of Interest ( 0.1 ),
            Total Units Under Test( 100 ),
            Test Length( 1000 ),
            Planning Values by Failure Quantiles(
                    [90 90 0.1 91.4716306378044,
                    110 90 0.1 78.8114964779219,
                    90 110 0.1 89.4448419123717],
                    [1]
            )
    ),
846G—→ ALT Plan Design(
            "Test Plan 1-3",
            Design Model(
                    Distribution Choice( "Weibull" ),
                    Optimality Criterion( "Failure Probability" ),
                    Failure Time of Interest( 100 ),
                    Total Units Under Test( 100 ),
                    Test Length( 1000 ),
                    Planning Values by Failure Quantiles(
                            [90 90 0.1 97.8620666168239,
                            110 90 0.1 79.0679240523495,
                            90 110 0.1 95.3833343115906],
                            [1]
                    ),
```

FIG. 8L
(Continued)

910 — Displaying, via a user interface, an interactive failure probability table comprising a plurality of editable failure setting rows, wherein a respective editable failure setting row of the plurality of editable failure setting rows at least includes an editable probability of failure field and an editable failure time field

920 — Displaying, concurrently with the interactive failure probability table, an interactive failure probability graph that includes a plurality of response distribution curves generated for the plurality of editable failure setting rows, wherein a respective response distribution curve of the plurality of response distribution curves includes a draggable marker positioned at a point on the respective response distribution curve that corresponds to a current value of the editable probability of failure field and the editable failure time field

930 — Detecting, via the user interface, an input moving the draggable marker from the point on the respective response distribution curve to a new point on the interactive failure probability graph that corresponds to a new probability of failure value and a new failure time value

940 — Dynamically updating the editable probability of failure field to the new probability of failure value and the editable failure time field to the new failure time value in response to detecting the input moving the draggable marker

1110 Receiving one or more inputs corresponding to a request to compare a plurality of models

1120 Displaying a model comparison user interface in response to receiving the request, wherein the model comparison user interface includes:

1120A An interactive model comparison graph that plots an efficacy of the plurality of models

1120B An interactive model comparison table that includes a plurality of selectable model comparison rows corresponding to the plurality of models

1120C A model control toolbar that includes one or more selectable control elements for dynamically controlling which of the plurality of models are under comparison in the interactive model comparison graph and the interactive model comparison table

1130 Detecting, at the model control toolbar, a selection of a respective selectable control element of the one or more selectable control elements to transition the interactive model comparison graph and the interactive model comparison table from comparing the plurality of models to comparing a new set of models

1140 Concurrently modifying the interactive model comparison graph and the interactive model comparison table in accordance with the selection detected at the model control toolbar

FIG. 11

SYSTEMS, METHODS, AND GRAPHICAL USER INTERFACES FOR ADAPTIVE DESIGN EXPLORATION AND MODEL MANAGEMENT

CROSS-REFERENCE TO RELATED APPLICATIONS

This application is a continuation of U.S. patent application Ser. No. 18/932,923, filed 31 Oct. 2024, which claims the benefit of U.S. Provisional Application No. 63/557,589, filed on 25 Feb. 2024, U.S. Provisional Application No. 63/613,184, filed on 21 Dec. 2023, U.S. Provisional Application No. 63/603,036, filed on 27 Nov. 2023, and U.S. Provisional Application No. 63/547,780, filed on 8 Nov. 2023, which are incorporated in their entireties by this reference.

TECHNICAL FIELD

This invention relates generally to the computational modeling field and, more specifically, to new and useful systems, methods, and graphical user interfaces for adaptive exploration and management of statistical configurations.

BACKGROUND

Conventional tools for exploring various statistical configurations often lack the flexibility needed for interactive exploration and adjustment. These tools typically follow a structured, step-by-step approach that limits users from making adjustments fluidly in response to changing preferences. This rigidity complicates the side-by-side evaluation of alternative statistical configurations, making it time-consuming and challenging to explore different options without redoing prior work.

Accordingly, there is a need for new and useful systems, methods, and graphical user interfaces that allow users to refine, compare, and explore statistical configurations efficiently. The embodiments of the present application provide technical solutions that at least address the needs described above, as well as the deficiencies of the state of the art.

BRIEF SUMMARY OF THE EMBODIMENT(S)

This summary is not intended to identify only key or essential features of the described subject matter, nor is it intended to be used in isolation to determine the scope of the described subject matter. The subject matter should be understood by reference to appropriate portions of the entire specification of this patent, any or all drawings, and each claim.

In some embodiments, a computer-program product comprises a non-transitory machine-readable storage medium storing computer instructions that, when executed by one or more processors, perform operations comprising: receiving, via a graphical user interface, a request to generate an initial design of experiment plan based on one or more experiment factors; generating a first plan settings container object that represents the initial design of experiment plan in computer memory, wherein generating the first plan settings container object includes: creating a plan factors data object based on the one or more experiment factors, and creating a plan model data object that stores parameters of a model associated with the first plan settings container object; instantiating, within the graphical user interface, a plan explorer section that includes a plan settings graphical entry that displays a graphical representation of the plan factors data object and the plan model data object associated with the first plan settings container object; receiving, via the graphical user interface, a request to generate an initial design of experiment test plan for the initial design of experiment plan; associating the first plan settings container object with a first test plan container object that represents the initial design of experiment test plan in the computer memory, wherein the first test plan container object is used to generate one or more experimental run plans for the model associated with the first plan settings container object; and instantiating, within the plan settings graphical entry corresponding to the first plan settings container object, a test plan explorer section that includes a first test plan graphical entry that displays a graphical representation of the one or more experimental runs plans generated for the model associated with the first plan settings container object.

In some embodiments, the request to generate the initial design of experiment plan is received in response to an input selecting a selectable user interface element, and the computer instructions, when executed by the one or more processors, perform operations further comprising: detecting an additional input selecting the selectable user interface element; performing a determination to determine if the one or more experiment factors were modified between the input and the additional input; and if the determination determines that the one or more experiment factors were modified between the input and the additional input: generating a second plan settings container object that represents a second design of experiment plan in the computer memory, and adding, to the plan explorer section, a second plan settings graphical entry corresponding to the second plan settings container object.

In some embodiments, the computer instructions, when executed by the one or more processors, perform operations further comprising: if the determination determines that the one or more experiment factors were not modified between the input and the additional input: forgoing generating the second plan settings container object, and forgoing adding the second plan settings graphical entry to the plan explorer section.

In some embodiments, the one or more experiment factors were modified between the input and the additional input, generating the first plan settings container object corresponding to the initial design of experiment plan includes: creating the plan factors data object based on a state of the one or more experiment factors when the input is received, and generating the second plan settings container object corresponding to the second design of experiment plan includes: creating a second plan factors data object based on a state of the one or more experiment factors when the additional input is received.

In some embodiments, the test plan explorer section included within the plan settings graphical entry comprises the first test plan graphical entry and further comprises a second test plan graphical entry, and the computer instructions, when executed by the one or more processors, perform operations further comprising: receiving, via the graphical user interface, a deletion input for removing the second test plan graphical entry from the test plan explorer section, and in response to receiving the deletion input: ceasing display of the second test plan graphical entry in the test plan explorer section, and maintaining display of the first test plan graphical entry in the test plan explorer section.

In some embodiments, the plan explorer section includes the plan settings graphical entry corresponding to the first plan settings container object and further includes a second plan settings graphical entry corresponding to a second plan settings container object, and the computer instructions, when executed by the one or more processors, perform operations further comprising: receiving, via the graphical user interface, a deletion input for removing the second plan settings graphical entry from the plan explorer section, and in response to receiving the deletion input: ceasing display of the second plan settings graphical entry in the plan explorer section, and maintaining display of the plan settings graphical entry corresponding to the first plan settings container object in the plan explorer section.

In some embodiments, a test plan explorer section of the second plan settings graphical entry includes one or more second test plan graphical entries, and ceasing display of the second plan settings graphical entry includes ceasing display of the test plan explorer section of the second plan settings graphical entry.

In some embodiments, the request to generate the initial design of experiment test plan for the initial design of experiment plan is received in response to an input selecting a selectable user interface element, and the computer instructions, when executed by the one or more processors, perform operations further comprising: detecting an additional input selecting the selectable user interface element; and in response to detecting the additional input: associating the first plan settings container object with a second test plan container object, different from the first test plan container object, and adding, to the test plan explorer section of the plan settings graphical entry, a second test plan graphical entry corresponding to the second test plan container object.

In some embodiments, the in response to detecting the additional input further includes: performing a determination to determine if the plan factors data object or the plan model data object was modified between the input and the additional input; if the determination determines that the plan factors data object or the plan model data object was modified between the input and the additional input: associating the first plan settings container object with the second test plan container object, and adding the second test plan graphical entry to the test plan explorer section of the plan settings graphical entry; and if the determination determines that the plan factors data object and the plan model data object were not modified between the input and the additional input: forgoing associating the first plan settings container object with the second test plan container object, and forgoing adding the second test plan graphical entry to the test plan explorer section.

In some embodiments, the plan explorer section of the graphical user interface includes a tab container, and the plan settings graphical entry corresponds to a tab within the tab container.

In some embodiments, the test plan explorer section of the plan settings graphical entry includes a tab container, and the first test plan graphical entry corresponds to a tab within the tab container.

In some embodiments, the computer instructions, when executed by the one or more processors, perform operations further comprising: generating a file that serializes the initial design of experiment plan and the initial design of experiment test plan for the initial design of experiment plan, wherein generating the file includes: instantiating, in the file, an experiment configuration entry; adding, to the experiment configuration entry, a factors configuration entry that serializes the one or more experiment factors; adding, to the experiment configuration entry, a plan settings entry that serializes the first plan settings container object, including the plan factors data object and the plan model data object; and adding, to the plan settings entry, a test design entry that serializes the first test plan container object.

In some embodiments, the experiment configuration entry corresponds to a root of the file, the factors configuration entry and the plan settings entry are child elements of the experiment configuration entry and stored at a same level in the file, an entry corresponding to the plan factors data object and an entry corresponding to the plan model data object are child elements of the plan settings entry, and the test design entry is a child element of the plan settings entry and is stored at a same level as the entry corresponding to the plan factors data object and the entry corresponding to the plan model data object.

In some embodiments, the computer instructions, when executed by the one or more processors, perform operations further comprising: receiving the file via an upload user interface, and in response to receiving the file: re-creating the one or more experiment factors, re-generating the first plan settings container object, re-instantiating the plan explorer section to include the plan settings graphical entry, re-associating the first plan settings container object with the first test plan container object, and re-instantiating the test plan explorer section to include the first test plan graphical entry.

In some embodiments, a computer-implemented method comprises: receiving, via a graphical user interface, a request to generate an initial design of experiment plan based on one or more experiment factors; generating a first plan settings container object that represents the initial design of experiment plan in computer memory, wherein generating the first plan settings container object includes: creating a plan factors data object based on the one or more experiment factors, and creating a plan model data object that stores parameters of a model associated with the first plan settings container object; instantiating, within the graphical user interface, a plan explorer section that includes a plan settings graphical entry that displays a graphical representation of the plan factors data object and the plan model data object associated with the first plan settings container object; receiving, via the graphical user interface, a request to generate an initial design of experiment test plan for the initial design of experiment plan; associating the first plan settings container object with a first test plan container object that represents the initial design of experiment test plan in the computer memory, wherein the first test plan container object is used to generate one or more experimental run plans for the model associated with the first plan settings container object; and instantiating, within the plan settings graphical entry corresponding to the first plan settings container object, a test plan explorer section that includes a first test plan graphical entry that displays a graphical representation of the one or more experimental runs plans generated for the model associated with the first plan settings container object.

In some embodiments, the request to generate the initial design of experiment plan is received in response to an input selecting a selectable user interface element, and the computer-implemented method further comprises: detecting an additional input selecting the selectable user interface element; performing a determination to determine if the one or more experiment factors were modified between the input and the additional input; and if the determination determines that the one or more experiment factors were modified between the input and the additional input: generating a second plan settings container object that represents a second design of experiment plan in the computer memory, and adding, to the plan explorer section, a second plan settings graphical entry corresponding to the second plan settings container object.

In some embodiments, the computer-implemented method further comprises: if the determination determines that the one or more experiment factors were not modified between the input and the additional input: forgoing generating the second plan settings container object, and forgoing adding the second plan settings graphical entry to the plan explorer section.

In some embodiments, the one or more experiment factors were modified between the input and the additional input, generating the first plan settings container object corresponding to the initial design of experiment plan includes: creating the plan factors data object based on a state of the one or more experiment factors when the input is received, and generating the second plan settings container object corresponding to the second design of experiment plan includes: creating a second plan factors data object based on a state of the one or more experiment factors when the additional input is received.

In some embodiments, the test plan explorer section included within the plan settings graphical entry comprises the first test plan graphical entry and further comprises a second test plan graphical entry, and the computer-implemented method further comprises: receiving, via the graphical user interface, a deletion input for removing the second test plan graphical entry from the test plan explorer section, and in response to receiving the deletion input: ceasing display of the second test plan graphical entry in the test plan explorer section, and maintaining display of the first test plan graphical entry in the test plan explorer section.

In some embodiments, the plan explorer section includes the plan settings graphical entry corresponding to the first plan settings container object and further includes a second plan settings graphical entry corresponding to a second plan settings container object, and the computer-implemented method further comprises: receiving, via the graphical user interface, a deletion input for removing the second plan settings graphical entry from the plan explorer section, and in response to receiving the deletion input: ceasing display of the second plan settings graphical entry in the plan explorer section, and maintaining display of the plan settings graphical entry corresponding to the first plan settings container object in the plan explorer section.

In some embodiments, a test plan explorer section of the second plan settings graphical entry includes one or more second test plan graphical entries, and ceasing display of the second plan settings graphical entry includes ceasing display of the test plan explorer section of the second plan settings graphical entry.

In some embodiments, the request to generate the initial design of experiment test plan for the initial design of experiment plan is received in response to an input selecting a selectable user interface element, and the computer-implemented method further comprises: detecting an additional input selecting the selectable user interface element; and in response to detecting the additional input: associating the first plan settings container object with a second test plan container object, different from the first test plan container object, and adding, to the test plan explorer section of the plan settings graphical entry, a second test plan graphical entry corresponding to the second test plan container object.

In some embodiments, a computer-implemented system comprises: one or more processors; a memory; a computer-readable medium operably coupled to the one or more processors, the computer-readable medium having computer-readable instructions stored thereon that, when executed by the one or more processors, cause a computing device to perform operations comprising: receiving, via a graphical user interface, a request to generate an initial design of experiment plan based on one or more experiment factors; generating a first plan settings container object that represents the initial design of experiment plan in computer memory, wherein generating the first plan settings container object includes: creating a plan factors data object based on the one or more experiment factors, and creating a plan model data object that stores parameters of a model associated with the first plan settings container object; instantiating, within the graphical user interface, a plan explorer section that includes a plan settings graphical entry that displays a graphical representation of the plan factors data object and the plan model data object associated with the first plan settings container object; receiving, via the graphical user interface, a request to generate an initial design of experiment test plan for the initial design of experiment plan; associating the first plan settings container object with a first test plan container object that represents the initial design of experiment test plan in the computer memory, wherein the first test plan container object is used to generate one or more experimental run plans for the model associated with the first plan settings container object; and instantiating, within the plan settings graphical entry corresponding to the first plan settings container object, a test plan explorer section that includes a first test plan graphical entry that displays a graphical representation of the one or more experimental runs plans generated for the model associated with the first plan settings container object.

In some embodiments, the request to generate the initial design of experiment plan is received in response to an input selecting a selectable user interface element, and the computer-readable instructions cause the computing device to perform operations further comprising: detecting an additional input selecting the selectable user interface element; performing a determination to determine if the one or more experiment factors were modified between the input and the additional input; and if the determination determines that the one or more experiment factors were modified between the input and the additional input: generating a second plan settings container object that represents a second design of experiment plan in the computer memory, and adding, to the plan explorer section, a second plan settings graphical entry corresponding to the second plan settings container object.

In some embodiments, the computer-readable instructions cause the computing device to perform operations further comprising: if the determination determines that the one or more experiment factors were not modified between the input and the additional input: forgoing generating the second plan settings container object, and forgoing adding the second plan settings graphical entry to the plan explorer section.

In some embodiments, the one or more experiment factors were modified between the input and the additional input, generating the first plan settings container object corresponding to the initial design of experiment plan includes: creating the plan factors data object based on a state of the one or more experiment factors when the input is received, and generating the second plan settings container object corresponding to the second design of experiment plan includes: creating a second plan factors data object based on a state of the one or more experiment factors when the additional input is received.

In some embodiments, the test plan explorer section included within the plan settings graphical entry comprises the first test plan graphical entry and further comprises a second test plan graphical entry, and the computer-readable instructions cause the computing device to perform operations further comprising: receiving, via the graphical user interface, a deletion input for removing the second test plan graphical entry from the test plan explorer section, and in response to receiving the deletion input: ceasing display of the second test plan graphical entry in the test plan explorer section, and maintaining display of the first test plan graphical entry in the test plan explorer section.

In some embodiments, the plan explorer section includes the plan settings graphical entry corresponding to the first plan settings container object and further includes a second plan settings graphical entry corresponding to a second plan settings container object, and the computer-readable instructions cause the computing device to perform operations further comprising: receiving, via the graphical user interface, a deletion input for removing the second plan settings graphical entry from the plan explorer section, and in response to receiving the deletion input: ceasing display of the second plan settings graphical entry in the plan explorer section, and maintaining display of the plan settings graphical entry corresponding to the first plan settings container object in the plan explorer section.

In some embodiments, a test plan explorer section of the second plan settings graphical entry includes one or more second test plan graphical entries, and ceasing display of the second plan settings graphical entry includes ceasing display of the test plan explorer section of the second plan settings graphical entry.

In some embodiments, the request to generate the initial design of experiment test plan for the initial design of experiment plan is received in response to an input selecting a selectable user interface element, and the computer-readable instructions cause the computing device to perform operations further comprising: detecting an additional input selecting the selectable user interface element; and in response to detecting the additional input: associating the first plan settings container object with a second test plan container object, different from the first test plan container object, and adding, to the test plan explorer section of the plan settings graphical entry, a second test plan graphical entry corresponding to the second test plan container object.

In some embodiments, a computer-program product comprises a non-transitory machine-readable storage medium storing computer instructions that, when executed by one or more processors, perform operations comprising: displaying, via a user interface, an interactive failure probability table comprising a plurality of editable failure setting rows, wherein a respective editable failure setting row of the plurality of editable failure setting rows at least includes an editable probability of failure field and an editable failure time field; displaying, concurrently with the interactive failure probability table, an interactive failure probability graph that includes a plurality of response distribution curves generated for the plurality of editable failure setting rows, wherein a respective response distribution curve of the plurality of response distribution curves includes a draggable marker positioned at a point on the respective response distribution curve that corresponds to a current value of the editable probability of failure field and the editable failure time field; detecting, via the user interface, an input moving the draggable marker from the point on the respective response distribution curve to a new point on the interactive failure probability graph that corresponds to a new probability of failure value and a new failure time value; and dynamically updating the editable probability of failure field to the new probability of failure value and the editable failure time field to the new failure time value in response to detecting the input moving the draggable marker.

In some embodiments, the computer instructions, when executed by the one or more processors, perform operations further comprising: while detecting the input moving the draggable marker: detecting that the input moves the draggable marker across one or more intermediate points located between the point on the respective response distribution curve and the new point on the interactive failure probability graph, and dynamically updating the editable probability of failure field and the editable failure time field as the draggable marker moves across the one or more intermediate points.

In some embodiments, dynamically updating the editable probability of failure field and the editable failure time field as the draggable marker moves across the one or more intermediate points occurs in real-time or near real-time.

In some embodiments, the interactive failure probability graph includes one or more intermediate points between (a) the point on the respective response distribution curve that the draggable marker is located and (b) the new point on the interactive failure probability graph, and the computer instructions, when executed by the one or more processors, perform operations further comprising: while detecting the input moving the draggable marker associated with the respective response distribution curve: detecting that the input moves the draggable marker across the one or more intermediate points located between the point on the respective response distribution curve and the new point on the interactive failure probability graph, and dynamically updating the respective response distribution curve to include the one or more intermediate points as the input is moving the draggable marker to the new point.

In some embodiments, the computer instructions, when executed by the one or more processors, perform operations further comprising: detecting that the draggable marker is located at the new point on the interactive failure probability graph; and in response to detecting that the draggable marker is located at the new point on the interactive failure probability graph: dynamically updating the respective response distribution curve to include the new point on the interactive failure probability graph.

In some embodiments, after dynamically updating the respective response distribution curve to include the new point on the interactive failure probability graph: the respective response distribution curve includes the new point, and the respective response distribution curve does not include the point initially included on the respective response distribution curve before the input was detected.

In some embodiments, the plurality of response distribution curves includes the respective response distribution curve that corresponds to the respective editable failure setting row and a second respective response distribution curve that corresponds to a second respective editable failure setting row of the plurality of editable failure setting rows, the respective response distribution curve is displayed in the interactive failure probability graph with a first color, and the second respective response distribution curve is displayed in the interactive failure probability graph with a second color, different from the first color.

In some embodiments, the respective editable failure setting row further includes: one or more editable factor fields for setting a value of one or more failure acceleration factors.

In some embodiments, the current value of the editable probability of failure field specifies a probability of a failure, the current value of the editable failure time field specifies a time of the failure, and the value of the one or more failure acceleration factors specifies when the one or more failure acceleration factors are associated with the time of the failure and the probability of the failure.

In some embodiments, the computer instructions, when executed by the one or more processors, perform operations further comprising: detecting, via the user interface, an input for changing the current value of the editable probability of failure field and the editable failure time field to a different value, and dynamically updating the respective response distribution curve in response to detecting the input for changing the editable probability of failure field and the editable failure time field to the different value, wherein the dynamically updating the respective response distribution curve includes: moving, in the interactive failure probability graph, the draggable marker associated with the respective response distribution curve to a point on the interactive failure probability graph that corresponds to the different value of the editable probability of failure field and the editable failure time field, and updating the respective response distribution curve to include the point on the interactive failure probability graph that corresponds to the different value of the editable probability of failure field and the editable failure time field.

In some embodiments, a computer-implemented method comprises: displaying, via a user interface, an interactive failure probability table comprising a plurality of editable failure setting rows, wherein a respective editable failure setting row of the plurality of editable failure setting rows at least includes an editable probability of failure field and an editable failure time field; displaying, concurrently with the interactive failure probability table, an interactive failure probability graph that includes a plurality of response distribution curves generated for the plurality of editable failure setting rows, wherein a respective response distribution curve of the plurality of response distribution curves includes a draggable marker positioned at a point on the respective response distribution curve that corresponds to a current value of the editable probability of failure field and the editable failure time field; detecting, via the user interface, an input moving the draggable marker from the point on the respective response distribution curve to a new point on the interactive failure probability graph that corresponds to a new probability of failure value and a new failure time value; and dynamically updating the editable probability of failure field to the new probability of failure value and the editable failure time field to the new failure time value in response to detecting the input moving the draggable marker.

In some embodiments, the computer-implemented method further comprises: while detecting the input moving the draggable marker: detecting that the input moves the draggable marker across one or more intermediate points located between the point on the respective response distribution curve and the new point on the interactive failure probability graph, and dynamically updating the editable probability of failure field and the editable failure time field as the draggable marker moves across the one or more intermediate points.

In some embodiments, dynamically updating the editable probability of failure field and the editable failure time field as the draggable marker moves across the one or more intermediate points occurs in real-time or near real-time.

In some embodiments, the interactive failure probability graph includes one or more intermediate points between (a) the point on the respective response distribution curve that the draggable marker is located and (b) the new point on the interactive failure probability graph, and the computer-implemented method further comprises: while detecting the input moving the draggable marker associated with the respective response distribution curve: detecting that the input moves the draggable marker across the one or more intermediate points located between the point on the respective response distribution curve and the new point on the interactive failure probability graph, and dynamically updating the respective response distribution curve to include the one or more intermediate points as the input is moving the draggable marker to the new point.

In some embodiments, the computer-implemented method further comprises: detecting that the draggable marker is located at the new point on the interactive failure probability graph; and in response to detecting that the draggable marker is located at the new point on the interactive failure probability graph: dynamically updating the respective response distribution curve to include the new point on the interactive failure probability graph.

In some embodiments, after dynamically updating the respective response distribution curve to include the new point on the interactive failure probability graph: the respective response distribution curve includes the new point, and the respective response distribution curve does not include the point initially included on the respective response distribution curve before the input was detected.

In some embodiments, the plurality of response distribution curves includes the respective response distribution curve that corresponds to the respective editable failure setting row and a second respective response distribution curve that corresponds to a second respective editable failure setting row of the plurality of editable failure setting rows, the respective response distribution curve is displayed in the interactive failure probability graph with a first color, and the second respective response distribution curve is displayed in the interactive failure probability graph with a second color, different from the first color.

In some embodiments, the respective editable failure setting row further includes: one or more editable factor fields for setting a value of one or more failure acceleration factors.

In some embodiments, the current value of the editable probability of failure field specifies a probability of a failure, the current value of the editable failure time field specifies a time of the failure, and the value of the one or more failure acceleration factors specifies when the one or more failure acceleration factors are associated with the time of the failure and the probability of the failure.

In some embodiments, the computer-implemented method further comprises: detecting, via the user interface, an input for changing the current value of the editable probability of failure field and the editable failure time field to a different value, and dynamically updating the respective response distribution curve in response to detecting the input for changing the editable probability of failure field and the editable failure time field to the different value, wherein the dynamically updating the respective response distribution curve includes: moving, in the interactive failure probability graph, the draggable marker associated with the respective response distribution curve to a point on the interactive failure probability graph that corresponds to the different value of the editable probability of failure field and the editable failure time field, and updating the respective response distribution curve to include the point on the interactive failure probability graph that corresponds to the different value of the editable probability of failure field and the editable failure time field.

In some embodiments, a computer-implemented system comprises: one or more processors; a memory; a computer-readable medium operably coupled to the one or more processors, the computer-readable medium having computer-readable instructions stored thereon that, when executed by the one or more processors, cause a computing device to perform operations comprising: displaying, via a user interface, an interactive failure probability table comprising a plurality of editable failure setting rows, wherein a respective editable failure setting row of the plurality of editable failure setting rows at least includes an editable probability of failure field and an editable failure time field; displaying, concurrently with the interactive failure probability table, an interactive failure probability graph that includes a plurality of response distribution curves generated for the plurality of editable failure setting rows, wherein a respective response distribution curve of the plurality of response distribution curves includes a draggable marker positioned at a point on the respective response distribution curve that corresponds to a current value of the editable probability of failure field and the editable failure time field; detecting, via the user interface, an input moving the draggable marker from the point on the respective response distribution curve to a new point on the interactive failure probability graph that corresponds to a new probability of failure value and a new failure time value; and dynamically updating the editable probability of failure field to the new probability of failure value and the editable failure time field to the new failure time value in response to detecting the input moving the draggable marker.

In some embodiments, the computer-readable instructions cause the computing device to perform operations further comprising: while detecting the input moving the draggable marker: detecting that the input moves the draggable marker across one or more intermediate points located between the point on the respective response distribution curve and the new point on the interactive failure probability graph, and dynamically updating the editable probability of failure field and the editable failure time field as the draggable marker moves across the one or more intermediate points.

In some embodiments, dynamically updating the editable probability of failure field and the editable failure time field as the draggable marker moves across the one or more intermediate points occurs in real-time or near real-time.

In some embodiments, the interactive failure probability graph includes one or more intermediate points between (a) the point on the respective response distribution curve that the draggable marker is located and (b) the new point on the interactive failure probability graph, and the computer-readable instructions cause the computing device to perform operations further comprising: while detecting the input moving the draggable marker associated with the respective response distribution curve: detecting that the input moves the draggable marker across the one or more intermediate points located between the point on the respective response distribution curve and the new point on the interactive failure probability graph, and dynamically updating the respective response distribution curve to include the one or more intermediate points as the input is moving the draggable marker to the new point.

In some embodiments, the computer-readable instructions cause the computing device to perform operations further comprising: detecting that the draggable marker is located at the new point on the interactive failure probability graph; and in response to detecting that the draggable marker is located at the new point on the interactive failure probability graph: dynamically updating the respective response distribution curve to include the new point on the interactive failure probability graph.

In some embodiments, after dynamically updating the respective response distribution curve to include the new point on the interactive failure probability graph: the respective response distribution curve includes the new point, and the respective response distribution curve does not include the point initially included on the respective response distribution curve before the input was detected.

In some embodiments, the plurality of response distribution curves includes the respective response distribution curve that corresponds to the respective editable failure setting row and a second respective response distribution curve that corresponds to a second respective editable failure setting row of the plurality of editable failure setting rows, the respective response distribution curve is displayed in the interactive failure probability graph with a first color, and the second respective response distribution curve is displayed in the interactive failure probability graph with a second color, different from the first color.

In some embodiments, the respective editable failure setting row further includes: one or more editable factor fields for setting a value of one or more failure acceleration factors.

In some embodiments, the current value of the editable probability of failure field specifies a probability of a failure, the current value of the editable failure time field specifies a time of the failure, and the value of the one or more failure acceleration factors specifies when the one or more failure acceleration factors are associated with the time of the failure and the probability of the failure.

In some embodiments, the computer-readable instructions cause the computing device to perform operations further comprising: detecting, via the user interface, an input for changing the current value of the editable probability of failure field and the editable failure time field to a different value, and dynamically updating the respective response distribution curve in response to detecting the input for changing the editable probability of failure field and the editable failure time field to the different value, wherein the dynamically updating the respective response distribution curve includes: moving, in the interactive failure probability graph, the draggable marker associated with the respective response distribution curve to a point on the interactive failure probability graph that corresponds to the different value of the editable probability of failure field and the editable failure time field, and updating the respective response distribution curve to include the point on the interactive failure probability graph that corresponds to the different value of the editable probability of failure field and the editable failure time field.

In some embodiments, a computer-program product comprises a non-transitory machine-readable storage medium storing computer instructions that, when executed by one or more processors, perform operations comprising: receiving one or more inputs corresponding to a request to compare a plurality of models; displaying a model comparison user interface in response to receiving the request, wherein the model comparison user interface includes: an interactive model comparison graph that plots an efficacy of the plurality of models, an interactive model comparison table that includes a plurality of selectable model comparison rows corresponding to the plurality of models, and a model control toolbar that includes one or more selectable control elements for dynamically controlling which of the plurality of models are under comparison in the interactive model comparison graph and the interactive model comparison table; detecting, at the model control toolbar, a selection of a respective selectable control element of the one or more selectable control elements to transition the interactive model comparison graph and the interactive model comparison table from comparing the plurality of models to comparing a new set of models; and concurrently modifying the interactive model comparison graph and the interactive model comparison table in accordance with the selection detected at the model control toolbar.

In some embodiments, the respective selectable control element executes a model delete operation to transition the interactive model comparison graph and the interactive model comparison table from comparing the plurality of models to comparing the new set of models, and concurrently modifying the interactive model comparison graph and the interactive model comparison table in accordance with the selection of the respective selectable control element includes: deleting, from the interactive model comparison table, one or more selectable model comparison rows currently selected in the interactive model comparison table, and deleting, from the interactive model comparison graph, one or more graph elements associated with the one or more selectable model comparison rows currently selected in the interactive model comparison table.

In some embodiments, the respective selectable control element executes a model undo operation to transition the interactive model comparison graph and the interactive model comparison table from comparing the plurality of models to comparing the new set of models, and concurrently modifying the interactive model comparison graph and the interactive model comparison table in accordance with the selection of the respective selectable control element includes: reversing a previous operation performed in the interactive model comparison table and the interactive model comparison graph.

In some embodiments, the previous operation deleted one or more selectable model comparison rows from the interactive model comparison table and one or more graph elements associated with the one or more selectable model comparison rows in the interactive model comparison graph, and reversing the previous operation performed in the interactive model comparison table and the interactive model comparison graph includes: re-inserting, into the interactive model comparison table, the one or more selectable model comparison rows deleted from the interactive model comparison table in the previous operation, and re-inserting, into the interactive model comparison graph, the one or more graph elements deleted from the interactive model comparison graph in the previous operation.

In some embodiments, the previous operation added one or more new selectable model comparison rows to the interactive model comparison table and one or more new graph elements associated with the one or more new selectable model comparison rows to the interactive model comparison graph, and reversing the previous operation performed in the interactive model comparison table and the interactive model comparison graph includes: deleting the one or more new selectable model comparison rows added to the interactive model comparison table in the previous operation, and deleting the one or more new graph elements added to the interactive model comparison table in the previous operation.

In some embodiments, the respective selectable control element executes a model redo operation to transition the interactive model comparison graph and the interactive model comparison table from comparing the plurality of models to comparing the new set of models, and concurrently modifying the interactive model comparison graph and the interactive model comparison table in accordance with the selection of the respective selectable control element includes: re-performing an operation that was previously undone in the interactive model comparison table and the interactive model comparison graph.

In some embodiments, the computer instructions, when executed by the one or more processors, perform operations further comprising: fitting the plurality of models using a fatigue model platform.

In some embodiments, the plurality of models corresponds to a plurality of fatigue life models, and the fatigue model platform fits the plurality of fatigue life models using a plurality of distributions.

In some embodiments, the computer instructions, when executed by the one or more processors, perform operations further comprising: detecting, at the interactive model comparison table, an input selecting a respective selectable model comparison row of the plurality of selectable model comparison rows, and in response to detecting the input selecting the respective selectable model comparison row: visually highlighting the respective selectable model comparison row selected in the interactive model comparison table, and visually highlighting a graph element associated with the respective selectable model comparison row selected in the interactive model comparison graph.

In some embodiments, the interactive model comparison graph includes a graph plot and a legend for the graph plot, the graph element associated with the respective selectable model comparison row is displayed in the graph plot, and in response to detecting the input selecting the respective selectable model comparison row further includes: visually highlighting a legend entry corresponding to the graph element associated with the respective selectable model comparison row that is selected in the interactive model comparison graph.

In some embodiments, a respective selectable model comparison row corresponds to a respective model of the plurality of models and includes: one or more values that specifies a type of the respective model, and one or more values that indicate an efficacy of the respective model.

In some embodiments, a computer-implemented method comprises: receiving one or more inputs corresponding to a request to compare a plurality of models; displaying a model comparison user interface in response to receiving the request, wherein the model comparison user interface includes: an interactive model comparison graph that plots an efficacy of the plurality of models, an interactive model comparison table that includes a plurality of selectable model comparison rows corresponding to the plurality of models, and a model control toolbar that includes one or more selectable control elements for dynamically controlling which of the plurality of models are under comparison in the interactive model comparison graph and the interactive model comparison table; detecting, at the model control toolbar, a selection of a respective selectable control element of the one or more selectable control elements to transition the interactive model comparison graph and the interactive model comparison table from comparing the plurality of models to comparing a new set of models; and concurrently modifying the interactive model comparison graph and the interactive model comparison table in accordance with the selection detected at the model control toolbar.

In some embodiments, the respective selectable control element executes a model delete operation to transition the interactive model comparison graph and the interactive model comparison table from comparing the plurality of models to comparing the new set of models, and concurrently modifying the interactive model comparison graph and the interactive model comparison table in accordance with the selection of the respective selectable control element includes: deleting, from the interactive model comparison table, one or more selectable model comparison rows currently selected in the interactive model comparison table, and deleting, from the interactive model comparison graph, one or more graph elements associated with the one or more selectable model comparison rows currently selected in the interactive model comparison table.

In some embodiments, the respective selectable control element executes a model undo operation to transition the interactive model comparison graph and the interactive model comparison table from comparing the plurality of models to comparing the new set of models, and concurrently modifying the interactive model comparison graph and the interactive model comparison table in accordance with the selection of the respective selectable control element includes: reversing a previous operation performed in the interactive model comparison table and the interactive model comparison graph.

In some embodiments, the previous operation deleted one or more selectable model comparison rows from the interactive model comparison table and one or more graph elements associated with the one or more selectable model comparison rows in the interactive model comparison graph, and reversing the previous operation performed in the interactive model comparison table and the interactive model comparison graph includes: re-inserting, into the interactive model comparison table, the one or more selectable model comparison rows deleted from the interactive model comparison table in the previous operation, and re-inserting, into the interactive model comparison graph, the one or more graph elements deleted from the interactive model comparison graph in the previous operation.

In some embodiments, the previous operation added one or more new selectable model comparison rows to the interactive model comparison table and one or more new graph elements associated with the one or more new selectable model comparison rows to the interactive model comparison graph, and reversing the previous operation performed in the interactive model comparison table and the interactive model comparison graph includes: deleting the one or more new selectable model comparison rows added to the interactive model comparison table in the previous operation, and deleting the one or more new graph elements added to the interactive model comparison table in the previous operation.

In some embodiments, the respective selectable control element executes a model redo operation to transition the interactive model comparison graph and the interactive model comparison table from comparing the plurality of models to comparing the new set of models, and concurrently modifying the interactive model comparison graph and the interactive model comparison table in accordance with the selection of the respective selectable control element includes: re-performing an operation that was previously undone in the interactive model comparison table and the interactive model comparison graph.

In some embodiments, the computer-implemented method further comprises: fitting the plurality of models using a fatigue model platform.

In some embodiments, the plurality of models corresponds to a plurality of fatigue life models, and the fatigue model platform fits the plurality of fatigue life models using a plurality of distributions.

In some embodiments, the computer-implemented method further comprises: detecting, at the interactive model comparison table, an input selecting a respective selectable model comparison row of the plurality of selectable model comparison rows, and in response to detecting the input selecting the respective selectable model comparison row: visually highlighting the respective selectable model comparison row selected in the interactive model comparison table, and visually highlighting a graph element associated with the respective selectable model comparison row selected in the interactive model comparison graph.

In some embodiments, the interactive model comparison graph includes a graph plot and a legend for the graph plot, the graph element associated with the respective selectable model comparison row is displayed in the graph plot, and in response to detecting the input selecting the respective selectable model comparison row further includes: visually highlighting a legend entry corresponding to the graph element associated with the respective selectable model comparison row that is selected in the interactive model comparison graph.

In some embodiments, a computer-implemented system comprises: one or more processors; a memory; a computer-readable medium operably coupled to the one or more processors, the computer-readable medium having computer-readable instructions stored thereon that, when executed by the one or more processors, cause a computing device to perform operations comprising: receiving one or more inputs corresponding to a request to compare a plurality of models; displaying a model comparison user interface in response to receiving the request, wherein the model comparison user interface includes: an interactive model comparison graph that plots an efficacy of the plurality of models, an interactive model comparison table that includes a plurality of selectable model comparison rows corresponding to the plurality of models, and a model control toolbar that includes one or more selectable control elements for dynamically controlling which of the plurality of models are under comparison in the interactive model comparison graph and the interactive model comparison table; detecting, at the model control toolbar, a selection of a respective selectable control element of the one or more selectable control elements to transition the interactive model comparison graph and the interactive model comparison table from comparing the plurality of models to comparing a new set of models; and concurrently modifying the interactive model comparison graph and the interactive model comparison table in accordance with the selection detected at the model control toolbar.

In some embodiments, the respective selectable control element executes a model delete operation to transition the interactive model comparison graph and the interactive model comparison table from comparing the plurality of models to comparing the new set of models, and concurrently modifying the interactive model comparison graph and the interactive model comparison table in accordance with the selection of the respective selectable control element includes: deleting, from the interactive model comparison table, one or more selectable model comparison rows currently selected in the interactive model comparison table, and deleting, from the interactive model comparison graph, one or more graph elements associated with the one or more selectable model comparison rows currently selected in the interactive model comparison table.

In some embodiments, the respective selectable control element executes a model undo operation to transition the interactive model comparison graph and the interactive model comparison table from comparing the plurality of models to comparing the new set of models, and concurrently modifying the interactive model comparison graph and the interactive model comparison table in accordance with the selection of the respective selectable control element includes: reversing a previous operation performed in the interactive model comparison table and the interactive model comparison graph.

In some embodiments, the previous operation deleted one or more selectable model comparison rows from the interactive model comparison table and one or more graph elements associated with the one or more selectable model comparison rows in the interactive model comparison graph, and reversing the previous operation performed in the interactive model comparison table and the interactive model comparison graph includes: re-inserting, into the interactive model comparison table, the one or more selectable model comparison rows deleted from the interactive model comparison table in the previous operation, and re-inserting, into the interactive model comparison graph, the one or more graph elements deleted from the interactive model comparison graph in the previous operation.

In some embodiments, the previous operation added one or more new selectable model comparison rows to the interactive model comparison table and one or more new graph elements associated with the one or more new selectable model comparison rows to the interactive model comparison graph, and reversing the previous operation performed in the interactive model comparison table and the interactive model comparison graph includes: deleting the one or more new selectable model comparison rows added to the interactive model comparison table in the previous operation, and deleting the one or more new graph elements added to the interactive model comparison table in the previous operation.

In some embodiments, the respective selectable control element executes a model redo operation to transition the interactive model comparison graph and the interactive model comparison table from comparing the plurality of models to comparing the new set of models, and concurrently modifying the interactive model comparison graph and the interactive model comparison table in accordance with the selection of the respective selectable control element includes: re-performing an operation that was previously undone in the interactive model comparison table and the interactive model comparison graph.

In some embodiments, the computer-readable instructions cause the computing device to perform operations further comprising: fitting the plurality of models using a fatigue model platform.

In some embodiments, the plurality of models corresponds to a plurality of fatigue life models, and the fatigue model platform fits the plurality of fatigue life models using a plurality of distributions.

In some embodiments, the computer-readable instructions cause the computing device to perform operations further comprising: detecting, at the interactive model comparison table, an input selecting a respective selectable model comparison row of the plurality of selectable model comparison rows, and in response to detecting the input selecting the respective selectable model comparison row: visually highlighting the respective selectable model comparison row selected in the interactive model comparison table, and visually highlighting a graph element associated with the respective selectable model comparison row selected in the interactive model comparison graph.

BRIEF DESCRIPTION OF THE FIGURES

FIGS. 8A-8L illustrate exemplary ways for creating and displaying one or more experimental designs, according to at least one embodiment of the present technology.

FIG. 9 illustrates an example flow chart of a method for modifying model parameters via an interactive failure probability table and/or an interactive failure probability graph, according to at least one embodiment of the present technology.

FIGS. 10A-10F illustrate exemplary ways for modifying model parameters via an interactive failure probability table and/or an interactive failure probability graph, according to at least one embodiment of the present technology.

FIG. 11 illustrates an example flow chart of a method for comparing a plurality of models, according to at least one embodiment of the present technology.

DESCRIPTION OF THE PREFERRED EMBODIMENTS

The following description of the preferred embodiments of the inventions are not intended to limit the inventions to these preferred embodiments, but rather to enable any person skilled in the art to make and use these inventions.

DETAILED DESCRIPTION

In the following description, for the purposes of explanation, specific details are set forth in order to provide a thorough understanding of embodiments of the technology. However, it will be apparent that various embodiments may be practiced without these specific details. The figures and description are not intended to be restrictive.

The ensuing description provides example embodiments only, and is not intended to limit the scope, applicability, or configuration of the disclosure. Rather, the ensuing description of the example embodiments will provide those skilled in the art with an enabling description for implementing an example embodiment. It should be understood that various changes may be made in the function and arrangement of elements without departing from the spirit and scope of the technology as set forth in the appended claims.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional operations not included in a figure. A process may correspond to a method, a function, a procedure, a subroutine, a subprogram, etc. When a process corresponds to a function, its termination can correspond to a return of the function to the calling function or the main function.

EXAMPLE SYSTEMS

Systems depicted in some of the figures may be provided in various configurations. In some embodiments, the systems may be configured as a distributed system where one or more components of the system are distributed across one or more networks in a cloud computing system.

Figure 1:
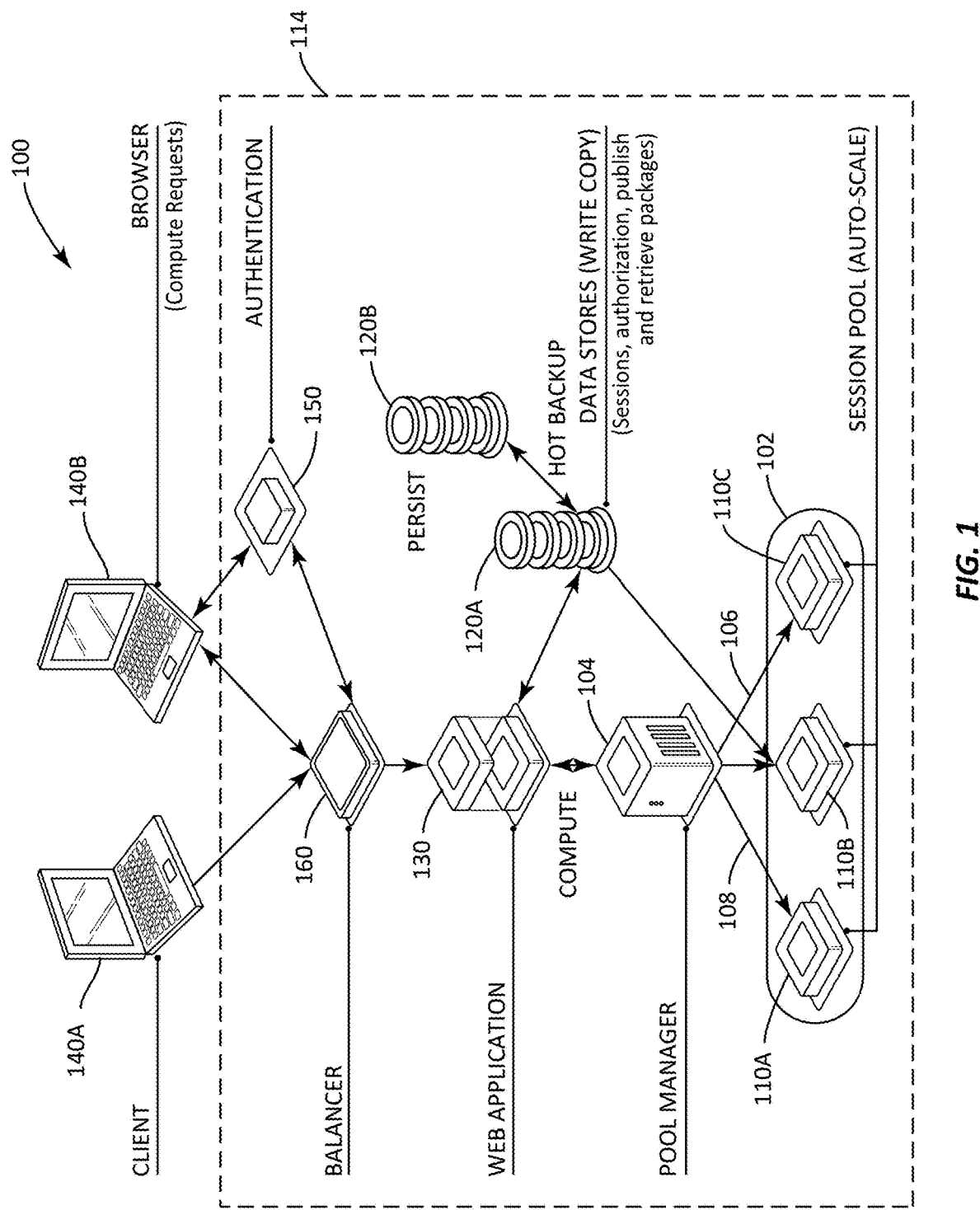
FIG. 1 illustrates an example network, including an example set of devices communicating with each other, according to at least one embodiment of the present technology.

FIG. 1 illustrates an example network 100 including an example set of devices communicating with each other (e.g., over one or more of an exchange system or a network), according to embodiments of the present technology. Network 100 includes network devices configured to communicate with a variety of types of client devices, for example, client devices 140, over a variety of types of communication channels. A client device 140 may be configured to communicate over a public or private network (e.g., client device 140B is configured to support a browser for computing requests or providing authentication).

Network devices and client devices can transmit a communication over a network 100. Network 100 may include one or more of different types of networks, including a wireless network, a wired network, or a combination of a wired and wireless network. Examples of suitable networks include the Internet, a personal area network, a local area network (LAN), a wide area network (WAN), a wireless local area network (WLAN), cloud network, or a cellular network. A wireless network may include a wireless interface or combination of wireless interfaces. As an example, a network in the one or more networks may include a short-range communication channel, such as a Bluetooth or a Bluetooth Low Energy channel. A wired network may include a wired interface. The wired and/or wireless networks may be implemented using routers, access points, base stations, bridges, gateways, or the like, to connect devices in the network. The one or more networks can be incorporated entirely within or can include an intranet, an extranet, or a combination thereof. In one embodiment, communications between two or more systems and/or devices can be achieved by a secure communications protocol, such as secure sockets layer (SSL) or transport layer security (TLS), or other available protocols such as according to an Open Systems Interaction model. In addition, data and/or transactional details may be encrypted. Networks may include other devices for infrastructure for the network. For example, a cloud network may include cloud infrastructure system on demand. As another example, one or more client devices may utilize an Internet of Things (IoT) infrastructure where things (e.g., machines, devices, phones, sensors) can be connected to networks and the data from these things can be collected and processed within the things and/or external to the things. IoT may be implemented with various infrastructure such as for accessibility (technologies that get data and move it), embed-ability (devices with embedded sensors), and IoT services. Industries in the IoT space may include automotive (connected car), manufacturing (connected factory), smart cities, energy and retail.

Network devices and client devices can be different types of devices or components of devices. For example, client device 140 is shown as a laptop and balancer 160 is shown as a processor. Client devices and network devices could be other types of devices or components of other types of devices such as a mobile phone, laptop computer, tablet computer, temperature sensor, motion sensor, and audio sensor. Additionally, or alternatively, the network devices may be or include sensors that are sensitive to detecting aspects of their environment. For example, the network devices may include sensors such as water sensors, power sensors, electrical current sensors, chemical sensors, optical sensors, pressure sensors, geographic or position sensors (e.g., GPS), velocity sensors, acceleration sensors, and flow rate sensors. Examples of characteristics that may be sensed include force, torque, load, strain, position, temperature, air pressure, fluid flow, chemical properties, resistance, electromagnetic fields, radiation, irradiance, proximity, acoustics, moisture, distance, speed, vibrations, acceleration, electrical potential, and electrical current. The sensors may be mounted to various components used as part of a variety of different types of systems (e.g., an oil drilling operation). The network devices may detect and record data related to the environment that it monitors, and transmit that data to network 100.

As noted, one type of system that may include various sensors that collect data to be processed and/or transmitted to a computing environment (not shown) according to certain embodiments includes an oil drilling system. For example, the one or more drilling operation sensors may include, for example, surface sensors that measure a standpipe pressure, a surface torque, and a rotation speed of a drill pipe, and downhole sensors that measure a rotation speed of a bit and fluid densities. Besides the raw data collected directly by the sensors, other data may include parameters either developed by the sensors or assigned to the system by a client or other controlling device. For example, one or more drilling operation control parameters may control settings such as a mud motor speed to flow ratio, a bit diameter, a predicted formation top, seismic data, weather data, etc. Other data may be generated using physical models such as an earth model, a weather model, a seismic model, a bottom hole assembly model, a well plan model, an annular friction model, etc. In addition to sensor and control settings, predicted outputs, for example, the rate of penetration and pump pressure may also be stored and used for modeling, prediction, or classification.

In another example, another type of system that may include various sensors that collect data to be processed and/or transmitted to a computing environment according to certain embodiments includes a home automation or similar automated network in a different environment, such as an office space, school, public space, sports venue, or a variety of other locations. Network devices in such an automated network may include network devices that allow a user to access, control, and/or configure various home appliances located within the user's home (e.g., a television, radio, light, fan, humidifier, sensor, microwave, iron, and/or the like), or outside of the user's home (e.g., exterior motion sensors, exterior lighting, garage door openers, sprinkler systems, or the like). For example, network device or client device may include a home automation switch that may be coupled with a home appliance. In another embodiment, a network or client device can allow a user to access, control, and/or configure devices, such as office-related devices (e.g., copy machine, printer, or fax machine), audio and/or video related devices (e.g., a receiver, a speaker, a projector, a DVD player, or a television), media-playback devices (e.g., a compact disc player, a CD player, or the like), computing devices (e.g., a home computer, a laptop computer, a tablet, a personal digital assistant (PDA), a computing device, or a wearable device), lighting devices (e.g., a lamp or recessed lighting), devices associated with a security system, devices associated with an alarm system, devices that can be operated in an automobile (e.g., radio devices, navigation devices), and/or the like. Data may be collected from such various sensors in raw form, or data may be processed by the sensors to create parameters or other data either developed by the sensors based on the raw data or assigned to the system by a client or other controlling device.

In another example, another type of system that may include various sensors that collect data to be processed and/or transmitted to a computing environment (e.g., computing environment or another computing environment not shown) according to certain embodiments includes a manufacturing environment (e.g., manufacturing products or energy). A variety of different network devices may be included in an energy pool, such as various devices within one or more power plants, energy farms (e.g., wind farm, and solar farm) energy storage facilities, factories, homes and businesses of consumers. One or more of such devices may include one or more sensors that detect energy gain or loss, electrical input or output or loss, and a variety of other efficiencies. These sensors may collect data to inform users of how the energy pool, and individual devices within the pool, may be functioning and how they may be made more efficient. In a manufacturing environment, image data can be taken of the manufacturing process or other readings of manufacturing equipment. For example, in a semiconductor manufacturing environment, images can be used to track, for example, process points (e.g., movement from a bonding site to a packaging site), and process parameters (e.g., bonding force, electrical properties across a bond of an integrated circuit).

Network device sensors may also perform processing on data it collects before transmitting the data to a computing environment, or before deciding whether to transmit data to a computing environment. For example, network devices may determine whether data collected meets certain rules, for example by comparing data or values calculated from the data and comparing that data to one or more thresholds. The network device may use this data and/or comparisons to determine if the data should be transmitted to a computing environment for further use or processing.

Devices in computing environment 114 may include specialized computers, servers, or other machines that are configured to individually and/or collectively process large amounts of data (e.g., using a session pool 102). The computing environment 114 may also include storage devices (e.g., data stores 120) that include one or more databases of structured data, such as data organized in one or more hierarchies, or unstructured data. The databases may communicate with the processing devices within computing environment 114 to distribute data to them and store data used in the computing environment 114. Computing environment 114 may collect, analyze and/or store data from or pertaining to communications, client device operations, client rules, and/or user-associated actions stored at one or more devices in computing environment 114. Such data may influence communication routing to the devices within computing environment 114, and how data is stored or processed within computing environment 114, among other actions.

Network 100 may also include one or more network-attached data stores 120. Network-attached data stores 120 are used to store data to be processed by the computing environment 114 as well as any intermediate or final data generated by the computing system in non-volatile memory. For instance, data stores 120 can perform functions such as writing and copying data and can provide data storage for network functions such as sessions, authorization, publishing and retrieving packages. In certain embodiments, the configuration of the computing environment 114 allows its operations to be performed such that intermediate and final data results can be stored solely in volatile memory (e.g., RAM), without a requirement that intermediate or final data results be stored to non-volatile types of memory (e.g., disk). This can be useful in certain situations, such as when the computing environment 114 receives ad hoc queries from a user and when responses, which are generated by processing large amounts of data, need to be generated on-the-fly. In this non-limiting situation, the computing environment 114 may be configured to retain the processed information within memory so that responses can be generated for the user at different levels of detail as well as allow a user to interactively query against this information.

Network-attached data stores 120 may store a variety of different types of data organized in a variety of different ways and from a variety of different sources. For example, network-attached data stores 120 may include storage other than primary storage located within computing environment 114 that is directly accessible by processors located therein. Network-attached data stores 120 may include secondary, tertiary, auxiliary, or back-up storage (e.g., data storage 120B), such as large hard drives, servers, and virtual memory, among other types. Storage devices may include portable or non-portable storage devices, optical storage devices, and various other mediums capable of storing and containing data (e.g., computer a machine-readable storage medium or computer-readable storage medium such as computer readable medium 210 in FIG. 2).

Furthermore, the data stores may hold a variety of different types of data. For example, network-attached data stores 120 may hold unstructured (e.g., raw) data, such as manufacturing data (e.g., a database containing records identifying products being manufactured with parameter data for each product, such as performance metrics or criteria) or product sales databases (e.g., a database containing individual data records identifying details of individual product performance).

The unstructured data may be presented to the computing environment 114 in different forms such as a flat file or a conglomerate of data records and may have data values and accompanying time stamps. The computing environment 114 may be used to analyze the unstructured data in a variety of ways to determine the best way to structure (e.g., hierarchically) that data, such that the structured data is tailored to a type of further analysis on the data. For example, after being processed, the unstructured time stamped data may be aggregated by time (e.g., into daily time period units) to generate time series data and/or structured hierarchically according to one or more dimensions (e.g., parameters, attributes, and/or variables). For example, data may be stored in a hierarchical data structure, such as a ROLAP OR MOLAP database, or may be stored in another tabular form, such as in a flat-hierarchy form.

Other devices can further be used to influence communication routing and/or processing between devices within computing environment 114 and with devices outside of computing environment 114. For example, as shown in FIG. 1, computing environment 114 may include a device 130 supporting a web application. Thus, computing environment 114 can retrieve data of interest, such as client information (e.g., product information, client rules, etc.), technical product details, news, current or predicted weather, and so on. Balancer 160 can be used to balance and direct load within the computing environment 114. Authentication device 150 can be used to provide authentication or other security protocols for a client device, user or group accessing computing environment 114.

In addition to computing environment 114 collecting data (e.g., as received from network devices, such as sensors, and client devices or other sources) to be processed as part of a big data analytics project, it may also receive data in real time as part of a streaming analytics environment. As noted, data may be collected using a variety of sources as communicated via different kinds of networks or locally. Such data may be received on a real-time streaming basis. For example, network devices may receive data periodically from sensors as the sensors continuously sense, monitor and track changes in their environments. Devices within computing environment 114 may also perform pre-analysis on data it receives to determine if the data received should be processed as part of an ongoing project. The data received and collected by computing environment 114, no matter what the source or method or timing of receipt, may be processed over a period of time for a client to determine results data based on the client's needs and rules.

FIG. 1 includes a pool of devices with a pool manager 104 and session pool 102. Network 100 includes a variety of pool managers (e.g., pool manager 104) and worker nodes 110 (e.g., devices, servers, or server farms of session pool 102), according to embodiments of the present technology. Devices of session pool 102 are communicatively connected (e.g., via communication path 108 and communication path 106). Therefore, the pool manager may transmit information (e.g., related to the session pool 102 or notifications), to and receive information from each other. Although only one pool manager 104 is shown in FIG. 1, the network 100 may include more pool managers or a different kind of device manager (e.g., a dedicated resource manager).

Session pool 102 includes one or more worker nodes (e.g., worker node 110A). Shown in FIG. 1 are three worker nodes 110A-C merely for illustration, more or less worker nodes could be present. For instance, the pool manager 104 may itself be a worker node and may not need further worker nodes to complete a task. A given worker node could include dedicated computing resources or allocated computing resources as needed to perform operations as directed by the pool manager 104. The number of worker nodes included in a session pool 102 may be dependent, for example, upon how large the project or data set is being processed by the session pool 102, the capacity of each worker node, and the time designated for the session pool 102 to complete the project. Each worker node within the session pool 102 may be connected (wired or wirelessly, and directly or indirectly) to pool manager 104. Therefore, each worker node may receive information from the pool manager 104 (e.g., an instruction to perform work on a project) and may transmit information to the pool manager 104 (e.g., a result from work performed on a project). Furthermore, worker nodes 110 may communicate with each other (either directly or indirectly). For example, worker nodes 110 may transmit data between each other related to a job being performed or an individual task within a job being performed by that worker node. However, in certain embodiments, worker nodes 110 may not, for example, be connected (communicatively or otherwise) to certain other worker nodes. In an embodiment, worker nodes may only be able to communicate with the pool manager 104 that controls it, and may not be able to communicate with other worker nodes in the session pool 102.

The pool manager 104 may connect with other devices of network 100 or an external device (e.g., a pool user, such as a server or computer). For example, a server or computer may connect to pool manager 104 and may transmit a project or job to the node. The project may include a data set. The data set may be of any size. Once the pool manager 104 receives such a project including a large data set, the pool manager 104 may distribute the data set or projects related to the data set to be performed by worker nodes 110. Alternatively, for a project including a large data set, the data set may be received or stored by a machine other than a pool manager 104 or worker node 110 (e.g., a Hadoop data node).

Pool manager may maintain knowledge of the status of the worker nodes 110 in the session pool 102 (i.e., status information), accept work requests from clients, subdivide the work across worker nodes 110, and coordinate the worker nodes 110, among other responsibilities. Worker nodes 110 may accept work requests from a pool manager 104 and provide the pool manager 104 with results of the work performed by the worker nodes 110. A session pool 102 may be started from a single node (e.g., a machine, computer, server, etc.). This first node may be assigned or may start as the primary pool manager 104 that will control any additional nodes that enter the session pool 102.

When a project is submitted for execution (e.g., by a client or a pool manager 104), it may be assigned to a set of nodes. After the nodes are assigned to a project, a data structure (i.e., a communicator) may be created. The communicator may be used by the project for information to be shared between the project code running on each node. A communication handle may be created on each node. A handle, for example, is a reference to the communicator that is valid within a single process on a single node, and the handle may be used when requesting communications between nodes.

A pool manager may be designated as the primary pool manager among multiple pool managers. A server, computer or other external device may connect to the primary pool manager. Once the pool manager receives a project, the primary pool manager may distribute portions of the project to its worker nodes for execution. For example, when a project is initiated on session pool 102, primary pool manager 104 controls the work to be performed for the project to complete the project as requested or instructed. The primary pool manager may distribute work to the worker nodes 110 based on various factors, such as which subsets or portions of projects may be completed most efficiently and in the correct amount of time. For example, a worker node may perform analysis on a portion of data that is already local (e.g., stored on) the worker node. The primary pool manager also coordinates and processes the results of the work performed by each worker node after each worker node executes and completes its job. For example, the primary pool manager may receive a result from one or more worker nodes, and the pool manager may organize (e.g., collect and assemble) the results received and compile them to produce a complete result for the project received from the end user.

Any remaining pool manager (not shown) may be assigned as backup pool manager for the project. In an embodiment, backup pool manager may not control any portion of the project. Instead, backup pool manager may serve as a backup for the primary pool manager and take over as primary pool manager if the primary pool manager were to fail.

To add another node or machine to the session pool 102, the primary pool manager may open a pair of listening sockets, for example. A socket may be used to accept work requests from clients, and the second socket may be used to accept connections from other pool nodes. The primary pool manager may be provided with a list of other nodes (e.g., other machines, computers, servers) that will participate in the pool, and the role that each node will fill in the pool. Upon startup of the primary pool manager (e.g., the first node on the pool), the primary pool manager may use a network protocol to start the server process on every other node in the session pool 102. Command line parameters, for example, may inform each node of one or more pieces of information, such as: the role that the node will have in the pool, the host name of the primary pool manager, and the port number on which the primary pool manager is accepting connections from peer nodes. The information may also be provided in a configuration file, transmitted over a secure shell tunnel, and recovered from a configuration server. While the other machines in the pool may not initially know about the configuration of the pool, that information may also be sent to each other node by the primary pool manager. Updates of the pool information may also be subsequently sent to those nodes.

For any pool manager other than the primary pool manager added to the pool, the pool manager may open multiple sockets. For example, the first socket may accept work requests from clients, the second socket may accept connections from other pool members, and the third socket may connect (e.g., permanently) to the primary pool manager. When a pool manager (e.g., primary pool manager) receives a connection from another pool manager, it first checks to see if the peer node is in the list of configured nodes in the pool. If it is not on the list, the pool manager may clear the connection. If it is on the list, it may then attempt to authenticate the connection. If authentication is successful, the authenticating node may transmit information to its peer, such as the port number on which a node is listening for connections, the host name of the node, and information about how to authenticate the node, among other information. When a node, such as the new pool manager, receives information about another active node, it will check to see if it already has a connection to that other node. If it does not have a connection to that node, it may then establish a connection to that pool manager.

Any worker node added to the pool may establish a connection to the primary pool manager and any other pool manager on the pool. After establishing the connection, it may authenticate itself to the pool (e.g., any pool manager, including both primary and backup, or a server or user controlling the pool). After successful authentication, the worker node may accept configuration information from the pool manager.

When a node joins a session pool 102 (e.g., when the node is powered on or connected to an existing node on the pool or both), the node is assigned (e.g., by an operating system of the pool) an identifier (e.g., a universally unique identifier (UUID)). This identifier may help other nodes and external entities (devices, users, etc.) to identify the node and distinguish it from other nodes. When a node is connected to the pool, the node may share its identifier with the other nodes in the pool. Since each node may share its identifier, each node may know the identifier of every other node on the pool. Identifiers may also designate a hierarchy of each of the nodes (e.g., backup pool manager) within the pool. For example, the identifiers of each of the backup pool manager may be stored in a list of backup pool manager to indicate an order in which the backup pool manager will take over for a failed primary pool manager to become a new primary pool manager. However, a hierarchy of nodes may also be determined using methods other than using the unique identifiers of the nodes. For example, the hierarchy may be predetermined, or may be assigned based on other predetermined factors.

The pool may add new machines at any time (e.g., initiated from any pool manager). Upon adding a new node to the pool, the pool manager may first add the new node to its table of pool nodes. The pool manager may also then notify every other pool manager about the new node. The nodes receiving the notification may acknowledge that they have updated their configuration information.

Primary pool manager 104 may, for example, transmit one or more communications to backup pool manager or other control or worker nodes within the session pool 102). Such communications may be sent using protocols such as periodically, at fixed time intervals, or between known fixed stages of the project's execution. The communications transmitted by primary pool manager 104 may be of varied types and may include a variety of types of information. For example, primary pool manager 104 may transmit snapshots (e.g., status information) of the session pool 102 so that backup pool manager 104 always has a recent snapshot of the session pool 102. The snapshot or pool status may include, for example, the structure of the pool (including, for example, the worker nodes in the pool, unique identifiers of the nodes, or their relationships with the primary pool manager) and the status of a project (including, for example, the status of each worker node's portion of the project). The snapshot may also include analysis or results received from worker nodes in the session pool 102. The backup pool manager may receive and store the backup data received from the primary pool manager. The backup pool manager may transmit a request for such a snapshot (or other information) from the primary pool manager, or the primary pool manager may send such information periodically to the backup pool manager.

As noted, the backup data may allow the backup pool manager to take over as primary pool manager if the primary pool manager fails without requiring the pool to start the project over from scratch. If the primary pool manager fails, the backup pool manager that will take over as primary pool manager may retrieve the most recent version of the snapshot received from the primary pool manager and use the snapshot to continue the project from the stage of the project indicated by the backup data. This may prevent failure of the project as a whole.

A backup pool manager may use various methods to determine that the primary pool manager has failed. In one example of such a method, the primary pool manager may transmit (e.g., periodically) a communication to the backup pool manager that indicates that the primary pool manager is working and has not failed, such as a heartbeat communication. The backup pool manager may determine that the primary pool manager has failed if the backup pool manager has not received a heartbeat communication for a certain predetermined period of time. Alternatively, a backup pool manager may also receive a communication from the primary pool manager itself (before it failed) or from a worker node that the primary pool manager has failed, for example because the primary pool manager has failed to communicate with the worker node.

Different methods may be performed to determine which backup pool manager of a set of backup pool manager will take over for failed primary pool manager 104 and become the new primary pool manager. For example, the new primary pool manager may be chosen based on a ranking or "hierarchy" of backup pool manager based on their unique identifiers. In an alternative embodiment, a backup pool manager may be assigned to be the new primary pool manager by another device in the session pool 102 or from an external device (e.g., a system infrastructure or an end user, such as a server or computer, controlling the session pool 102). In another alternative embodiment, the backup pool manager that takes over as the new primary pool manager may be designated based on bandwidth or other statistics about the session pool 102.

A worker node within the session pool 102 may also fail. If a worker node fails, work being performed by the failed worker node may be redistributed amongst the operational worker nodes. In an alternative embodiment, the primary pool manager may transmit a communication to each of the operable worker nodes still on the session pool 102 that each of the worker nodes should purposefully fail also. After each of the worker nodes fail, they may each retrieve their most recent saved checkpoint of their status and re-start the project from that checkpoint to minimize lost progress on the project being executed.

Figure 2:
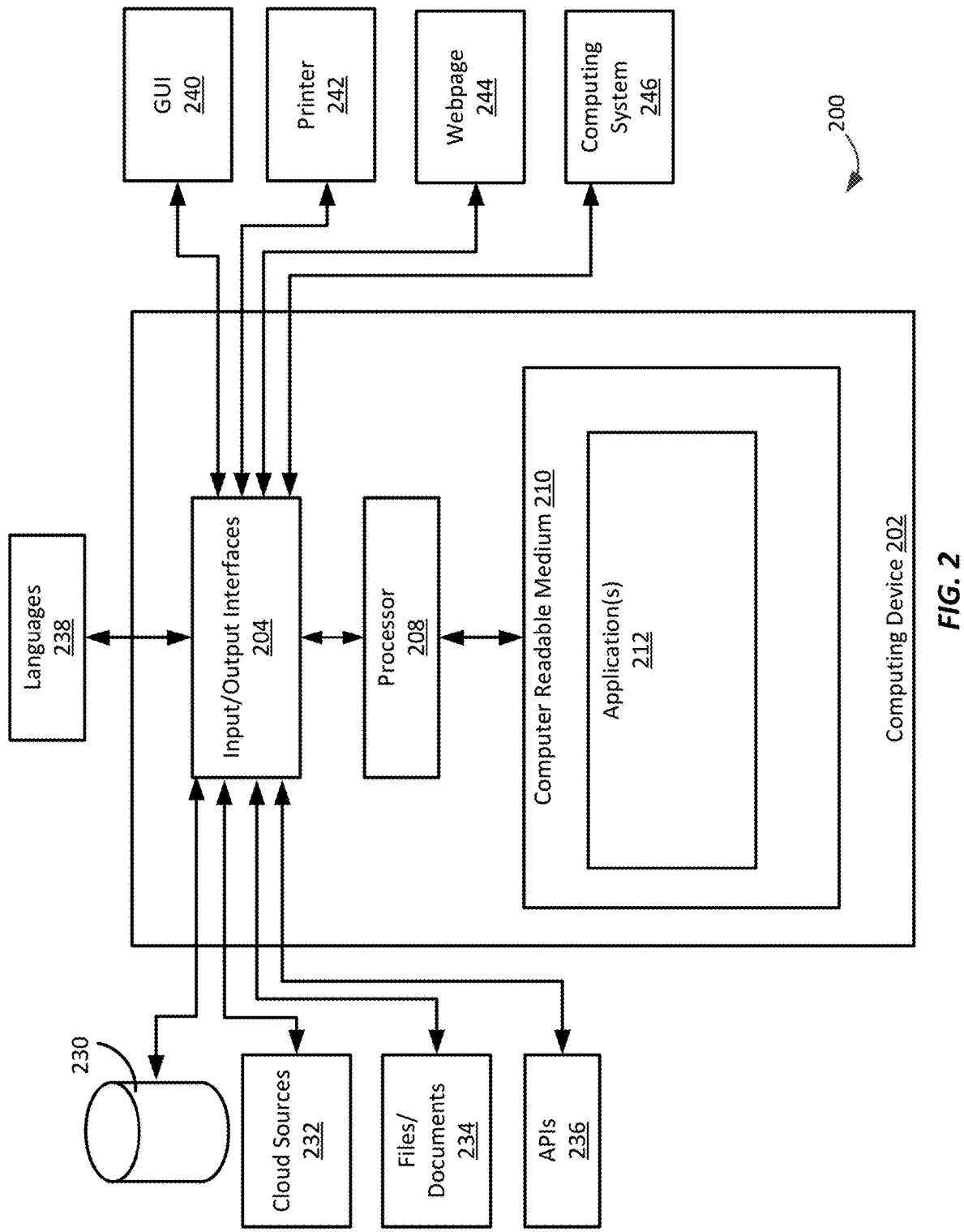
FIG. 2 illustrates a block diagram that provides an illustration of the hardware components of a computing system, according to at least one embodiment of the present technology.

While each device in FIG. 1 is shown as a single device, it will be appreciated that multiple devices may instead be used. FIG. 2 shows an example computing structure for a device in FIG. 2. FIG. 2 includes a computing device 202. The computing device 202 has a computer-readable medium 210 and a processor 208. Computer-readable medium 210 is an electronic holding place or storage for information so the information can be accessed by processor 208. The computer readable medium 210 is a non-transitory medium in which data can be stored and that does not include carrier waves and/or transitory electronic signals. Examples of a non-transitory medium may include, for example, a magnetic disk or tape, optical storage media such as compact disk or digital versatile disk, flash memory, memory or memory devices. A computer-program product may include code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including, for example, memory sharing, message passing, token passing, and network transmission. Computer-readable medium 210 can include, but is not limited to, any type of random-access memory (RAM), any type of read only memory (ROM), any type of flash memory, etc. such as magnetic storage devices (e.g., hard disk, floppy disk, magnetic strips), optical disks (e.g., compact disc (CD), digital versatile disc (DVD)), smart cards, flash memory devices, etc.

Processor 208 executes instructions (e.g., stored at the computer-readable medium 210). The instructions can be carried out by a special purpose computer, logic circuits, or hardware circuits. In one or more embodiments, processor 208 is implemented in hardware and/or firmware. Processor 208 executes an instruction, meaning it performs or controls the operations called for by that instruction. The term "execution" is the process of running an application or the carrying out of the operation called for by an instruction. The instructions can be written using one or more programming language, scripting language, assembly language, etc. Processor 208 in one or more embodiments can retrieve a set of instructions from a permanent memory device and copy the instructions in an executable form to a temporary memory device that is generally some form of RAM, for example. Processor 208 operably couples with components of computing device 202 (e.g., input/output interface 204 and with computer readable medium 210) to receive, to send, and to process information.

For instance, in one or more embodiments, computing device 202 sends and/or receives information from one or more of databases 230, cloud sources 232, application programming interfaces 236 (API's), graphical user interfaces 240 (GUIs), printers 242, webpages 244, and computing systems 246. The input/output interface 204 may be configured to receive languages 238 (e.g., to communicate with other computing systems 246) or specific electronic files or documents 234 (e.g., inputs for building models or designing experiments). The input/output interface 204 may be a single interface (e.g., an output interface only to output reports to a printer 242), multiple interface (e.g., a graphical user interface 240 may be interactive and send and receive data over input/output interface 204), or a set of interfaces (e.g., to connect with multiple devices).

In one or more embodiments, computer-readable medium 210 stores instructions for execution by processor 208. In one or more embodiments, one or more applications stored on computer-readable medium 210 are implemented in software (e.g., computer-readable and/or computer-executable instructions) stored in computer-readable medium 210 and accessible by processor 208 for execution of the instructions.

Figure 3:
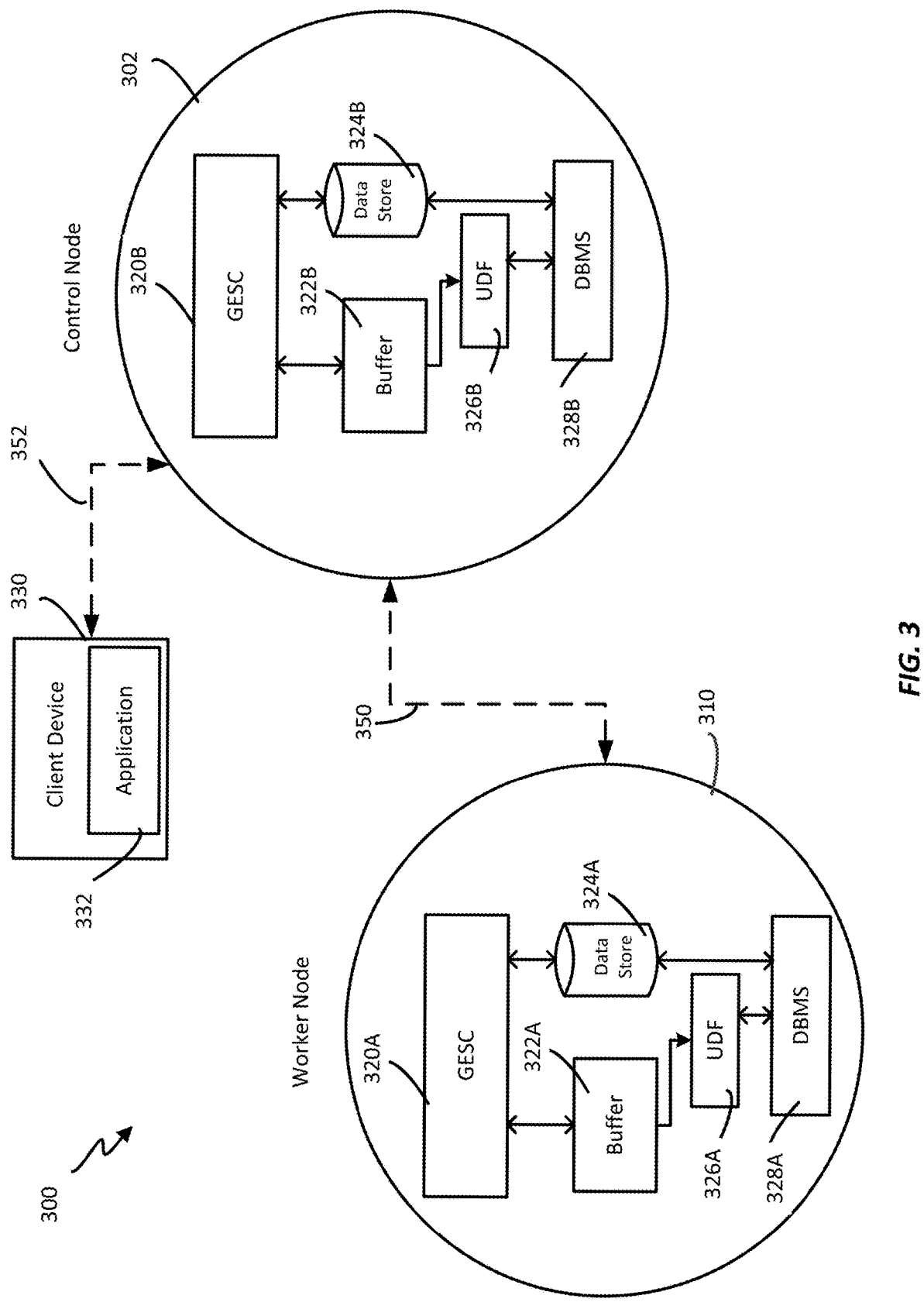
FIG. 3 illustrates a portion of a communications grid computing system, including a control node and a worker node, according to at least one embodiment of the present technology.

FIG. 3 illustrates a system 300 including a control node (e.g., pool manager 104 of FIG. 1) and a worker node (e.g., worker nodes 110 of FIG. 1), according to embodiments of the present technology. System 300 includes one control node (control node 302) and one worker node (worker node 310) for purposes of illustration but may include more worker and/or control node. The control node 302 is communicatively connected to worker node 310 via communication path 350. Therefore, control node 302 may transmit information (e.g., related to the session pool 102 or notifications), to and receive information from worker node 310 via path 350.

System 300 includes data processing nodes (e.g., control node 302 and worker node 310). Control node 302 and worker node 310 can include multi-core data processors. Each control node 302 and worker node 310 in this example includes a grid-enabled software component (GESC) 320 that executes on the data processor associated with that node and interfaces with buffer memory 322 also associated with that node. Each control node 302 and worker node 310 in this example includes a database management software (DBMS) 328 that executes on a database server (not shown) at control node 302 and on a database server (not shown) at worker node 310.

Each control node 302 and worker node 310 in this example also includes a data storage 324. Data storage 324, similar to network-attached data stores 120 in FIG. 1, are used to store data to be processed by the nodes in the computing environment. Data storage 324 may also store any intermediate or final data generated by the computing system after being processed, for example in non-volatile memory. However, in certain embodiments, the configuration of the system 300 allows its operations to be performed such that intermediate and final data results can be stored solely in volatile memory (e.g., RAM), without a requirement that intermediate or final data results be stored to non-volatile types of memory. Storing such data in volatile memory may be useful in certain situations, such as when the pool receives queries (e.g., ad hoc) from a client device 330 and when responses, which are generated by processing large amounts of data, need to be generated quickly or on-the-fly. In such a situation, the pool may be configured to retain the data within memory so that responses can be generated at different levels of detail and so that a client may interactively query against this information.

Each control node 302 and worker node 310 in this example also includes a user-defined function (UDF) 326. The UDF 326 provides a mechanism for the DBMS 328 to transfer data to or receive data from the database stored in the data storage 324 that are managed by the DBMS. For example, UDF 326 can be invoked by the DBMS 328 to provide data to the GESC 320 for processing. The UDF 326 may establish a socket connection (not shown) with the GESC 320 to transfer the data. Alternatively, the UDF 326 can transfer data to the GESC 320 by writing data to shared memory accessible by both the UDF 326 and the GESC 320.

The GESC 320 at the control node 302 and worker node 310 may be connected via a network. Therefore, control node 302 and worker node 310 can communicate with each other via the network using a predetermined communication protocol such as, for example, the Message Passing Interface (MPI). Each GESC 320 can engage in point-to-point communication with the GESC at another node or in collective communication with multiple GESCs via the network. The GESC 320 at each node may contain identical (or nearly identical) software instructions. Each control node 302 and worker node 310 may be configured to operate as either a pool manager or a worker node. The GESC 320B at the control node 302 can communicate, over a communication path 352, with a client device 330. More specifically, control node 302 may communicate with client application 332 hosted by the client device 330 to receive queries and to respond to those queries after processing large amounts of data.

DBMS 328 may control the creation, maintenance, and use of database or data structure (not shown) within control node 302 and worker node 310. The database may organize data stored in data storage 324. The DBMS 328 at control node 302 may accept requests for data and transfer the appropriate data for the request. With such a process, collections of data may be distributed across multiple physical locations. In this example, each control node 302 and worker node 310 stores a portion of the total data managed by the management system in its associated data storage 324.

Furthermore, the DBMS 328 may be responsible for protecting against data loss using replication techniques. Replication includes providing a backup copy of data stored on one node on one or more other nodes. Therefore, if one node fails, the data from the failed node can be recovered from a replicated copy residing at another node. Data or status information for each node in the session pool 102 may also be shared with each node on the pool.

Figure 4:
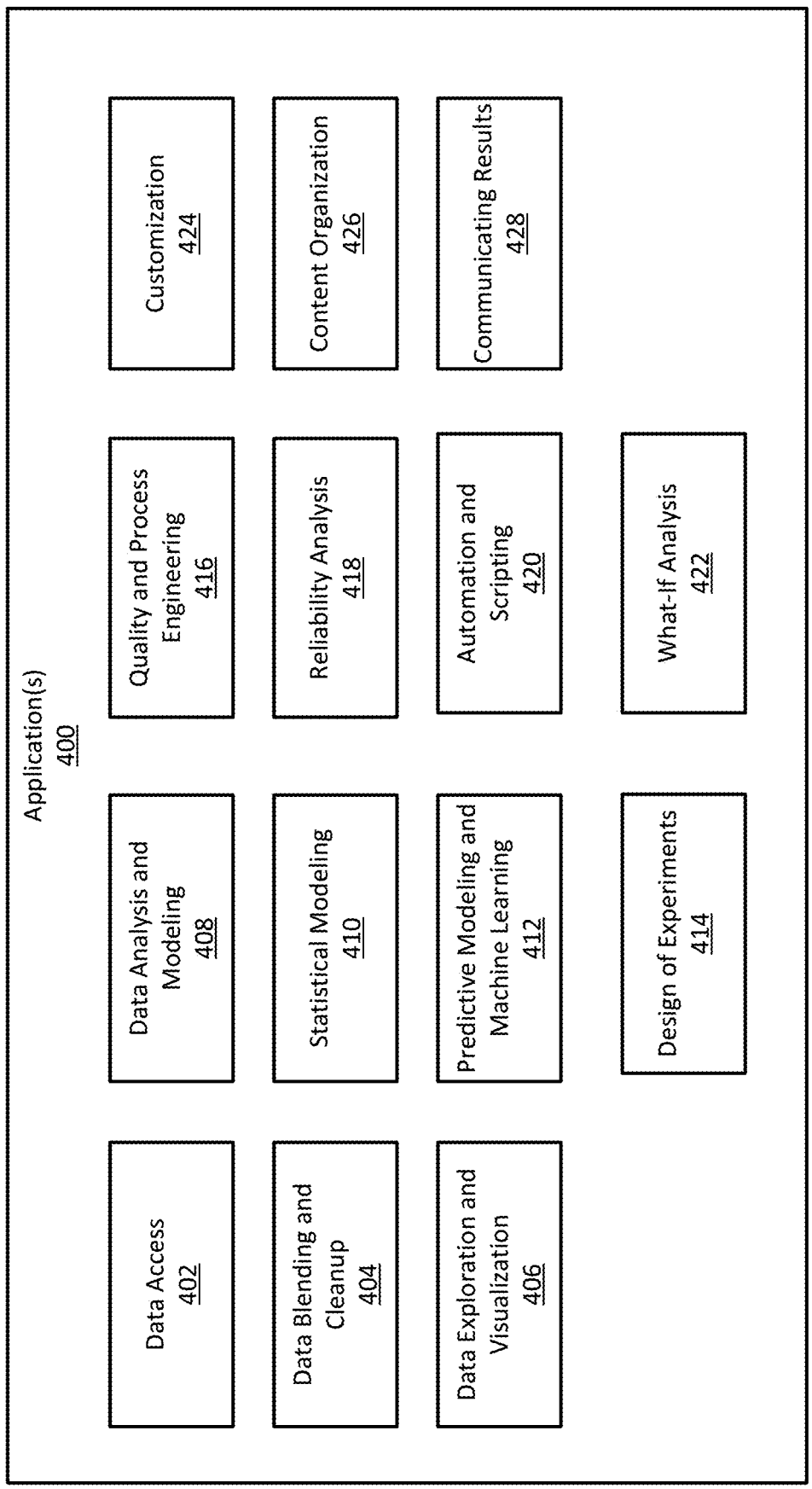
FIG. 4 illustrates a block diagram of example applications, according to at least one embodiment of the present technology.

FIG. 4 provides example applications 400 (e.g., applications executed by a computing device 202, worker node 310, or control node 302) for performing one or more tasks or operations.

For example, data access operations 402 can be used for accessing data from different sources (e.g., importing and/or reading Excel files, flat files, relational databases, APIs, R, Python, and SAS® files and databases). For instance, data can be imported for data visualization, exploration and analysis. Data can be formatted or optimized. For instance, data blending and cleanup operations 404 can be used to remove complexity (e.g., in text, images and functions data) and for screening data (e.g., screening data for outliers, entry errors, missing values and other inconsistencies that can compromise data analysis). This can be useful for visual and interactive tools. Data can also be transformed, blended, grouped, filtered, merged into a single table or into subsets, or otherwise arranged for a particular scenario.

In one or more embodiments, one or more applications 400 include data exploration and visualization operations 406 that can be used to support plot and profiler tools. For instance, plot tools can be used to create data plots (e.g., to plot data to spot patterns and patterns that do not fit a trend). Some example plots include bubble plots, scatter plots (matrix and 3D), parallel plots, cell plots, contour plots, ternary plots, and surface plots. Profilers are tools that can be used to create a specialized set of plots in which changing one plot changes the other plots. For instance, profiling is an approach to generate visualizations of response surfaces by seeing what would happen if a user changed just one or two factors at a time. Profiler tools can be used to create interactive profiles of data (e.g., to explore and graph data dynamically and uncover hidden relationships between graphed data or interface with linked data, to interpret and understand the fit of equations to data, and to find factor values to optimize responses). Some example profiler tools include prediction profiler, contour profiler, surface profiler, mixture profiler, custom profiler, and excel profiler. A prediction profiler can be used to show vertical slices across each factor, holding other factors at a current value. A contour profiler allows horizontal slices showing contour lines for two factors at a time. A surface profiler generates three-dimensional plots for two factors at a time, or contour surface plot for 3 factors at a time. A mixture profiler is a contour profiler for mixture of factors. A custom profiler is a numerical optimizer. An excel profiler allows for visualization of models or formulas stored in electronic worksheets. Accordingly, profiler tools can allow for one or more of simulation, surface visualization, optimization, and desirability studies. Graphs (e.g., from plot or profiler tools) can be exported to electronic or print reports for presenting findings. Further, data exploration and visualization operations 406 can include text exploration such as computer extraction of symbols, characters, words and phrases; or computer visualization such as to organize symbols, characters, words and phrases to uncover information regarding a text or classify the text.

In one or more embodiments, one or more applications 400 include data analysis and modeling operations 408 can be used to analyze one or many variables or factors in linked analysis. Analysis results may be linked with specific graphs designed for different types of data or metrics (e.g., graphs related to histograms, regression modeling and distribution fitting). Data analysis and modeling can be performed real-time (or just-in-time). For instance, applications 400 can included statistical modeling operations 410. For instance, statistical modeling operations 410 can be used for a diversity of modeling tasks such as univariate, multivariate and multifactor. Data can be transformed from its collected form (e.g., text or functional form) and data can be used for building models for better insights (e.g., discovery trends or patterns in data). As another example, one or more applications 400 can include predictive modeling and machine learning operations 412 to build models using predictive modeling techniques, such as regression, neural networks and decision trees. The operations 412 can be used to fit multiple predictive models and determine the best performing model with model screening. Validation (e.g., cross-validation and k-fold cross-validation) can be used (e.g., to prevent over-fitting or to select a best model). Machine learning methods can be used by the user without having to write code and tune algorithms. Examples of machine learning techniques are described in more detail with respect to FIGS. 5 and 6).

In one or more embodiments, one or more applications 400 include design of experiments (DOE) operations 414 used to create designs for experiments that provide test conditions for one or more factors tested in the experiment. For example, the design of experiments operations 414 can be used to create optimally designed experiments, efficient experiments to meet constraints, process limitations and budget, and/or screening designs to untangle important effects between multiple factors. DOE operations 414 can also be used for evaluating designs (e.g., design diagnostic measures such as efficiency metrics).

In one or more embodiments, one or more applications 400 include quality and process engineering operations 416 to track and visualize quality and processes. For instance, the quality and process engineering operations 416 can generate charts to explore root causes of quality or process problems (e.g., causes of variation in manufacturing processes and drill down into problem processes). Additionally, or alternatively, they can be used to generate notifications for metrics that exceed a threshold such as an out-of-control signal or a control chart warning. Additionally, or alternatively, they can be used to study the capability and performance of one or more variables to identify processes that are not meeting user-defined goals. Objective data from processes or consumer data can be used to release better products and react to market trends.

In one or more embodiments, one or more applications 400 include reliability analysis operations 418. For example, in manufacturing, reliability analysis tools can be used to prevent failure, improve warranty or product performance, find and address important design vulnerabilities, and pinpoint defects in materials or processes. Reliability analysis tools can also be used to determine how to reduce or improve these issues (e.g., by identifying trends and outliers in data and model predictions). What-if Analysis operations 422 can be used to demonstrate patterns of predicted responses and the effect of each factor on the response with scenario analysis. For example, a graphical user interface can be used for a user to put in different inputs, assumptions or constraints for a system and observe responses or effects. For instance, in a measurement system analysis analyzing whether parts would be in-specification, different estimated variances between parts and operators testing the parts could be varied to determine the effect on modeled output for the measurement system analysis.

In one or more embodiments, one or more applications 400 include automation and scripting operations 420. For example, automation can allow code-free access for a user to automation routines all the way up to completely customized applications (e.g., code free access to SAS®, MATLAB®, Python® and R routines). For example, a design created for experiments can be automated such that automatic testing is performed for the design.

In one or more embodiments, one or more applications 400 include operations for greater user control and interaction. For instance, customization operations 424 can be used for user customization (e.g., mass customizations, and customizations of graphics, statistics, and default views). As another example, content organization operations 426 can be used to organize data (e.g., translate statistical results to a simplified view to communicate findings and organize, summarize, and document content to better aid the accountability and reproducibility of projects). As another example, the communicating results operations 428 can be used for presentation of results, models, or other output from one or more applications 400 (e.g., presented in print, graphical user interface, or web-based versions).

In one or more embodiments, fewer, different, and additional components can be incorporated into computing device 202. In one or more embodiments, the input/output interface has more than one interface that uses the same or different interface technology.

In one or more embodiments, the one or more applications 400 can be integrated with other analytic or computing tools not specifically shown here. For instance, one or more applications are implemented using or integrated with one or more software tools such as JMP®, Base SAS, SAS® Enterprise Miner™, SAS/STAT®, SAS® High Performance Analytics Server, SAS® Visual Data Mining and Machine Learning, SAS® LASR™ SAS® In-Database Products, SAS® Scalable Performance Data Engine, SAS® Cloud Analytic Services, SAS/OR®, SAS/ETS®, SAS® Inventory Optimization, SAS® Inventory Optimization Workbench, SAS® Visual Analytics, SAS® Viya™, SAS In-Memory Statistics for Hadoop®, SAS® Forecast Server, and SAS/IML®.

Figure 5:
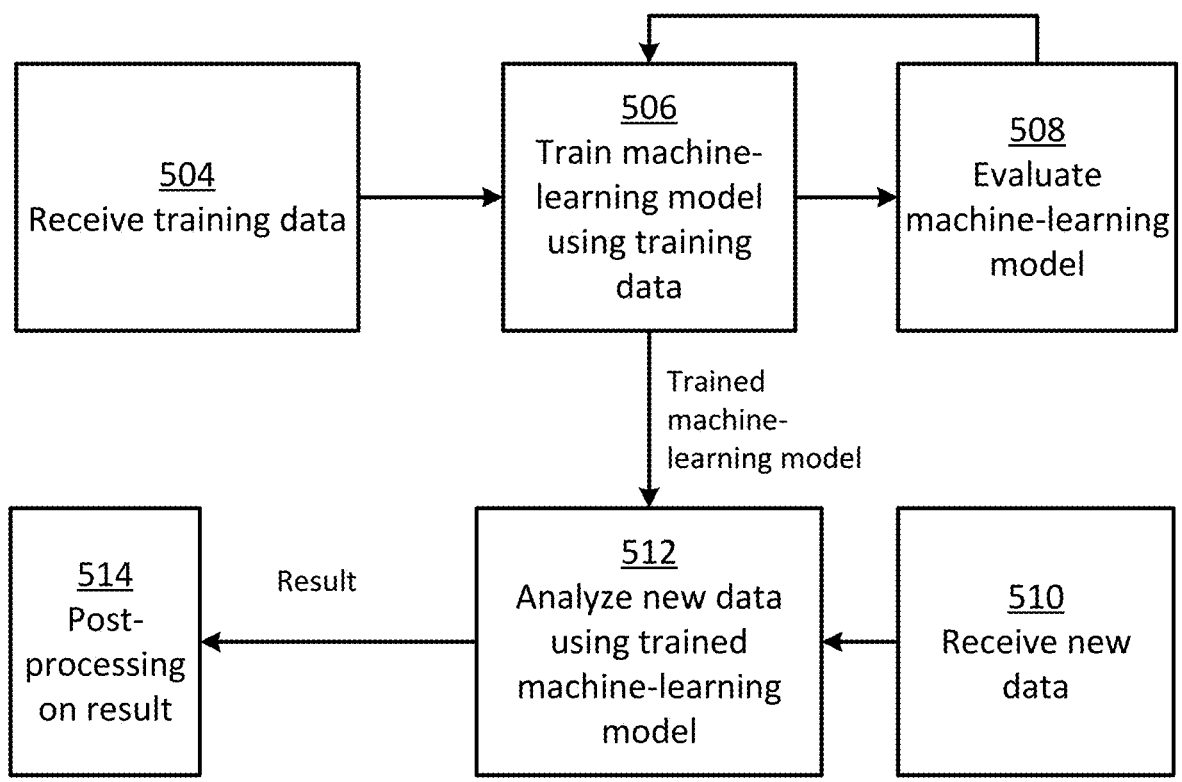
FIG. 5 illustrates a flow chart of an example of a process for generating and using a machine-learning model, according to at least one embodiment of the present technology.

One or more embodiments are useful for generating and using machine-learning models. FIG. 5 is a flow chart of an example of a process for generating and using a machine-learning model according to some aspects. Machine learning is a branch of artificial intelligence that relates to mathematical models that can learn from, categorize, and make predictions about data. Such mathematical models, which can be referred to as machine-learning models, can classify input data among two or more classes; cluster input data among two or more groups; predict a result based on input data; identify patterns or trends in input data; identify a distribution of input data in a space; or any combination of these. Examples of machine-learning models can include (i) neural networks; (ii) decision trees, such as classification trees and regression trees; (iii) classifiers, such as Naïve bias classifiers, logistic regression classifiers, ridge regression classifiers, random forest classifiers, least absolute shrinkage and selector operator (LASSO) classifiers, and support vector machines; (iv) clusterers, such as k-means clustering, mean-shift clusterers, and spectral clusterers; (v) factorizers, such as factorization machines, principal component analyzers and kernel principal component analyzers; and (vi) ensembles or other combinations of machine-learning models. In some examples, neural networks can include deep neural networks, feed-forward neural networks, recurrent neural networks, convolutional neural networks, radial basis function (RBF) neural networks, echo state neural networks, long short-term memory neural networks, bi-directional recurrent neural networks, gated neural networks, hierarchical recurrent neural networks, stochastic neural networks, modular neural networks, spiking neural networks, dynamic neural networks, cascading neural networks, neuro-fuzzy neural networks, or any combination of these.

Different machine-learning models may be used interchangeably to perform a task. Examples of tasks that can be performed at least partially using machine-learning models include various types of scoring; bioinformatics; cheminformatics; software engineering; fraud detection; customer segmentation; generating online recommendations; adaptive websites; determining customer lifetime value; search engines; placing advertisements in real time or near real time; classifying DNA sequences; affective computing; performing natural language processing and understanding; object recognition and computer vision; robotic locomotion; playing games; optimization and metaheuristics; detecting network intrusions; medical diagnosis and monitoring; or predicting when an asset, such as a machine, will need maintenance.

Any number and combination of tools can be used to create machine-learning models. Examples of tools for creating and managing machine-learning models can include SAS® Enterprise Miner, SAS® Rapid Predictive Modeler, and SAS® Model Manager, SAS Cloud Analytic Services (CAS)®, SAS Viya® of all which are by SAS Institute Inc. of Cary, North Carolina.

Machine-learning models construction can be at least partially automated (e.g., with little or no human involvement) in a training process. During training, input data can be iteratively supplied to a machine-learning model to enable the machine-learning model to identify patterns related to the input data or to identify relationships between the input data and output data. With training, the machine-learning model can be transformed from an untrained state to a trained state. Input data can be split into one or more training sets and one or more validation sets, and the training process may be repeated multiple times. The splitting may follow a k-fold cross-validation rule, a leave-one-out-rule, a leave-p-out rule, or a holdout rule. An overview of training and using a machine-learning model is described below with respect to the flow chart of FIG. 5.

In block 504, training data is received. In some examples, the training data is received from a remote database or a local database, constructed from various subsets of data, or input by a user. The training data can be used in its raw form for training a machine-learning model or pre-processed into another form, which can then be used for training the machine-learning model. For example, the raw form of the training data can be smoothed, truncated, aggregated, clustered, or otherwise manipulated into another form, which can then be used for training the machine-learning model.

In block 506, a machine-learning model is trained using the training data. The machine-learning model can be trained in a supervised, unsupervised, or semi-supervised manner. In supervised training, each input in the training data is correlated to a desired output. This desired output may be a scalar, a vector, or a different type of data structure such as text or an image. This may enable the machine-learning model to learn a mapping between the inputs and desired outputs. In unsupervised training, the training data includes inputs, but not desired outputs, so that the machine-learning model has to find structure in the inputs on its own. In semi-supervised training, only some of the inputs in the training data are correlated to desired outputs.

In block 508, the machine-learning model is evaluated. For example, an evaluation dataset can be obtained, for example, via user input or from a database. The evaluation dataset can include inputs correlated to desired outputs. The inputs can be provided to the machine-learning model and the outputs from the machine-learning model can be compared to the desired outputs. If the outputs from the machine-learning model closely correspond with the desired outputs, the machine-learning model may have a high degree of accuracy. For example, if 90% or more of the outputs from the machine-learning model are the same as the desired outputs in the evaluation dataset, the machine-learning model may have a high degree of accuracy. Otherwise, the machine-learning model may have a low degree of accuracy. The 90% number is an example only. A realistic and desirable accuracy percentage is dependent on the problem and the data.

In some examples, if the machine-learning model has an inadequate degree of accuracy for a particular task, the process can return to block 506, where the machine-learning model can be further trained using additional training data or otherwise modified to improve accuracy. If the machine-learning model has an adequate degree of accuracy for the particular task, the process can continue to block 510.

In block 510, new data is received. In some examples, the new data is received from a remote database or a local database, constructed from various subsets of data, or input by a user. The new data may be unknown to the machine-learning model. For example, the machine-learning model may not have previously processed or analyzed the new data.

In block 512, the trained machine-learning model is used to analyze the new data and provide a result. For example, the new data can be provided as input to the trained machine-learning model. The trained machine-learning model can analyze the new data and provide a result that includes a classification of the new data into a particular class, a clustering of the new data into a particular group, a prediction based on the new data, or any combination of these.

In block 514, the result is post-processed. For example, the result can be added to, multiplied with, or otherwise combined with other data as part of a job. As another example, the result can be transformed from a first format, such as a time series format, into another format, such as a count series format. Any number and combination of operations can be performed on the result during post-processing.

Figure 6:
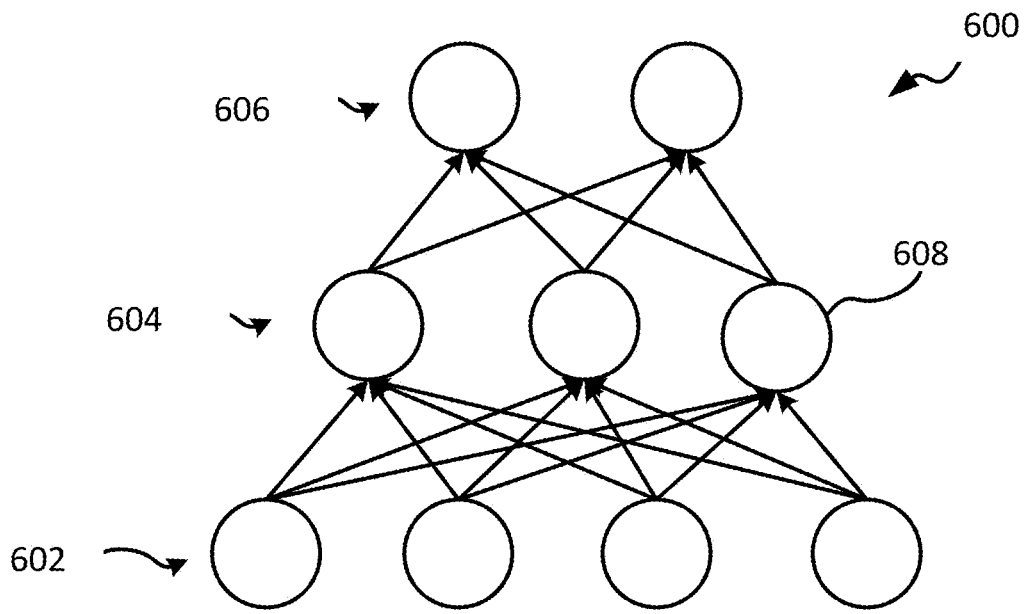
FIG. 6 illustrates an example of a machine-learning model as a neural network, according to at least one embodiment of the present technology.

A more specific example of a machine-learning model is the neural network 600 shown in FIG. 6. The neural network 600 is represented as multiple layers of interconnected neurons, such as neuron 608, that can exchange data between one another. The layers include an input layer 602 for receiving input data, a hidden layer 604, and an output layer 606 for providing a result. The hidden layer 604 is referred to as hidden because it may not be directly observable or have its input directly accessible during the normal functioning of the neural network 600. Although the neural network 600 is shown as having a specific number of layers and neurons for exemplary purposes, the neural network 600 can have any number and combination of layers, and each layer can have any number and combination of neurons.

The neurons and connections between the neurons can have numeric weights, which can be tuned during training. For example, training data can be provided to the input layer 602 of the neural network 600, and the neural network 600 can use the training data to tune one or more numeric weights of the neural network 600. In some examples, the neural network 600 can be trained using backpropagation. Backpropagation can include determining a gradient of a particular numeric weight based on a difference between an actual output of the neural network 600 and a desired output of the neural network 600. Based on the gradient, one or more numeric weights of the neural network 600 can be updated to reduce the difference, thereby increasing the accuracy of the neural network 600. This process can be repeated multiple times to train the neural network 600. For example, this process can be repeated hundreds or thousands of times to train the neural network 600.

In some examples, the neural network 600 is a feed-forward neural network. In a feed-forward neural network, every neuron only propagates an output value to a subsequent layer of the neural network 600. For example, data may only move one direction (forward) from one neuron to the next neuron in a feed-forward neural network.

In other examples, the neural network 600 is a recurrent neural network. A recurrent neural network can include one or more feedback loops, allowing data to propagate in both forward and backward through the neural network 600. This can allow for information to persist within the recurrent neural network. For example, a recurrent neural network can determine an output based at least partially on information that the recurrent neural network has seen before, giving the recurrent neural network the ability to use previous input to inform the output.

In some examples, the neural network 600 operates by receiving a vector of numbers from one layer; transforming the vector of numbers into a new vector of numbers using a matrix of numeric weights, a nonlinearity, or both; and providing the new vector of numbers to a subsequent layer of the neural network 600. Each subsequent layer of the neural network 600 can repeat this process until the neural network 600 outputs a final result at the output layer 606. For example, the neural network 600 can receive a vector of numbers as an input at the input layer 602. The neural network 600 can multiply the vector of numbers by a matrix of numeric weights to determine a weighted vector. The matrix of numeric weights can be tuned during the training of the neural network 600. The neural network 600 can transform the weighted vector using a nonlinearity, such as a sigmoid tangent or the hyperbolic tangent. In some examples, the nonlinearity can include a rectified linear unit, which can be expressed using the following equation:

$$y = \max(x, o)$$

where y is the output and x is an input value from the weighted vector. The transformed output can be supplied to a subsequent layer, such as the hidden layer 604, of the neural network 600. The subsequent layer of the neural network 600 can receive the transformed output, multiply the transformed output by a matrix of numeric weights and a nonlinearity, and provide the result to yet another layer of the neural network 600. This process continues until the neural network 600 outputs a final result at the output layer 606.

Other examples of the present disclosure may include any number and combination of machine-learning models having any number and combination of characteristics. The machine-learning model(s) can be trained in a supervised, semi-supervised, or unsupervised manner, or any combination of these. The machine-learning model(s) can be implemented using a single computing device or multiple computing devices, such as the session pool 102 discussed above.

Implementing some examples of the present disclosure at least in part by using machine-learning models can reduce the total number of processing iterations, time, memory, electrical power, or any combination of these consumed by a computing device when analyzing data. For example, a neural network may more readily identify patterns in data than other approaches. This may enable the neural network to analyze the data using fewer processing cycles and less memory than other approaches, while obtaining a similar or greater level of accuracy.

Some machine-learning approaches may be more efficiently and speedily executed and processed with machine-learning specific processors (e.g., not a generic CPU). Such processors may also provide an energy savings when compared to generic CPUs. For example, some of these processors can include a graphical processing unit (GPU), an application-specific integrated circuit (ASIC), a field-programmable gate array (FPGA), an artificial intelligence (AI) accelerator, a neural computing core, a neural computing engine, a neural processing unit, a purpose-built chip architecture for deep learning, and/or some other machine-learning specific processor that implements a machine learning approach or one or more neural networks using semiconductor (e.g., silicon (Si), gallium arsenide (GaAs)) devices. Furthermore, these processors may also be employed in heterogeneous computing architectures with a number of and a variety of different types of cores, engines, nodes, and/or layers to achieve various energy efficiencies, chip-level thermal processing considerations, processing speed improvements, data communication speed improvements, and/or data efficiency targets and improvements throughout various parts of the system when compared to a homogeneous computing architecture that employs CPUs for general purpose computing.

ASSOCIATED PROCESSES

Figure 7:
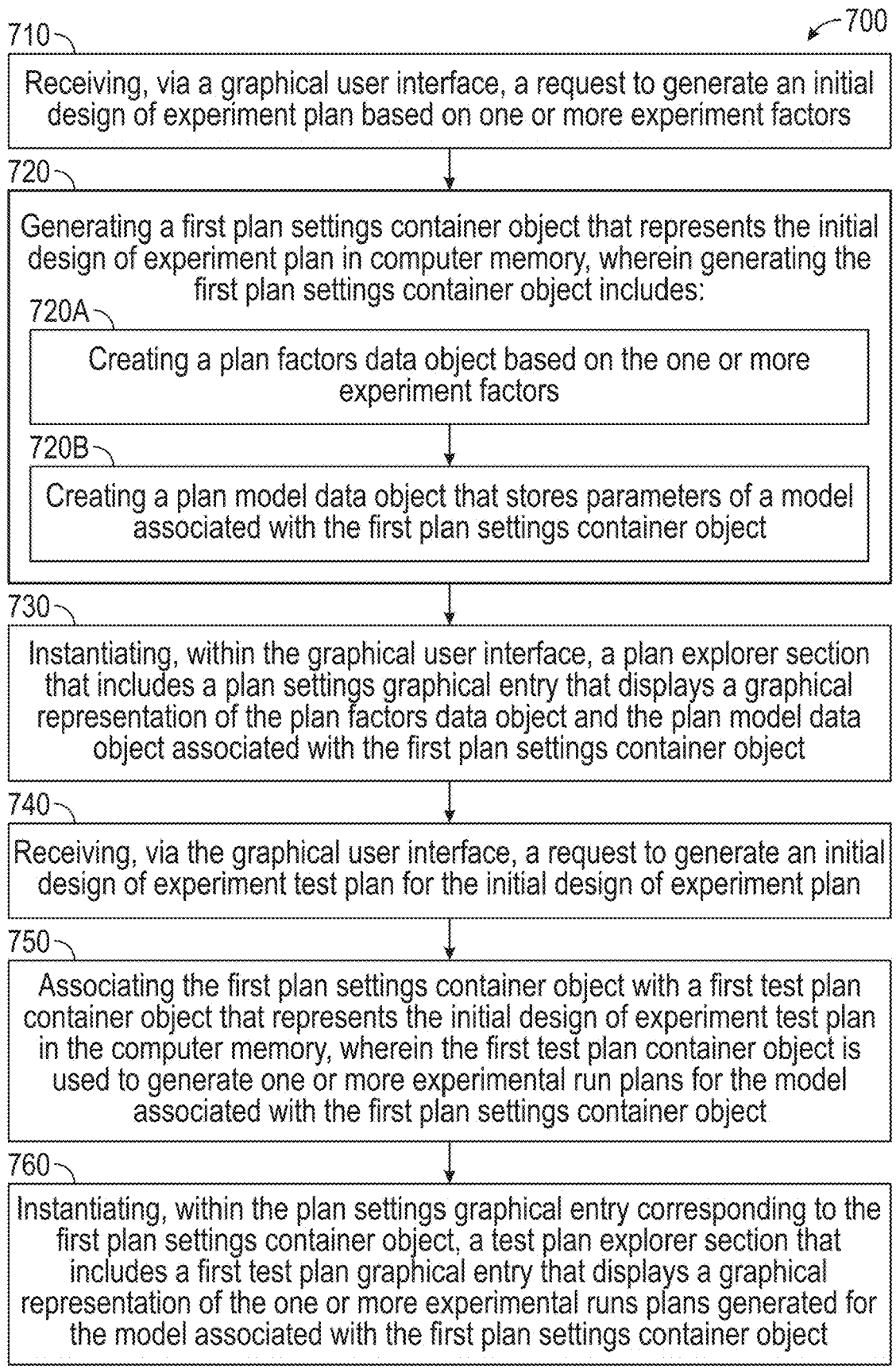
FIG. 7 illustrates an example flow chart of a method for creating and displaying one or more experimental designs, according to at least one embodiment of the present technology.

FIG. 7 illustrates an example process flow for creating and displaying experimental designs via method 700. It shall be appreciated that other embodiments contemplated within the scope of the present disclosure may involve more processes, fewer processes, different processes, or a different order of processes than illustrated in FIG. 7.

One of ordinary skill in the art will appreciate that method 700 may provide many technical advantages and practical applications over conventional design of experiment (DOE) processes. Specifically, in some embodiments, method 700 may overcome the typical limitations encountered in the process of constructing one or more designs of experiments. In traditional DOE workflows, the design configuration process often follows a rigid, step-by-step sequence, where users (e.g., test planners) must sequentially move from identifying experimental factors, to constructing a design of experiment model, and finally to creating and evaluating test plans based on the constructed model. This linear approach makes it difficult to adjust or modify previously specified factors and model settings, as any change typically requires users to revert to earlier stages in the configuration process. This backtracking is time-consuming and frustrating, especially when users need to explore multiple configurations or incorporate changes into a respective experimental design.

Backtracking in such traditional workflows not only consumes time but also disrupts the flow of the design configuration process, forcing users to revisit earlier design decisions and potentially overwrite data from earlier and/or later stages. As changes arise, users are often forced to overwrite previously completed steps, which limits flexibility and hinders their ability to experiment with multiple designs simultaneously. This limitation can become especially problematic when complex designs or iterative refinements are required.

Method 700 addresses these challenges by providing a more flexible, dynamic approach to design construction and exploration. Specifically, instead of overwriting previous steps, method 700 enables users to create different branches of the experimental design at any point. These branches may be represented visually as tabs or other interface elements, allowing users to modify factors, introduce new model settings or parameters, or explore multiple design scenarios in parallel with other designs. This "experiment design branching" capability preserves previous design paths while still enabling real-time exploration of alternative configurations. As a result, users can experiment with multiple designs simultaneously without the risk of losing or overwriting valuable experimental data, a requirement often imposed by conventional DOE methods.

As illustrated in FIG. 7, process 710 of method 700 may receive, via a graphical user interface, a request to generate an initial design of experiment plan based on one or more experiment factors. The phrase "design of experiment plan," as generally used herein, may refer to a computer-implemented plan (e.g., data object) that stores one or more experimental settings of a design of experiment. For instance, in some embodiments, a respective design of experiment plan may include experimental settings of one or more experiment factors and/or may include one or more experimental settings of a design of experiment model.

Figure 8A:
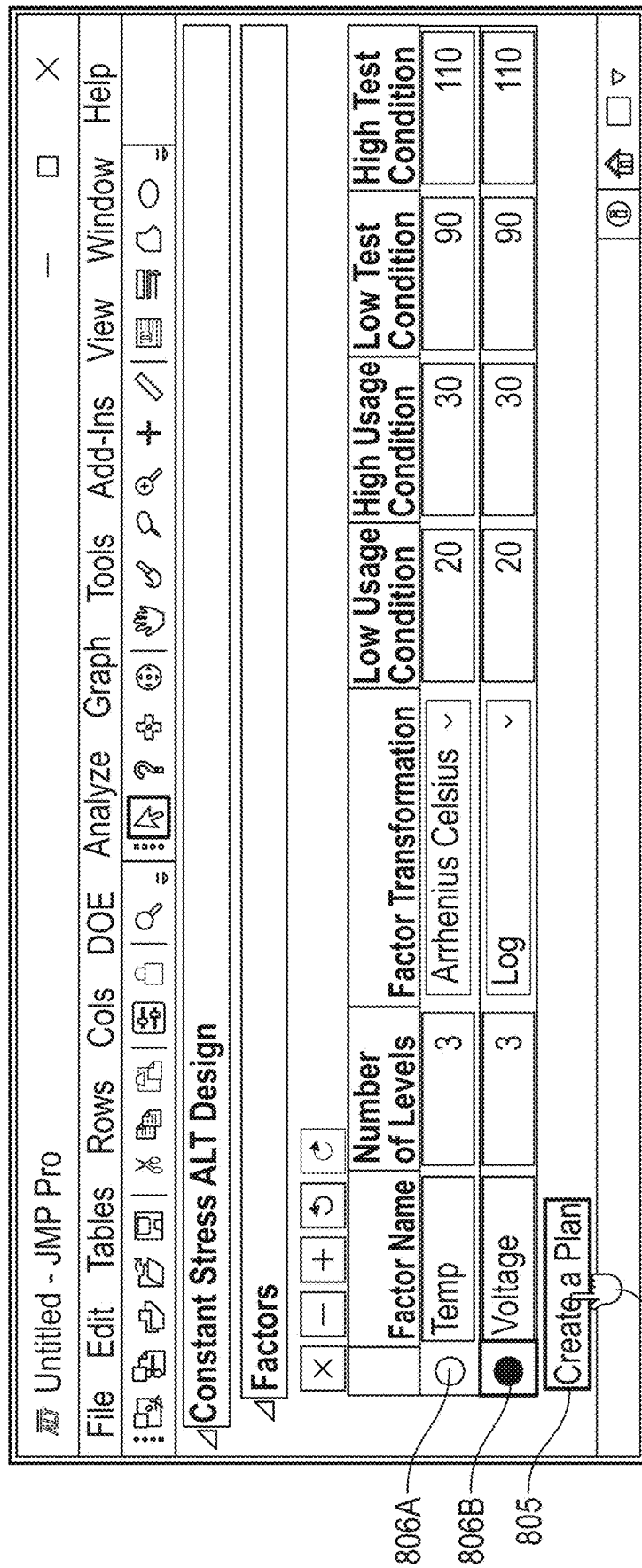

In some embodiments, the one or more experiment factors of process 710 may be similar to the experiment factors 806A-806B illustrated in FIG. 8A. Experiment factors 806A and 806B, as generally used herein, may refer to variables or conditions that are manipulated or measured during a computer-implemented design of experiment. In some embodiments, experiment factors 806A-806B may include one or more experimental settings (e.g., attributes), such as a name of a factor, a number of levels associated with a factor, a transformation associated with a factor, a low usage condition associated with a factor, a high usage condition associated with a factor, a low test condition associated with a factor, a high test condition associated with a factor, and/or the like.

For example, as shown in FIG. 8A, experimental factor 806A may be associated with the name "Temp" and have three (3) levels. Additionally, as shown in FIG. 8A, experimental factor 806A may specify the factor transformation as "Arrhenius Celsius," twenty (20) as the low usage condition, thirty (30) as the high usage condition, ninety (90) as the low test condition, and one hundred and ten (110) as the high test condition. Conversely, as also shown in FIG. 8A, experimental factor 806B may be associated with the name "Voltage" and have three (3) levels. Furthermore, as also shown in FIG. 8A, experimental factor 806B may specify the factor transformation as "Log," twenty (20) as the low usage condition, thirty (30) as the high usage condition, ninety (90) as the low test condition, and one hundred and ten (110) as the high test condition. It shall be noted that experiment factors 806A and 806B are not intended to be limiting and that, in one or more other embodiments, process 710 may generate a design of experiment plan based on additional, different, or fewer experiment factors than illustrated in FIG. 8A.

Additionally, as illustrated in FIG. 8A, the graphical user interface of process 710 may be similar to graphical user interface 802 illustrated in FIG. 8A. Specifically, as shown in FIG. 8A, graphical user interface 802 may include a selectable user interface element 805. In some embodiments, an input selecting selectable user interface element 805 may cause process 710 to receive a request to generate the initial design of experiment plan. For instance, as shown in FIG. 8A, process 710 may receive an input 804 selecting selectable user interface element 805. Thus, in some embodiments, in response to detecting input 804, process 710 may receive a request to create an initial design of experiment plan based on experiment factors 806A-806B.

It shall be noted that, while process 710 illustrated in FIG. 7 describes receiving a request to generate a single design of experiment plan (e.g., the initial design of experiment plan), other embodiments of process 710 may additionally receive one or more requests for generating one or more additional design of experiment plans (e.g., a second design of experiment plan, a third design of experiment plan, etc.). For instance, as shown in FIG. 8H, after receiving input 804 in FIG. 8A, process 710 may additionally receive, via selectable user interface element 805, an input 838 that corresponds to a request to generate a second design of experiment plan, different from the initial design of experiment plan requested via input 804 in FIG. 8A.

Referring to FIG. 7, in some embodiments, method 700 may proceed from process 710 to process 720. As illustrated in FIG. 7, process 720 may generate a first plan settings container object that represents the initial design of experiment plan in computer memory. The first plan settings container object of process 720, as generally used herein, may refer to a computer-implemented data structure that stores experimental settings associated with the initial design of experiment plan of process 710, including the experiment factors associated with the initial design of experiment plan, a model associated with the initial design of experiment plan, and/or the like.

Figure 8B:
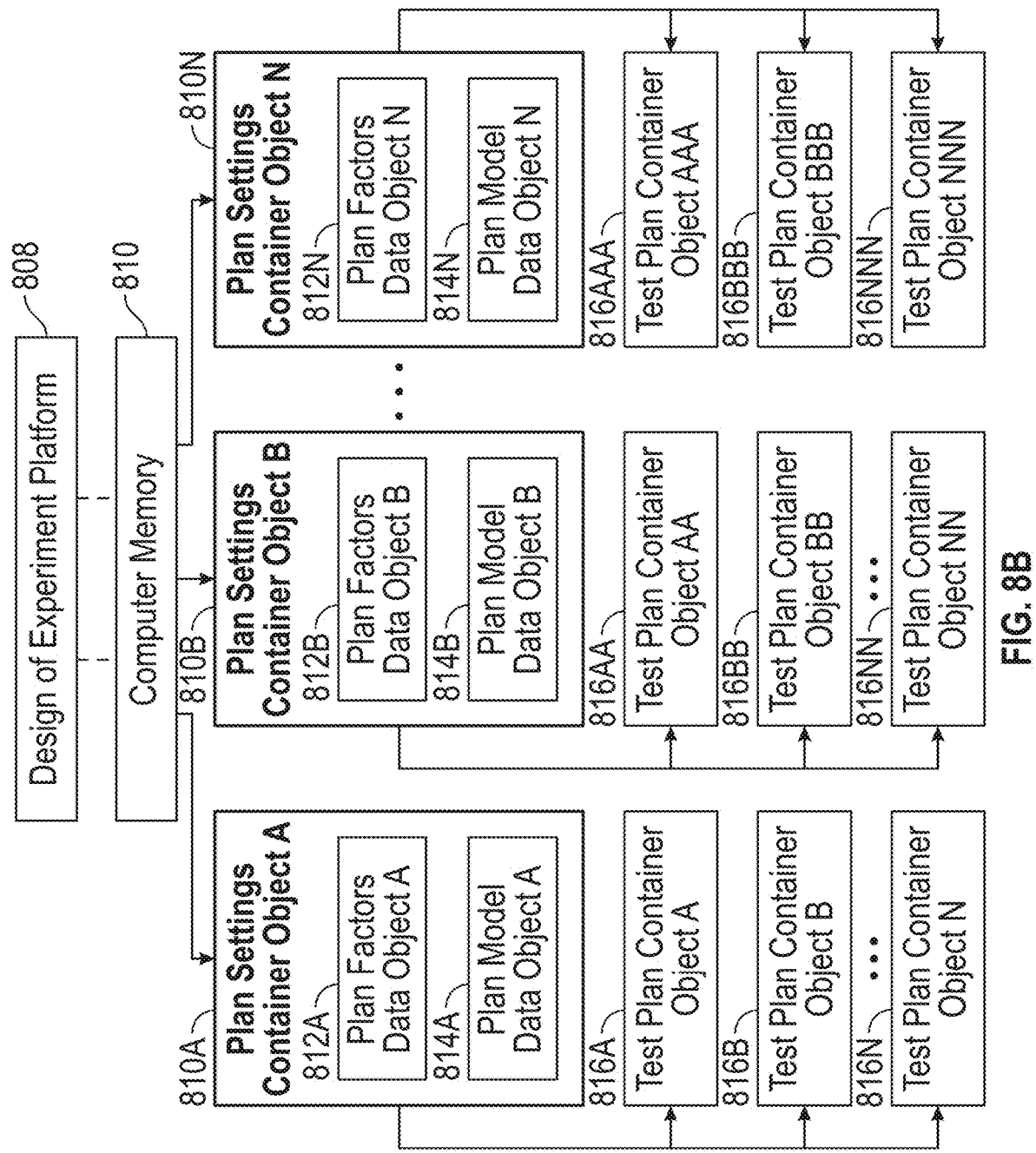

In some embodiments, the first plan settings container object of process 720 may correspond to plan settings container object A 810A illustrated in FIG. 8B. For instance, as described previously in FIG. 8A, process 710 may receive, via selectable user interface element 805, an input 804 for generating an initial design of experiment plan based on experiment factors 806A-806B. Thus, in some embodiments, in response to detecting input 804, process 720 may generate plan settings container object A 810A that represents the initial design of experiment plan.

Figure 8C:
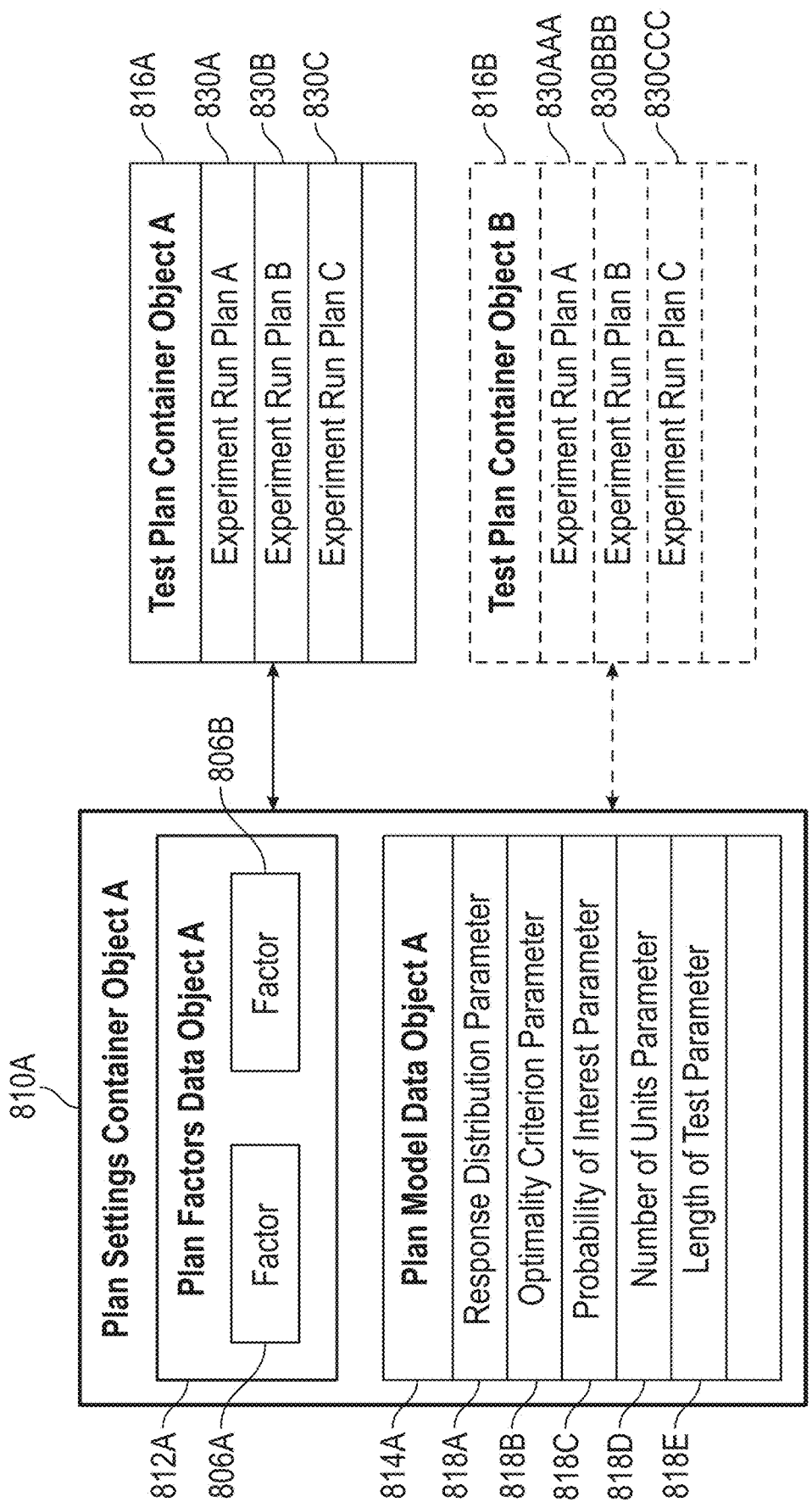

In some embodiments, as illustrated in FIG. 7, generating the first plan settings container object may include creating, via subprocess 720A, a plan factors data object based on the one or more experiment factors. The plan factors data object created via subprocess 720A, in some embodiments, may be similar to plan factors data object A 812A illustrated in FIG. 8B. Plan factors data object A 812A, as generally used herein, may refer to a data structure that stores settings of one or more experimental factors. For instance, as shown in FIG. 8C, plan factors data object A 812A may store the settings of experiment factors 806A-806B. It shall be noted that the plan factors data object A 812A illustrated in FIG. 8C is not intended to be limiting and that, if graphical user interface 802 included additional, different, or fewer experiment factors, plan factors 812A would analogously store the settings of the additional, different, or fewer experiment factors.

In some embodiments, subprocess 720A may create the plan factors data object A 812A based on a state of the experiment factors 806A and 806B when process 710 received the input 804. For instance, as described previously in FIG. 8A, experiment factors 806A and 806B may include one or more attributes, such as a factor name attribute, a number of levels attribute, a factor transformation attribute, a low usage condition attribute, a high usage condition attribute, a low test condition attribute, a high test condition attribute, and/or the like. Thus, in some embodiments, plan factors data object A 812A may store the values (e.g., state) of the attributes associated with experiment factors 806A and 806B at the time process 710 received input 804.

Specifically, for experiment factor 806A, plan factors data object A 812A may store that, at the time of receiving input 804 in FIG. 8A, the factor name attribute, the number of levels attribute, the factor transformation attribute, the low usage condition attribute, the high usage condition attribute, the low test condition attribute, and the high test condition attribute of experiment factor 806A was associated with the values "Temp," three (3), "Arrhenius Celsius," twenty (20), thirty (30), ninety (90), one hundred and ten (110), respectively. Conversely, for experiment factor 806B, plan factors data object A 812A may store that, at the time of receiving input 804 in FIG. 8A, the factor name attribute, the number of levels attribute, the factor transformation attribute, the low usage condition attribute, the high usage condition attribute, the low test condition attribute, and the high test condition attribute of experiment factor 806B was associated with the values "Voltage," three (3), "Log," twenty (20), thirty (30), ninety (90), and one hundred and ten (110), respectively.

Furthermore, as illustrated in FIG. 7, generating the first plan settings container object may include creating, via subprocess 720B, a plan model data object that stores parameters of a model associated with the first plan settings container object. The plan model data object created via subprocess 720B, in some embodiments, may be similar to plan model data object A 814A illustrated in FIG. 8B. Plan model data object A 814A, as generally used herein, may refer to a data structure that stores parameters of a model (e.g., a design of experiment model, machine learning model, statistical model, and/or the like).

For instance, as shown in FIG. 8C, plan model data object A 814A may include parameters 818A-818E. It shall be noted that FIG. 8C is not intended to be limiting and that other embodiments of plan model data object A 814A may include additional, different, or fewer parameters than illustrated in FIG. 8C. Response distribution parameter 818A, in some embodiments, may specify a type of distribution that governs (e.g., models) the behavior of a response variable in the design of experiment (e.g., Lognormal, Weibull, etc.). Optimality criterion parameter 818B, in some embodiments, may define the method by which the design of experiment model is optimized (e.g., quantile, etc.). Probably of interest parameter 818C, in some embodiments, may refer to the level of statistical significance or confidence that the design of experiment aims to achieve (e.g., 0.1, etc.). Number of units parameter 818D, in some embodiments, may represent the total number of experimental units to be included in the design of experiment (e.g., 100). Lastly, length of test parameter 818E, in some embodiments, may define the duration or time span which the designed experiment will be conducted (e.g., 1000 hours, etc.).

It shall be noted that, in some embodiments, plan model data object A 814A may instead include a failure time variable. For instance, if the optimality criterion parameter 818B is set to failure time instead of quantile, plan model object A 814A may replace the probability of interest parameter 818C with a failure time parameter to specify the target time frame or duration relevant to the experimental design.

In some embodiments, the computer memory of process 720 may correspond to computer memory 810 illustrated in FIG. 8B. As shown in FIG. 8B, computer memory 810 may be in operable connection with a design of experiment platform 808. Design of experiment platform 808, as generally used herein, may refer to a software tool that is configured to create, optimize, and analyze experimental designs (e.g., experimental plans). Merely for illustration, in some embodiments, design of experiment platform 808 may correspond to a software tool developed and provided by JMP Statistical Discovery LLC of Cary, N.C., USA, such as JMP®.

Additionally, as shown in FIG. 8B, computer memory 810 may store one or more one or more plan settings container objects. Specifically, as shown in FIG. 8B, computer memory 810 may include a plan settings container object A 810A that represents the initial design of experiment plan of process 710 in computer memory 810 (e.g., the design of experiment plan generated in response to input 804 in FIG. 8A). Furthermore, as also shown in FIG. 8B, computer memory 810 may store one or more additional plan settings container objects that represent one or more additional design of experiment plans, such as plan settings container objects B-N 810B-810N.

In some embodiments, plan settings container objects B-N 810B-810N may be generated based on (e.g., in response to) detecting one or more additional inputs selecting selectable user interface element 805 in FIG. 8A. For instance, as shown in FIG. 8H, after receiving input 804 in FIG. 8A, process 710 may detect an additional input 838 selecting selectable user interface element 805. Additional input 838, in some embodiments, may correspond to a request to generate a second design of experiment plan, different from the initial design of experiment plan requested via input 804 in FIG. 8A.

In some embodiments, process 720 may perform a determination that determines if the experiment factors 806A and 806B were modified between input 804 in FIG. 8A and input 838 in FIG. 8H. If the determination performed by process 720 determines that the experiment factors 806A and 806B were modified between input 804 in FIG. 8A and input 838 in FIG. 8H, process 720 may generate a second plan settings container object that represents the second design of experiment plan. For example, as shown in FIG. 8H, the factor transformation attribute of experiment factor 806A may have changed from "Arrhenius Celsius" to "Arrhenius Fahrenheit" between the input 804 in FIG. 8A and the input 838 in FIG. 8H. Thus, in some embodiments, because of such change, process 720 may determine that experiment factors 806A and 806B were modified between input 804 in FIG. 8A and input 838 in FIG. 8H.

In some embodiments, if process 720 determines that the experiment factors 806A and 806B were modified between input 804 in FIG. 8A and input 838 in FIG. 8H, process 720, in turn, may generate an additional plan settings container object. For instance, as shown in FIG. 8B, process 720 may generate a plan settings container object B 810B (e.g., a second plan settings container object) that represents a second design of experiment plan in computer memory 810. It shall be noted that the second design of experiment plan represented via second plan settings container object 810B may be different than the initial design of experiment plan represented via plan settings container object A 810A.

Conversely, in some embodiments, if process 720 determines that the experiment factors 806A and 806B were not modified between input 804 in FIG. 8A and input 838 in FIG. 8H, process 720 may instead forgo generating an additional plan settings container object. For instance, in some embodiments, if process 720 instead determined that the experiment factors 806A and 806B were not modified between input 804 in FIG. 8A and input 838 in FIG. 8H, process 720 may forgo generating plan settings container object B 810B in computer memory 810. It shall be noted that the remainder of the plan settings container objects illustrated in FIG. 8B (e.g., plan settings container object N 810N) may be generated or not generated for similar reasons described above.

Similar to plan settings container object A 810A, generating plan settings container object B 810B may include creating a plan factors data object and a plan model data object. For instance, as shown in FIG. 8B, process 720 may generate a plan factors data object B 812B and a plan model data object B 814B for plan settings container object B 810B. Plan factors data object B 812B and plan model data object B 814B may have characteristics similar to plan factors data object A 812A and plan model data object B 814A, respectively.

Specifically, in some embodiments, plan factors data object B 812B may be created based on a state of the experiment factors 806A and 806B when process 710 received input 838 in FIG. 8H. For instance, as described previously, between input 804 in FIG. 8A and input 838 in FIG. 8H, the factor transformation attribute of experiment factor 806A may have changed from an "Arrhenius Celsius" value to an "Arrhenius Fahrenheit" value. Thus, for experiment factor 806A, plan factors data object B 812B in FIG. 8I may store the new value of the factor transformation attribute of experiment factor 806A (e.g., "Arrhenius Fahrenheit") in addition to the values of the other attributes at the time of receiving input 838 (e.g., the value of the factor name attribute, the number of levels attributes, the low usage condition attribute, the high usage condition attribute, the low test condition attribute, and the high test condition attribute in FIG. 8H). It shall be noted that, for experiment factor 806B, plan factors data object B 812B in FIG. 8I may similarly include the new values (e.g., current values) of the factor transformation attribute, the factor name attribute, the number of levels attribute, the low usage condition attribute, the high usage condition attribute, the low test condition attribute, and the high test condition attribute at the time of receiving input 838.

In some embodiments, plan model data object B 814B may store one or more parameters of a model associated with the plan settings container object B 810B. As shown in FIG. 8I, the one or more parameters stored by plan model data object 814B may include parameters 818G-818K. Parameters 818G-818K may be similar to parameters 818A-818E described with reference to FIG. 8C. However, parameters 818G-818K may hold different values specific to the current state of the model associated with plan model data object B 814B (e.g., the computer representation of the second design of experiment plan), whereas parameters 818A-818E may hold values specific to the current state of the model associated with plan model data object A 814A (e.g., the computer representation of the initial design of experiment plan).

Referring to FIG. 7, in some embodiments, method 700 may proceed from process 720 to process 730. As illustrated in FIG. 7, process 730 may instantiate, within the graphical user interface, a plan explorer section that includes a plan settings graphical entry. The plan settings graphical entry of process 730, as illustrated in FIG. 7, may display a graphical representation of the plan factors data object and the plan model data object associated with the first plan settings container object. A plan settings graphical entry, as generally used herein, may refer to an interactive user interface element that visually represents data stored within a plan factors data object and a plan model data object.

Figure 8D:
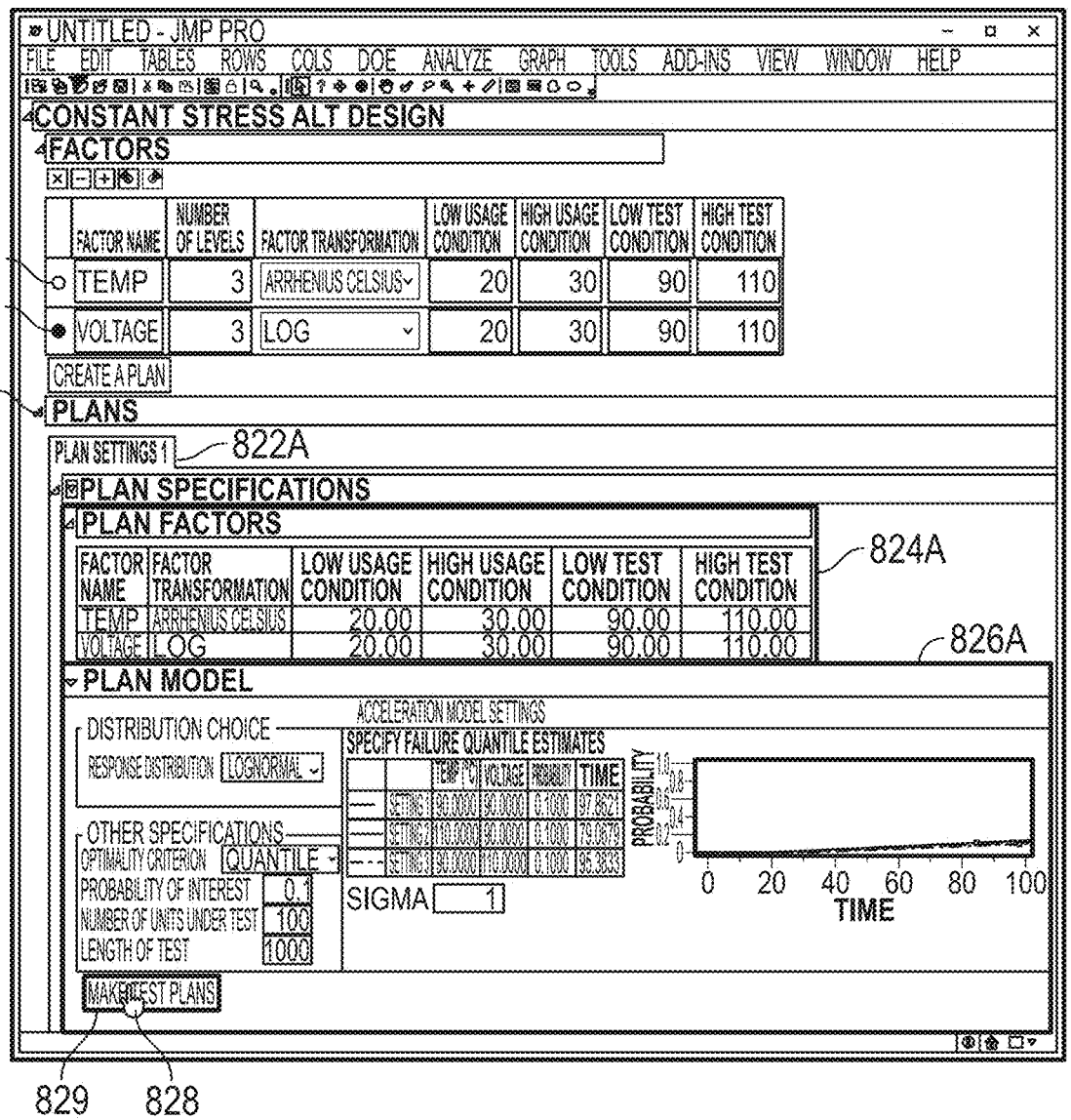
Figure 8E:
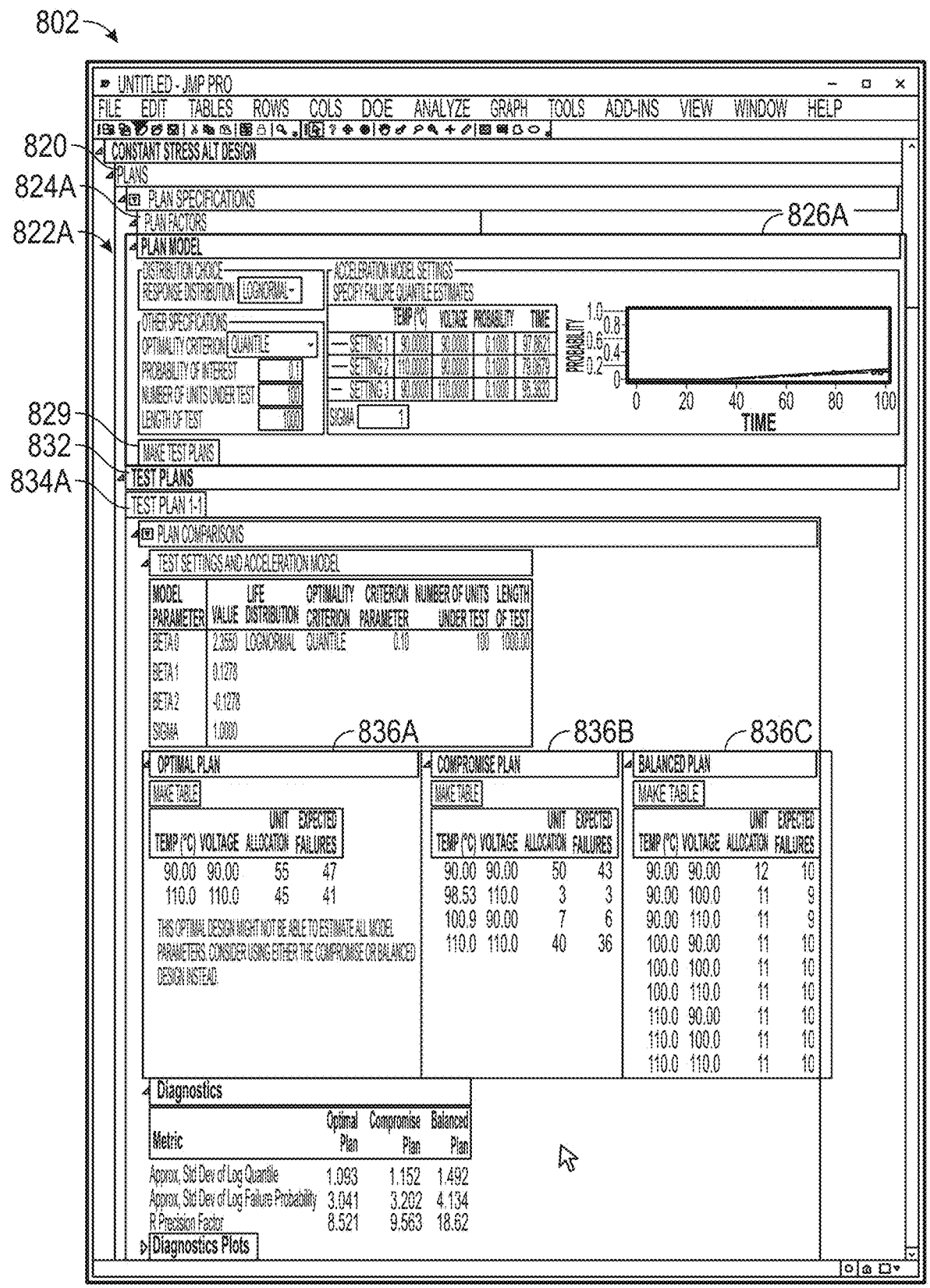

In some embodiments, the graphical user interface of process 730 may be similar to graphical user interface 802 illustrated in FIG. 8D. For instance, as shown in FIG. 8A, graphical user interface 802 may not include a plan explorer section before input 804 is received (e.g., because no design of experiments plans are created). However, as shown in FIG. 8D, after receiving input 804, process 730 may instantiate plan explorer section 820 within graphical user interface 802. Plan explorer section 820, as generally used herein, may refer to a tab container or any other suitable interface component that is capable of displaying one or more graphical entries associated with one or more design of experiment plans.

In some embodiments, plan explorer section 820 may include one or more plan settings graphical entries. For example, as also shown in FIG. 8D, plan explorer section 820 may include plan settings graphical entry 822A (e.g., a non-limiting example of the plan settings graphical entry of process 730). Plan settings graphical entry 822A, as generally used herein, may refer to a tab user interface component or any other suitable interface component that displays settings of a design of experiment plan.

In some embodiments, plan settings graphical entry 822A may display a graphical representation of data stored within a corresponding plan settings container object. For instance, in the example of FIG. 8D, plan settings graphical entry 822A may correspond to plan settings container object A 810A. Thus, in some embodiments, plan settings graphical entry 822A may include a graphical representation 824A of the plan factors data object A 812A associated with plan settings container object A 810A and a graphical representation 826A of the plan model data object A 814A associated with plan settings container object A 810A.

In some embodiments, a graphical representation of a plan factors data object may include a user interface element that displays one or more factors associated with the plan factors data object and their respective experimental settings (e.g., attributes). For instance, as shown in FIG. 8D, the graphical representation 824A of plan factors data object A 812A may include a table user interface element that includes a first factor row corresponding to experiment factor 806A of plan factors data object A 812A and a second factor row corresponding to experiment factor 806B of plan factors data object A 812A. It shall be noted that if plan factors data object A 812A was associated with additional, fewer, or different experiment factors, the table user interface element of graphical representation 824A may respectively include additional, fewer, or different factor rows.

In some embodiments, a respective factor row of graphical representation 824A may display one or more experimental settings of an experiment factor stored within plan factors data object A 812A. For instance, as shown in FIG. 8D, the factor row associated with experiment factor 806A of plan factors data object A 812A may display the name of experiment factor 806A in plan factors data object A 812A (e.g., "Temp"), the transformation of experiment factor 806A in plan factors data object A 812A (e.g., "Arrhenius Celsius"), the low usage condition of experiment factor 806A in plan factors data object A 812A (e.g., "20.00"), the high usage condition of experiment factor 806A in plan factors data object A 812A (e.g., "30.00"), the low test condition of experiment factor 806A in plan factors data object A 812A (e.g., "90.00"), and the high test condition of experiment factor 806A in plan factors data object A 812A (e.g., "110.00").

Conversely, as also shown in FIG. 8D, the factor row associated with experiment factor 806B of plan factors data object A 812A may display the name of experiment factor 806B in plan factors data object A 812A (e.g., "Voltage"), the transformation of experiment factor 806B in plan factors data object A 812A (e.g., "Log"), the low usage condition of experiment factor 806B in plan factors data object A 812A (e.g., "20.00"), the high usage condition of experiment factor 806B in plan factors data object A 812A (e.g., "30.00"), the low test condition of experiment factor 806B in plan factors data object A 812A (e.g., "90.00"), and the high test condition of experiment factor 806B in plan factors data object A 812A (e.g., "110.00").

In some embodiments, the graphical representation 826A of the plan model data object 814A may include one or more editable user interface elements for modifying a value of one or more parameters stored within plan model data object 814A. For instance, as shown in FIG. 8D, graphical representation 826A may include an editable user interface element for modifying a value of the response distribution parameter 818A in plan model data object A 814A (e.g., "Lognormal"). Graphical representation 826A, in some embodiments, may also include an editable user interface element for modifying a value of the optimality criterion parameter 818B in plan model data object A 814A (e.g., "Quantile").

Furthermore, in some embodiments, graphical representation 826A may also include an editable user interface element for modifying a value of the probability of interest parameter 818C in plan model data object A 814A (e.g., "0.1"). Additionally, in some embodiments, graphical representation 826A may also include an editable user interface element for modifying a number of units parameter 818D in plan model data object A 814A (e.g., "100"). Lastly, in some embodiments, graphical representation 826A may also include an editable user interface element for modifying the length of test parameter 818E in plan model data object A 814A (e.g., "1000"). It shall be noted that if plan model data object A 814A included additional, fewer, or different parameters than illustrated in FIG. 8C, graphical representation 826A may correspondingly include additional, fewer, or different editable user interface elements for modifying such parameters.

It shall also be noted that while process 730 describes an embodiment of a plan explorer section that includes one plan settings graphical entry, the plan explorer section of process 730 is not limited to such configuration and may include one or more additional plan settings graphical entries without departing from the scope of the disclosure. For example, as shown in FIG. 8J, plan explorer section 820 may include plan settings graphical entry 834A and plan settings graphical entry 834B. As described above, plan settings graphical entry 834A may correspond to plan settings container object A 810 in FIG. 8B. Conversely, in some embodiments, plan settings graphical entry 834B may correspond to plan settings container object B 810B in FIG. 8B.

In some embodiments, process 730 may add a new plan settings graphical entry when a new plan settings container object is created in the computer memory 810 illustrated in FIG. 8B. For instance, if plan settings container object B 810B is created in computer memory 810 for the reasons described in process 720, process 730 may add, to plan explorer section 820, a plan settings graphical entry 834B corresponding to plan settings container object B 810B. Alternatively, in some embodiments, if the plan settings container object 810B is not created in the computer memory 810 for the reasons described in process 720, process 730 may forgo adding, to plan explorer section 820, the plan settings graphical entry 834B corresponding to plan settings container object B 810B.

Furthermore, in some embodiments, as shown in FIGS. 8I and 8J, plan settings graphical entry 834B may include a graphical representation 824B of the plan factors data object B 812B associated with plan settings container object B 810B and a graphical representation 826B of the plan model data object B 814B associated with plan settings container object B 810B. Graphical representation 824B and 826B may display content for reasons analogous to graphical representations 824A and 826A in FIG. 8D, respectively.

Figure 8F:
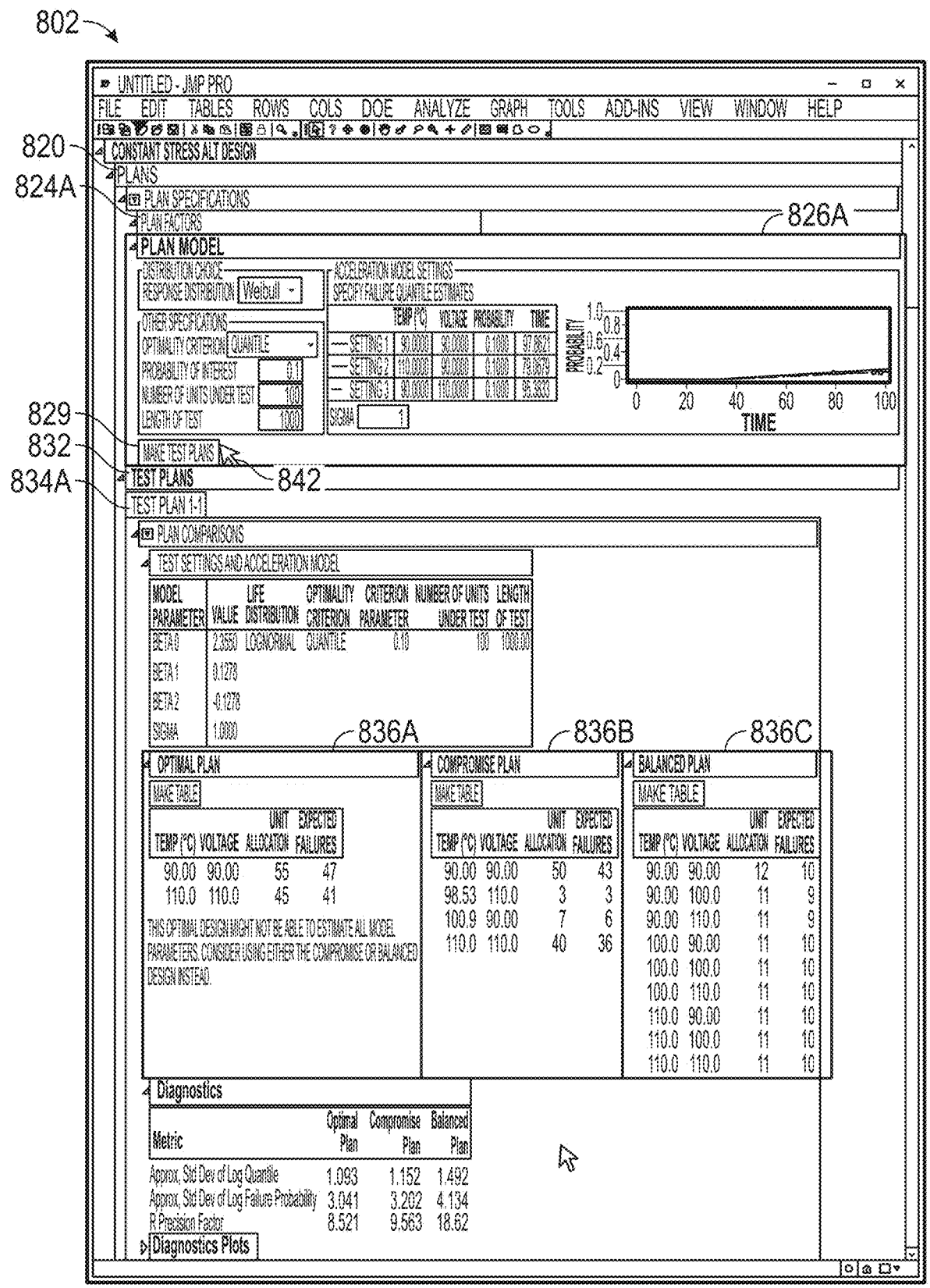
Figure 8G:
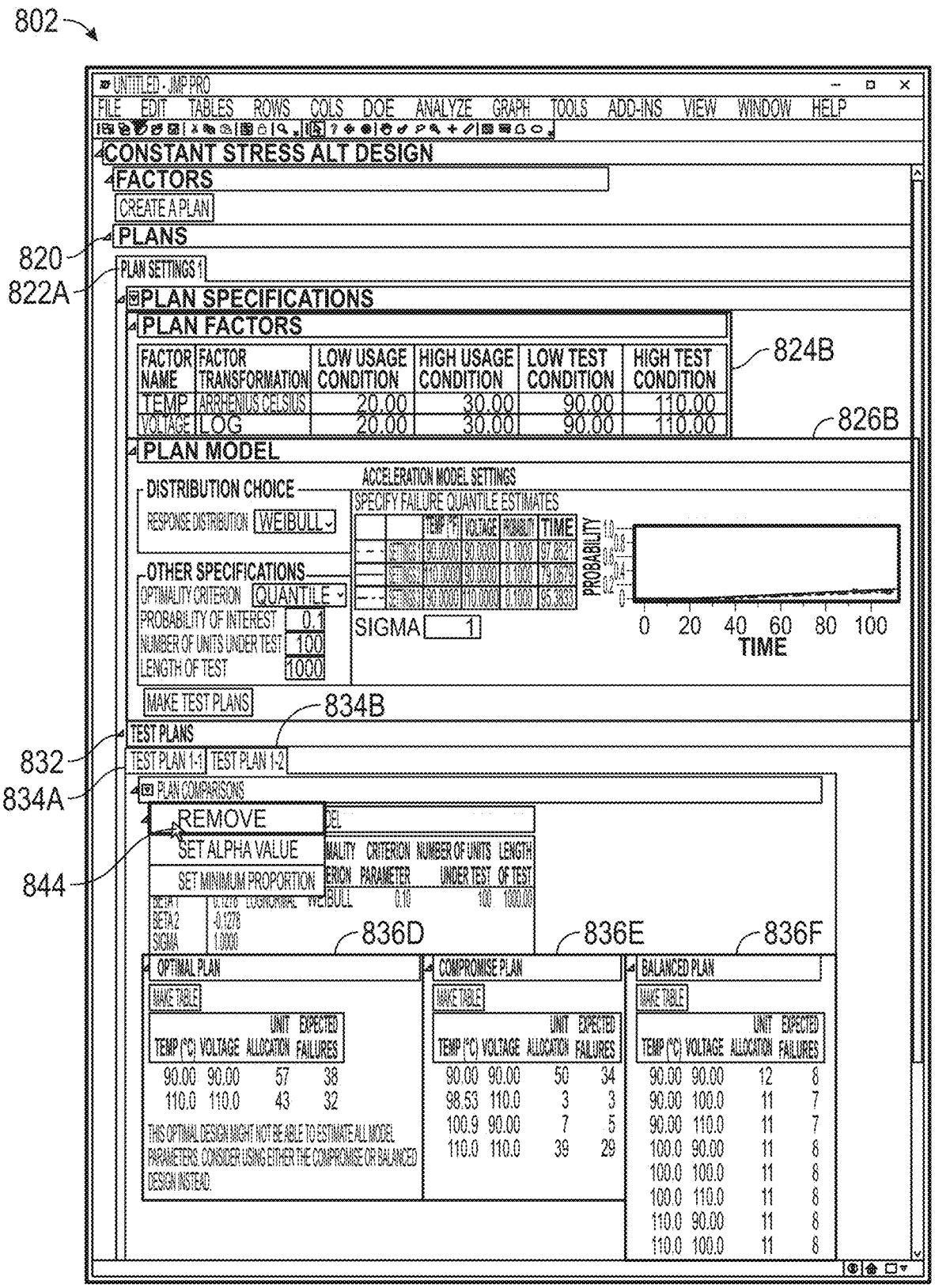
Figure 8H:
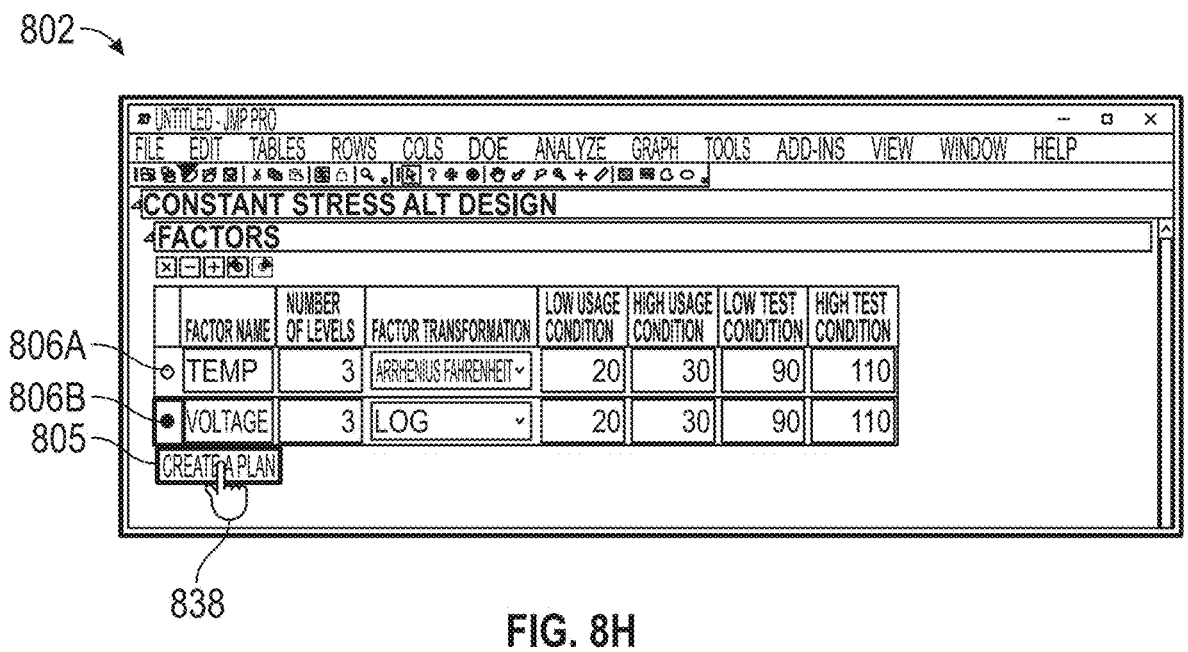
Figure 8I:
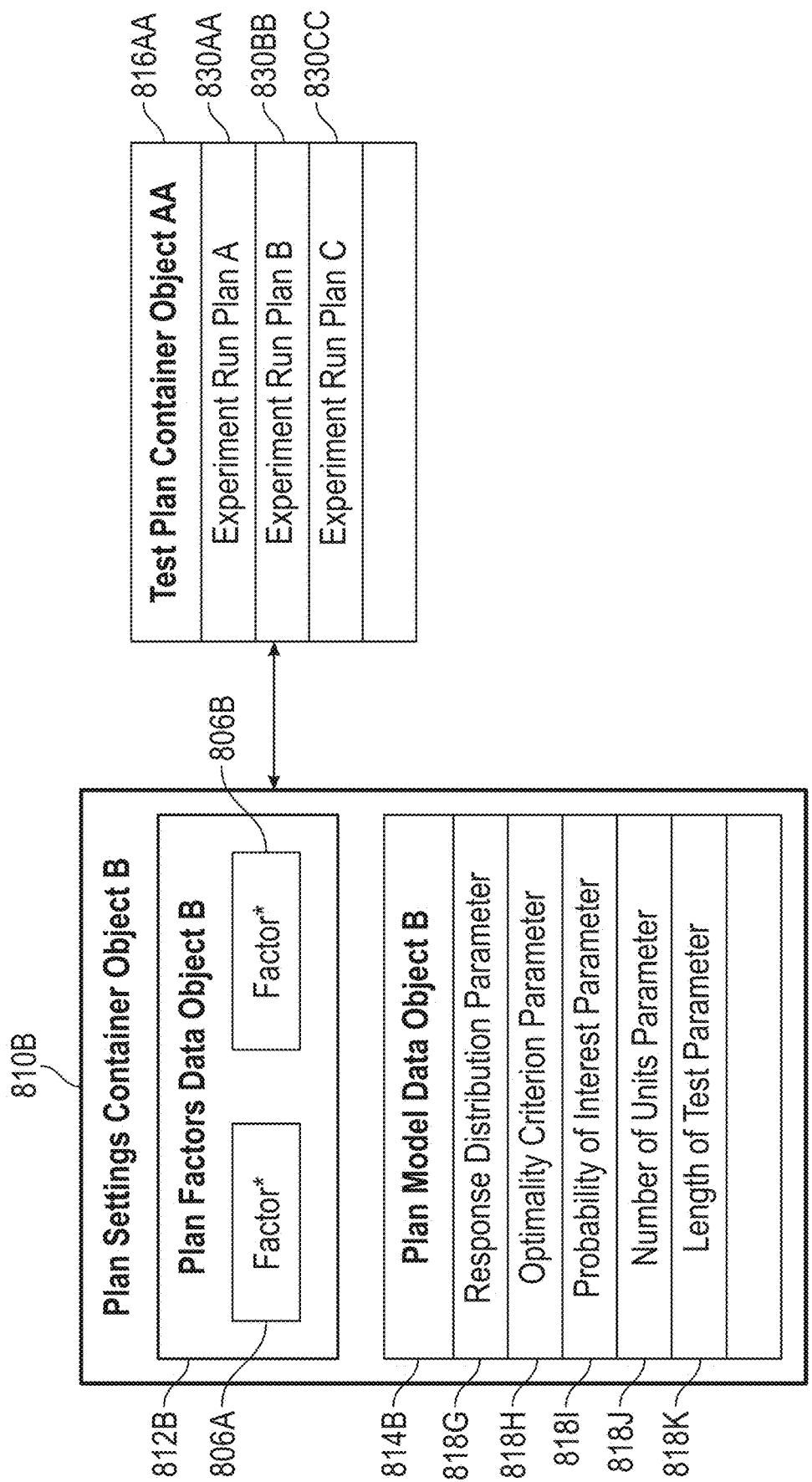
Figure 8J:
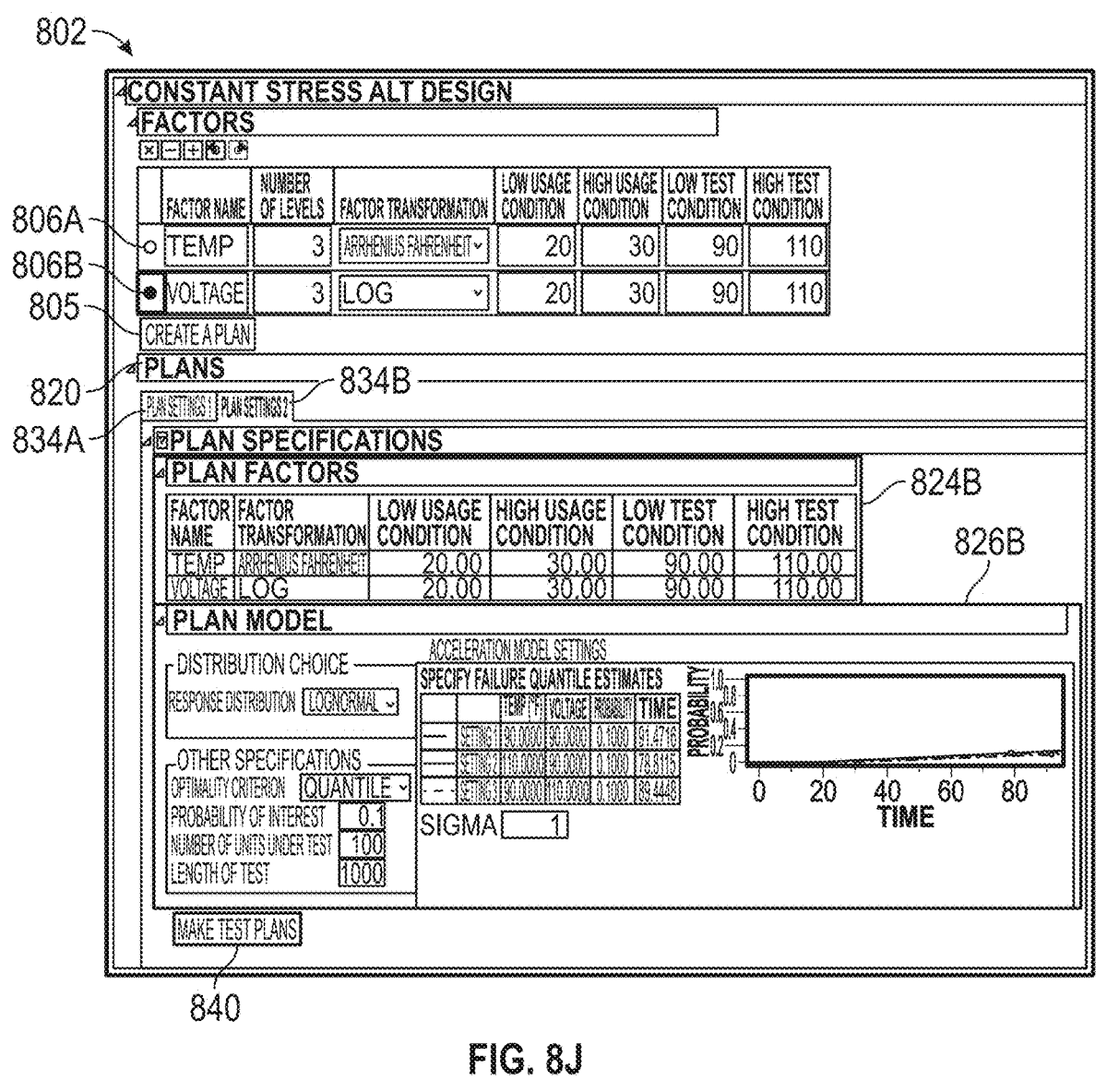
Figure 8K:
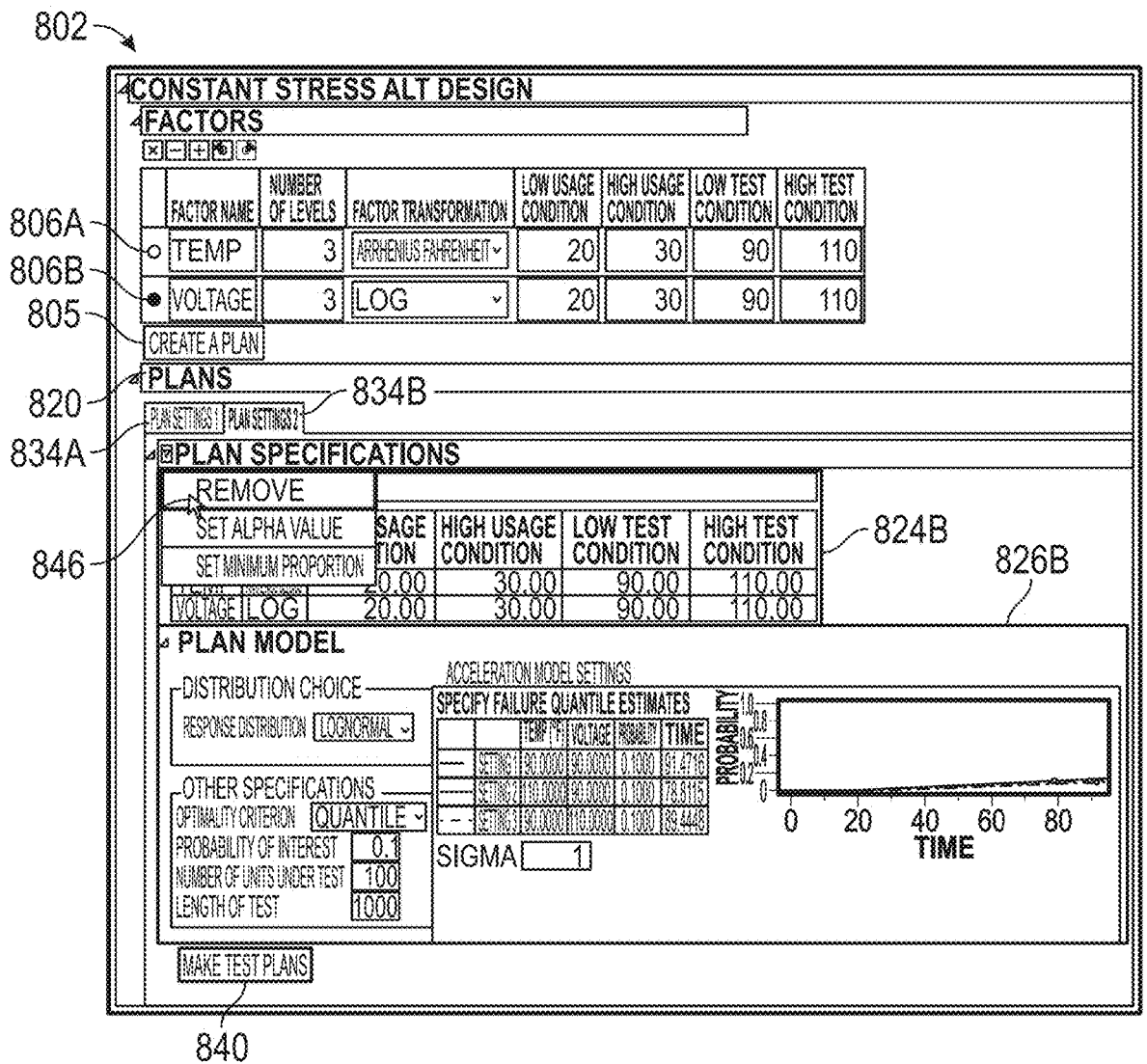

In some embodiments, process 730 may receive a deletion input for removing a respective plan settings graphical entry from plan explorer section 820. For instance, as shown in FIG. 8K, process 730 may receive deletion input 846 via graphical user interface 802. Specifically, in the example of FIG. 8K, deletion input 846 may correspond to a request to delete plan settings graphical entry 834B. In response to receiving deletion input 846, process 730 may cease display of plan settings graphical entry 834B from plan explorer section 820 and maintain display of plan settings graphical entry 834A (e.g., revert to the state of the graphical user interface 802 illustrated in FIG. 8D).

Furthermore, in some embodiments, in response to receiving deletion input 846, process 730 may delete a corresponding plan settings container object and one or more test plan container objects associated with such plan settings container object (if applicable), as will be described later. For example, as described previously, plan settings graphical entry 834B may correspond to plan settings container object B 810B in FIG. 8B. Thus, in some embodiments, in response to receiving deletion input 846 for deleting plan settings graphical entry 834B, process 730 may delete the corresponding plan settings container object B 810B from computer memory 810 and delete the one or more test plan container objects AA-NN 816AA-816NN associated with such plan settings container object B 810B from computer memory 810.

Referring to FIG. 7, in some embodiments, method 700 may proceed from process 730 to process 740. Process 740 may receive, via the graphical user interface, a request to generate an initial design of experiment test plan for the initial design of experiment plan. For example, as shown in FIG. 8D, the initial design of experiment plan represented via plan settings graphical entry 822A may not yet be associated with a design of experiment test plan. Thus, in some embodiments, process 740 may receive a request for transitioning the initial design of experiment plan from having no associated design of experiment test plans to being associated with at least one design of experiment test plan (e.g., the initial design of experiment test plan).

Specifically, in some embodiments, the graphical user interface of process 740 may be similar to graphical user interface 802 illustrated in FIG. 8D. Specifically, as shown in FIG. 8D, graphical user interface 802 may include a selectable user interface element 829. In some embodiments, an input selecting selectable user interface element 829 may cause process 740 to receive a request to generate the initial design of experiment test plan. For instance, as shown in FIG. 8D, process 740 may receive an input 828 selecting selectable user interface element 829. Thus, in some embodiments, in response to receiving input 828, process 740 may receive the request to create the initial design of experiment test plan for the initial design of experiment plan.

It shall be noted that, while process 740 illustrated in FIG. 7 describes receiving a request to generate a single design of experiment test plan (e.g., an initial design of experiment test plan), process 740 is not limited to such a request and that other embodiments of process 740 may additionally receive one or more requests for generating one or more additional design of experiment test plans (e.g., a second design of experiment test plan, a third design of experiment test plan, etc.). For instance, as shown in FIG. 8F, after receiving input 828 in FIG. 8D, process 740 may additionally receive, via selectable user interface element 829, an input 842 that corresponds to a request to generate a second design of experiment test plan, different from the initial design of experiment test plan requested via input 828 in FIG. 8A.

Referring to FIG. 7, method 700 may proceed from process 740 to process 750. Process 750, in some embodiments, may associate the first plan settings container object with a first test plan container object that represents the initial design of experiment test plan in the computer memory. Additionally, in some embodiments, as illustrated in FIG. 7, the first test plan container object of process 740 may be used to generate one or more experimental run plans for the model associated with the first plan settings container object.

In some embodiments, the first test plan container object of process 740 may correspond to test plan container object A 816A in FIG. 8B. Additionally, in some embodiments, as shown in FIG. 8B, process 740 may associate the test plan container object A 816A with plan settings container object A 810A. For example, as described in FIG. 8D, process 740 may receive an input 828 selecting a selectable user interface element 829 that is displayed within plan settings graphical entry 822A (e.g., displayed within graphical representation 826A). As also described previously, plan settings graphical entry 822A may be associated with plan settings container object A 810A in computer memory 810. Thus, in some embodiments, in response to receiving input 828 in FIG. 8D, process 750 may create test plan container object A 816A and, in turn, associate test plan container object A 816A with plan settings container object 810A. It shall be noted that, if the graphical entry displaying selectable user interface element 829 was associated with a different plan settings container object, process 750 would have instead associated test plan container object A 816A with the different plan settings container object.

Additionally, as shown in FIG. 8B, plan settings container objects A-N 810A-810N may be associated with one or more test plan container objects. Specifically, as shown in FIG. 8B, plan settings container objects A-N 810A-810N may be associated with test plan container objects A-N 816A-816N, test plan container objects AA-NN 816AA-816NN, and test plan container objects AAA-NNN 816AAA-816NNN, respectively.

In some embodiments, the test plan container objects B-N 816B-816N associated with plan settings container object A 810A may be generated based on (e.g., in response to) detecting one or more additional inputs selecting selectable user interface element 829 in FIG. 8D. For instance, as shown in FIG. 8F, after receiving input 828 in FIG. 8D, process 740 may detect an additional input 842 selecting selectable user interface element 829. Additional input 829, in some embodiments, may correspond to a request to generate a second design of experiment test plan, different from the initial design of experiment test plan requested via input 828 in FIG. 8D.

In some embodiments, process 750 may perform a determination to determine if the plan factors data object A 812A or the plan model data object A 814A was modified between input 828 in FIG. 8D and input 842 in FIG. 8F. If the determination performed by process 750 determines that the plan factors data object A 812A or the plan model data object A 814A was modified between input 828 in FIG. 8D and input 842 in FIG. 8F, process 750 may generate a second test plan container object that represents the second design of experiment test plan in computer memory 818. For example, as shown in FIG. 8F, graphical representation 826A may have received, via the "response distribution" editable user interface element, an input for changing the response distribution parameter 818A of plan model data object 814A from "Lognormal" in FIG. 8D to "Weibull" in FIG. 8F. Thus, in some embodiments, because of such change, process 750 may determine that plan factors data object A 812A or the plan model data object A 814A was modified between input 828 in FIG. 8D and input 842 in FIG. 8F.

In some embodiments, if process 750 determines that plan factors data object A 812A or the plan model data object A 814A was modified between input 828 in FIG. 8D and input 842 in FIG. 8F, process 750, in turn, may associate an additional test plan container object with plan settings container object A 810A. For instance, as shown in FIG. 8C, process 750 may create test plan container object B 816B (e.g., a second test plan container object) that represents a second design of experiment test plan in computer memory 810 and, in turn, associate test plan container object B 816B with plan settings container object A 810A. It shall be noted that the second design of experiment test plan represented via test plan container object B 810B may be different than the initial design of experiment test plan represented via test plan container object A 810A.

Conversely, in some embodiments, if process 750 determines that plan factors data object A 812A and the plan model data object A 814A were not modified between input 828 in FIG. 8D and input 842 in FIG. 8F, process 750 may instead forgo generating an additional test plan container object. For instance, in some embodiments, if process 750 instead determined that plan factors data object A 812A and plan model data object A 814A were not modified between input 828 in FIG. 8D and input 842 in FIG. 8F, process 750 may instead forgo generating test plan container object B 816B in computer memory 810.

It shall be noted that the remainder of test plan container objects illustrated in FIG. 8B (e.g., test plan container object N 816N, test plan container objects AA-NN 816AA-816NN, and test plan container objects AAA-NNN 816AAA-816NNN) may be created (or not created) and associated (or not associated) for similar reasons described above. For example, in FIG. 8J, process 750 may receive one or more inputs selecting a selectable user interface element 840 displayed within plan settings graphical entry 834B (e.g., displayed within graphical representation 826B). As also described previously with reference to FIG. 8B, plan settings graphical entry 834B may be associated with plan settings container object B 810B in computer memory 810 (e.g., different than the plan settings container object A 810A associated with plan settings graphical entry 834A). Thus, in some embodiments, in response to receiving input(s) selecting selectable user interface element 840, process 750 may create test plan container objects AA-NN 816AA-816NN and, in turn, associate test plan container objects AA-NN 816AA-816NN with plan settings container object B 810B.

In some embodiments, when process 740 receives an input that causes process 750 to associate a respective test plan container object with a respective plan settings container object, process 750 may generate the respective test plan container object based on a current state of a plan model data object associated with the respective plan settings container object. For example, as described previously, input 828 in FIG. 8D may cause process 750 to create test plan container object A 816A and associate test plan container object A 816A with plan settings container object A 810A. Thus, in some embodiments, process 750 may create test plan container object A 816A based on a state of plan model data object A 814A (e.g. a state of parameters 818A-818E of plan model data object A 8184A) when input 828 in FIG. 8D is received.

Conversely, as described previously in FIG. 8F, before receiving input 842, method 700 may have received, via response distribution editable user interface element, an input for changing response distribution parameter 818A from "Lognormal" in FIG. 8D to "Weibull" in FIG. 8F. Furthermore, as described previously, input 842 may cause process 750 to create test plan container object B 816B and associate test plan container object B 816B with plan settings container object A 810A. Thus, in some embodiments, process 750 may create test plan container object A 816B based on a state of plan model data object A 814A when input 842 in FIG. 8F is received, including the current value of response distribution parameter 818A in plan model data object A 814A (e.g., "Weibull").

Furthermore, as described previously, an input selecting selectable option 840 in FIG. 8J may cause process 750 to create test plan container object AA 816AA and associate test plan container object AA 816AA with plan settings container object B 810B. Thus, in yet another non-limiting example, process 750 may create test plan container object AA 816AA based on a state of plan model data object B 8148 (e.g. a state of parameters 818G-818K of plan model data object B 814B) when such an input is received.

In some embodiments, a respective test plan container object may store one or more experimental run plans computed based on a state of an associated plan model data object (described above). For example, as shown in FIGS. 8C and 8I, test plan container object A 816A, test plan container object B 816B, test plan container object AA 816AA may include experimental run plans A-C 830A-380C, experimental run plans A-C 830AAA-830CCC, and experimental run plans A-C 830AA-830CC.

In some embodiments, an experimental run plan, as generally used herein, may refer to a set of experiment runs designed to evaluate the behavior of a system under specific factor conditions (e.g., experiment conditions). A respective experimental run plan may include test conditions of one or more experiment factors, such as temperature, voltage, or unit allocation, to observe the resulting effects on the system. These run plans may typically be generated based on a corresponding plan model data object at the time of creation and may define the parameters and conditions for the experiment. Different experimental run plans, such as those associated with test plan container object A 816A, with test plan container object B 816B, or with test plan container object AA 816AA, may correspond to distinct configurations of these experiment factors and may vary depending on user inputs or changes in the model parameters, as will be described in more detail in process 760.

Referring to FIG. 7, in some embodiments, method 700 may proceed from process 750 to process 760. As illustrated in FIG. 7, process 760 may instantiate, within the plan settings graphical entry corresponding to the first plan settings container object, a test plan explorer section that includes a first test plan graphical entry. The first test plan graphical entry, as also illustrated in FIG. 7, may display a graphical representation of the one or more experimental run plans generated for the model associated with the first plan settings container object. A test plan graphical entry, as generally used herein, may refer to an interactive user interface element that visually represents data stored within a respective test plan container object.

In some embodiments, the plan settings graphical entry where process 760 instantiates the test plan explorer section may correspond to plan settings graphical entry 822A in FIG. 8D. For instance, as shown in FIG. 8D, plan settings graphical entry 822A may not include a test plan explorer section before input 828 is received (e.g., because no design of experiment test plans have been created). However, as shown in FIG. 8E, after receiving input 828 in FIG. 8D, process 760 may instantiate test plan explorer section 832 within plan settings graphical entry 822A. Test plan explorer section 832, as generally used herein, may refer to a tab container or any other suitable user interface component that is capable of displaying one or more graphical entries associated with one or more design of experiment test plans.

In some embodiments, test plan explorer section 832 may include one or more test plan graphical entries. For example, as shown in FIG. 8E, test plan explorer section 832 of plan settings graphical entry 822A may include test plan graphical entry 834A (e.g., the first test plan graphical entry of process 760). Test plan graphical entry 834A, as generally used herein, may refer to a tab user interface component or any other suitable interface component that displays experimental run plans associated with a design of experiment test plan (e.g., the data stored within a test plan container object).

In some embodiments, test plan graphical entry 834A may display a graphical representation of one or more experimental run plans of a corresponding test plan container object. For instance, in the example of FIG. 8E, test plan graphical entry 834A may correspond to test plan container object A 816A in FIG. 8C. Thus, in some embodiments, test plan graphical entry 834A may include graphical representations 836A-836C of experiment run plans A-C 830A-830C illustrated in FIG. 8C, respectively. It shall be noted that graphical entries 836A-836C are not intended to be limiting and that, if test plan container object A 816A included additional, different, or fewer experiment run plans than illustrated in FIG. 8C, process 760 may instead display graphical entries corresponding to the additional, different, or fewer experiment run plans.

In some embodiments, a graphical representation of a respective experiment run plan may include a user interface element that displays one or more runs associated with the respective experiment run plan. For instance, as shown in FIG. 8E, the graphical representation 836A of experiment run plan A 830A may include a table user interface element that includes one or more experiment run rows corresponding to the one or more runs associated with experiment run plan A 830A. It shall be noted that if experiment run plan A 830A was associated with additional, fewer, or different experiment runs, the table user interface element of graphical representation 836A may respectively include additional, fewer, or different experiment run rows.

In some embodiments, a respective experiment run row may include values of one or more experiment factors and expected results from operating the experiment factors at such values (e.g., conditions). For example, as shown in FIG. 8E, the table user interface element may include an experiment run row that corresponds to a respective run of experiment run plan A 830A and that includes a test value for experiment factor 806A (e.g., "90.00") and a test value for experiment factor 806B (e.g., "90.00"). Additionally, as illustrated in FIG. 8E, the experiment run row may also include a unit allocation value that indicates a total number of units that should be tested using the test values of experiment factors 806A and 806B and an expected number of unit failures of the total number of allocated units. It shall be noted that the other experiment run rows displayed in graphical representations 836A-836C may display (e.g., include) information for their respective experiment run in analogous ways described above.

It shall also be noted that while process 760 describes an embodiment of a test plan explorer section that includes one test plan graphical entry, the test plan explorer section of process 760 is not limited to such configuration and may include one or more additional test plan graphical entries without departing from the scope of the disclosure. For example, as shown in FIG. 8G, test plan explorer section 832 may include test plan graphical entry 834A and test plan graphical entry 834B. As described above, test plan graphical entry 834A may correspond to test plan container object A 816A in FIG. 8C. Conversely, in some embodiments, test plan graphical entry 834B may correspond to test plan container object B 816B in FIG. 8C.

In some embodiments, process 760 may add a new test plan graphical entry when a new test plan container object is created in the computer memory 810 illustrated in FIG. 8B. For instance, if test plan container object B 816B is associated with plan settings container object A 810A for the reasons described in process 750, process 760 may add, to test plan explorer section 832, a test plan graphical entry 834B corresponding to test plan container object B 810B. Alternatively, in some embodiments, if the test plan container object 816B is not associated with plan settings container object A 810A for the reasons described in process 750, process 760 may forgo adding, to test plan explorer section 832, the test plan graphical entry 834B corresponding to test plan container object B 816B.

Furthermore, in some embodiments, as shown in FIGS. 8I and 8G, test plan graphical entry 834B may include graphical representations 836D-836F of experiment run plans A-C 830AA-830CC (e.g., the experiment run plans associated with test plan container object AA 816AA). Graphical representations 836D-836F may display content for reasons analogous to graphical representations 836A-836C in FIG. 8E, respectively.

In some embodiments, process 760 may receive a deletion input for removing a respective test plan graphical entry from test plan explorer section 832. For instance, as shown in FIG. 8G, process 760 may receive deletion input 844 via graphical user interface 802. Specifically, in the example of FIG. 8G, deletion input 844 may correspond to a request to delete test plan graphical entry 834B. In response to receiving deletion input 844, process 760 may cease display of test plan graphical entry 834B from test plan explorer section 832 and maintain display of test plan graphical entry 834A (e.g., revert to the state of the graphical user interface 802 illustrated in FIG. 8F). It shall be noted that a test plan graphical entry associated with a different plan setting graphical entry (e.g., a second plan settings graphical entry) may be deleted in similar ways described above.

Furthermore, in some embodiments, in response to receiving deletion input 844, process 760 may delete a corresponding test plan container object. For example, as described previously, test plan graphical entry 834B may correspond to test plan container object AA 816AA in FIG. 8B. Thus, in some embodiments, in response to receiving deletion input 844 for deleting test plan graphical entry 834B, process 730 may delete the corresponding test plan container object AA 816AA from computer memory 810.

In some embodiments, method 700 may generate a file that serializes the initial design of experiment plan and the initial design of experiment test plan described in processes 710-760. For example, as described previously, the initial design of experiment plan may be represented via plan settings container object A 810A and the initial design of experiment test plan may be represented via test plan container object A 816A. Thus, in some embodiments, the file generated by method 700 may serialize the data associated with plan settings container object A 810A and test plan container object A 816A. The term "serializing," as generally used herein, may refer to a process of converting data into a format that can be stored and later reconstructed by design of experiment platform 808 illustrated in FIG. 8B.

Figure 8L:
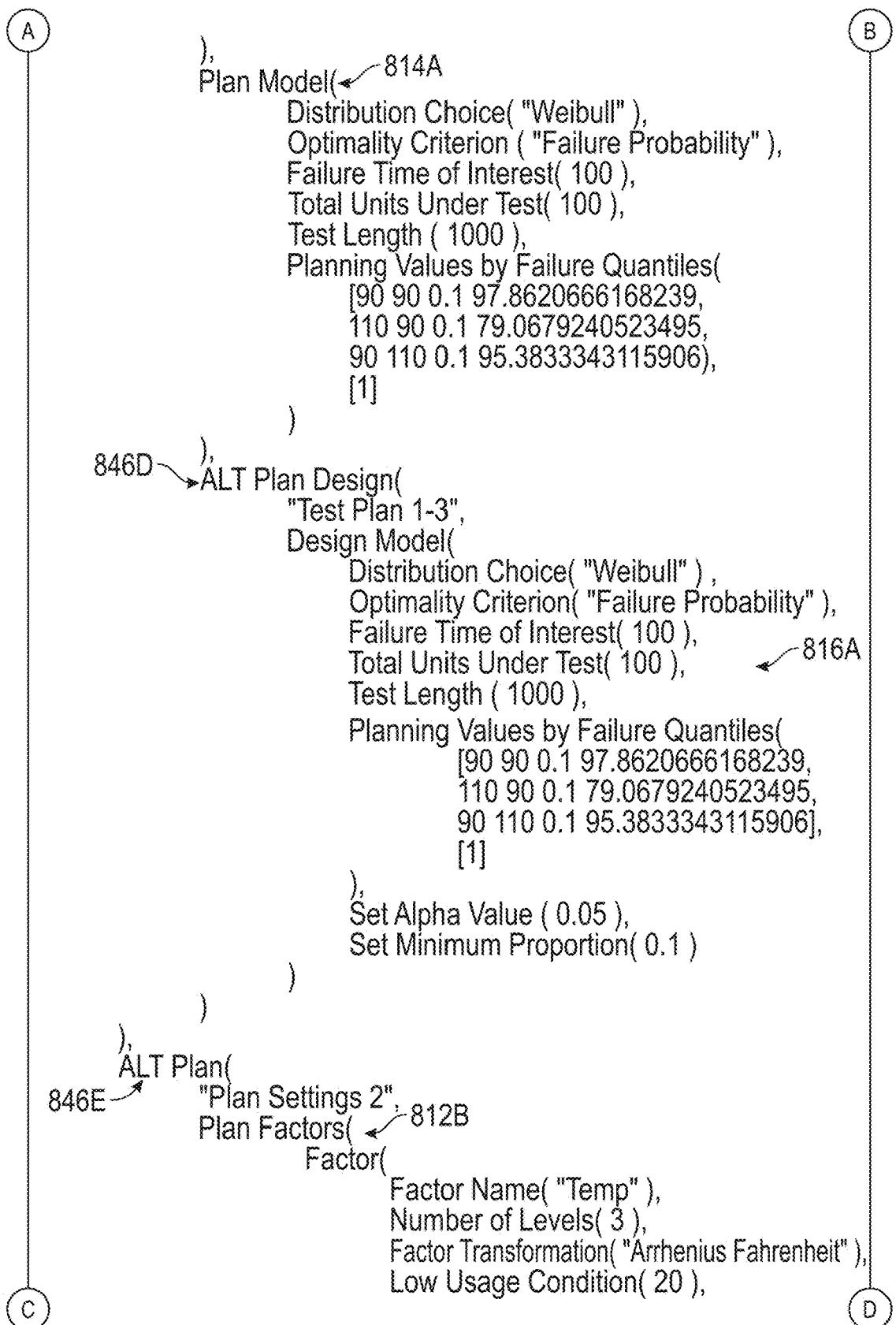
Figure 8L:
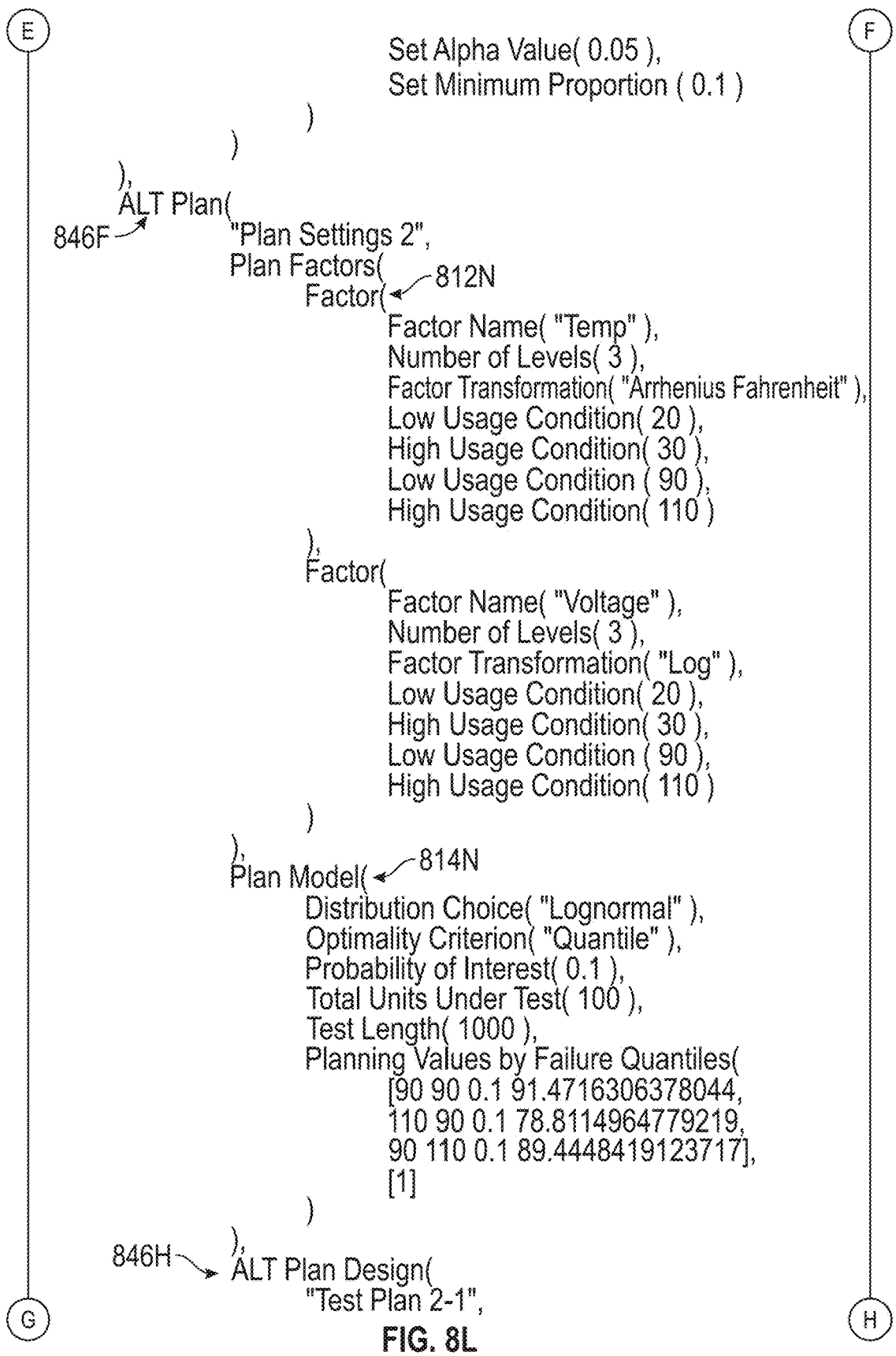
Figure 8L:
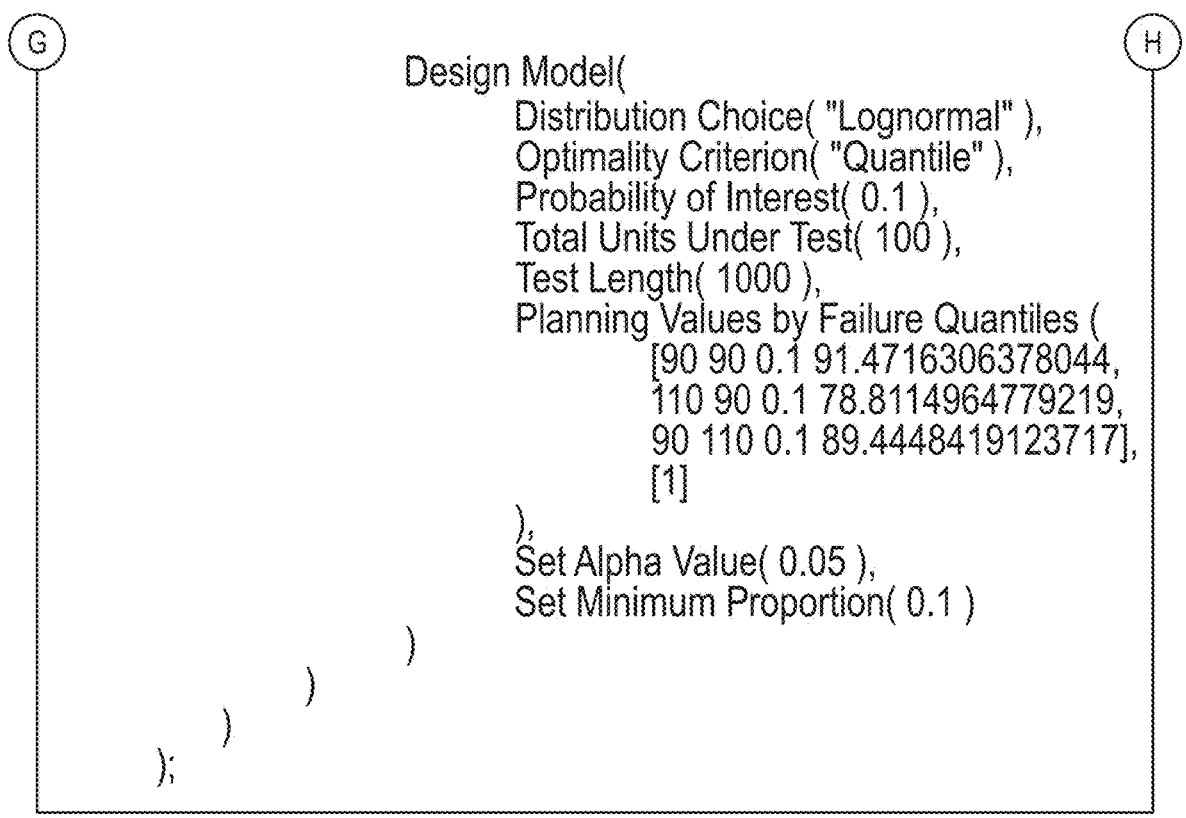

In some embodiments, the file generated by method 700 may correspond to file 846 illustrated in FIG. 8L. As shown in FIG. 8L, generating file 846 may include instantiating, in file 846, an experiment configuration entry 846A. Experiment configuration entry 846A, in some embodiments, may correspond to a root of the file and specify a type of design of experiment designed via method 700 (e.g., "Constant Stress ALT Design"). Additionally, in some embodiments, generating file 846 may include adding, to experiment configuration entry 846A, a factors configuration entry 846B that serializes one or more experiment factors. Specifically, as shown in FIG. 8L, factors configuration entry 846B may serialize experiment factors 806A-806B illustrated in FIG. 8A (e.g., serialize the experimental settings of experiment factors 806A-806B).

Additionally, in some embodiments, generating file 846 may include adding, to experiment configuration entry 846A, a plan settings entry that serializes the first plan settings container object, including the plan factors data object and the plan model data object associated with the first plan settings container object. For instance, as described previously, the first plan settings container object of method 700 may correspond to plan settings container object A 810A. Thus, in some embodiments, as shown in FIG. 8L, file 846 may include a plan settings entry 846C that serializes plan settings container object A 810A, including plan factors data object A 812A and plan model data object A 814A. It shall be noted that, in some embodiments, the factors configuration entry 846B and the plan settings entry 846C may be child elements of the experiment configuration entry 846A and may be stored at a same level in file 846. Additionally, it shall also be noted that, in some embodiments, an entry corresponding to the plan factors data object A 812A and an entry corresponding to the plan model data object A 814A may be child elements of plan settings entry 846C.

Furthermore, in some embodiments, generating file 846 may include adding, to plan settings entry 846C, a test design entry that serializes the first test plan container object of method 700. For instance, as described previously, the first test plan container object may correspond to test plan container object A 816A. Thus, as shown in FIG. 8L, the test plan settings entry 846C may include test design entry 846D that serializes test plan container object A 816A. It shall be noted that, in some embodiments, test design entry 846D may be a child element of plan settings entry 846C and may be stored at a same level as the entry corresponding to plan factors data object 812A and the entry corresponding to plan model data object 814A.

It shall be noted that file 846 is not intended to be limiting and that file 846 may include one or more additional plan setting entries without departing from the scope of the disclosure. For example, as shown in FIG. 8L, file 846 may additionally include an plan setting entry 846E that serializes plan settings container object B 810B and plan setting entry 846F that serializes plan settings container object N 810N.

Plan setting entries 846E and 846F, in some embodiments, may include content for similar reasons as plan setting entry 846C. For example, as shown in FIG. 8L, plan setting entry 846E may include an entry that serializes plan factors data object B 812B and an entry that serializes plan model data object B 814B in similar ways as described with respect the entries corresponding to plan factors data object 812A and plan model data object A 814A, respectively. Additionally, as shown in FIG. 8L, plan settings entry 846F may include a test design entry 846G that serializes test plan container object AA 816AA in similar ways as test design entry 846D.

Conversely, as shown in FIG. 8L, plan setting entry 846F may include an entry that serializes plan factors data object B 812N and an entry that serializes plan model data object B 814N in similar ways as described with respect the entries corresponding to plan factors data object 812A and plan model data object A 814A, respectively. Additionally, as shown in FIG. 8L, plan settings entry 846F may include a test design entry 846H that serializes test plan container object AA 816AA in similar ways as test design entry 846D.

In some embodiments, method 700 may receive a file via an upload user interface. For example, method 700 may receive file 846 generated in FIG. 8L. Based on receiving file 846, method 700 may re-perform one or more of processes 710-760. Re-performing process 710 may include re-creating one or more experiment factors specified in file 846 (e.g., experiment factors 806A and 806B). Re-performing process 720 may include re-generating the first plan settings container object (e.g., plan settings container object A 810A). Re-performing process 730 may include re-instantiating the plan explorer section (e.g., plan explorer section 820) to include the plan settings graphical entry (e.g., plan settings graphical entry 822A). Re-performing process 750 may include re-associating the first plan settings container object with the first test plan container object (e.g., test plan container object A 816A). Lastly, re-performing process 760 may include re-instantiating the test plan explorer section (e.g., test plan explorer section 832) to include the first test plan graphical entry (e.g., test plan graphical entry 834A).

It shall be noted that, in the method(s) described herein where one or more steps (e.g., processes) are contingent upon one or more conditions having been met, it should be understood that the described method can be repeated in multiple repetitions so that over the course of the repetitions all of the conditions upon which steps in the method are contingent have been met in different repetitions of the method. For example, if a method requires performing a first step if a condition is satisfied, and a second step if the condition is not satisfied, then a person of ordinary skill would appreciate that the claimed steps are repeated until the condition has been both satisfied and not satisfied, in no particular order. Thus, a method described with one or more steps that are contingent upon one or more conditions having been met could be rewritten as a method that is repeated until each of the conditions described in the method has been met. This, however, is not required of system or computer readable medium claims where the system or computer readable medium contains instructions for performing the contingent operations based on the satisfaction of the corresponding one or more conditions and thus is capable of determining whether the contingency has or has not been satisfied without explicitly repeating steps of a method until all of the conditions upon which steps in the method are contingent have been met. A person having ordinary skill in the art would also understand that, similar to a method with contingent steps, a system or computer readable storage medium can repeat the steps of a method as many times as are needed to ensure that all of the contingent steps have been performed.

It shall be appreciated that other embodiments contemplated within the scope of the present disclosure may involve more processes, fewer processes, different processes, or a different order of processes than illustrated in FIG. 9. It should be noted that a computer-program product may include a non-transitory machine-readable storage medium storing computer instructions that, when executed by one or more operations, may perform operations corresponding to the processes and sub-processes of method 700. Additionally, or alternatively, a computer-implemented method may include operations corresponding to processes and sub-processes of 700. Additionally, or alternatively, a computer-implemented system may include one or more processors, a memory, and a computer-readable medium operably coupled to the one or more processors, the computer-readable medium having computer-readable instructions stored thereon that, when executed by the one or more processors, cause a computing device to perform operations corresponding to the processes and sub-processes of method 700.

FIG. 9 illustrates one embodiment of method 900 for creating and displaying experimental designs. It shall be appreciated that other embodiments contemplated within the scope of the present disclosure may involve more processes, fewer processes, different processes, or a different order of processes than illustrated in FIG. 9. It should be noted that a computer-program product may include a non-transitory machine-readable storage medium storing computer instructions that, when executed by one or more operations, may perform operations corresponding to the processes and sub-processes of method 900. Additionally, or alternatively, a computer-implemented method may include operations corresponding to processes and sub-processes of 900. Additionally, or alternatively, a computer-implemented system may include one or more processors, a memory, and a computer-readable medium operably coupled to the one or more processors, the computer-readable medium having computer-readable instructions stored thereon that, when executed by the one or more processors, cause a computing device to perform operations corresponding to the processes and sub-processes of method 900.

It should be noted that elements of method 900 may related to one or more other elements described herein. For instance, interactive failure probability table 1004 and interactive failure probability graph 1014 may be examples of elements included within a graphical representation 826A and/or 826B as described herein (e.g., with reference to FIGS. 8D and 8G).

As will be described in more detail herein, method 900 offers technical advantages over alternative techniques. For instance, method 900 enhances the management and visualization of failure probability data through a real-time interactive user interface. Interactions with the user interface (e.g., via dragging of markers and/or editing of relevant fields) result in corresponding changes to the user interface that enable users to dynamically explore failure scenarios without needing to manually recalculate or switch between different data views. Such an interactive interface increases ease with which users model and adjust parameters associated with the user interface.

As shown in FIG. 9, process 910 of method 900 may display, via a user interface, an interactive failure probability table including a set of editable failure setting rows. In some such examples, a respective editable failure setting row of the set of editable failure settings rows may at least include an editable probability of failure field and an editable failure time field.

In a non-limiting example, GUI view 1002 of FIGS. 10A through 10F may depict an interactive failure probability table 1004. The interactive failure probability table 1004 may include a set of editable failure setting rows. For instance, the interactive failure probability table 1004 may include editable failure setting row 1004A (i.e., Setting 1), editable failure setting row 1004B (i.e., Setting 2), editable failure setting row 1004C (i.e., Setting 3), and editable failure setting row 1004D (i.e., Setting 4). Each editable failure setting row may include a respective editable probability of failure field and an editable failure time field. For instance, editable failure setting row 1004A may include editable probability of failure field 1010A (e.g., a field indicating 0.2624) and editable failure time field 1012A (e.g., a field indicating 91.4030); editable failure setting row 1004B may include editable probability of failure field 1010B (e.g., a field indicating 0.5432) and editable failure time field 1012B (e.g., a field indicating 25.8881); editable failure setting row 1004C may include editable probability of failure field 1010C (e.g., a field indicating 0.3164) and editable failure time field 1012C (e.g., a field indicating 67.9837); and editable failure setting row 1004D may include editable probability of failure field 1010D (e.g., a field indicating 0.3596) and editable failure time field 1012D (e.g., a field indicating 45.1572).

In some examples, the respective editable failure setting row may include one or more editable factor fields for setting a value of one or more failure acceleration factors. In such examples, the current value of the editable probability field may specify a probability of a failure, the current value of the editable failure time field may specify a time of the failure, and the value of the one or more failure acceleration factors may specify when the one or more failure acceleration factors are associated with the time of the failure and the probability of the failure.

In a non-limiting example, FIGS. 10A through 10F may depict editable failure setting rows that include one or more editable factor fields for setting a value of one or more failure acceleration factors. For instance, interactive failure probability table 1004 includes a first set of editable factors fields (i.e., editable factor fields 1005A-1005D), a second set of editable factor fields (i.e., editable factor fields 1006A-1006D), and a third set of editable factor fields (i.e., editable factor fields 1008A-1008D). Editable failure setting row 1004A may include editable factor field 1005A (e.g., with a value of 90.0000), editable factor field 1006A (e.g., with a value of 90.0000), and editable factor field 1008A (e.g., with a value of 90.0000); editable failure setting row 1004B may include editable factor field 1005B (e.g., with a value of 110.0000), editable factor field 1006B (e.g., with a value of 90.0000), and editable factor field 1008B (e.g., with a value of 90.0000); editable failure setting row 1004C may include editable factor field 1005C (e.g., with a value of 90.0000), editable factor field 1006C (e.g., with a value of 110.0000), and editable factor field 1008C (e.g., with a value of 90.0000); and editable failure setting row 1004D may include editable factor field 1005D (e.g., with a value of 90.0000), editable factor field 1006D (e.g., with a value of 90.0000), and editable factor field 1008D (e.g., with a value of 110.0000).

As shown in FIG. 9, process 920 of method 900 may display, concurrently with the interactive failure probability table, an interactive failure probability graph that includes a set of response distribution curves generated for the set of editable failure setting rows. A respective response distribution curve of the set of response distribution curves may include a draggable marker positioned at a point on the respective response distribution curve that corresponds to a current value of the editable probability of failure field and the editable failure time field. In some examples, the set of response distribution curves may include the respective response distribution curve that corresponds to the respective editable failure setting row and a second respective response distribution curve that corresponds to a second respective editable failure setting row of the set of editable failure setting rows. The respective response distribution curve may be displayed in the interactive failure probability graph with a first color and the second respective response distribution curve may be displayed in the interactive failure probability graph with a second color different from the first color.

In a non-limiting example, FIGS. 10A through 10F may depict an interactive failure probability graph 1014. The interactive failure probability graph 1014 may include a set of response distribution curves generated for the set of editable failure setting rows. For instance, interactive failure probability graph 1014 may include response distribution curves 1014A, 1014B, 1014C, and 1014D. Response distribution curve 1014A may be generated for editable failure setting row 1004B, response distribution curve 1014B may be generated for editable failure setting row 1004D, response distribution curve 1014C may be generated for editable failure setting row 1004C, and response distribution curve 1014D may be generated for editable failure setting row 1004A. Each response distribution curve may have a respective color (e.g., response distribution curve 1014A may have a first color and response distribution curve 1014B may have a second, distinct color).

Each response distribution curve may have a point that maps to a value of the editable probability of failure field and the editable failure time field of the respective editable failure setting row. For instance, response distribution curve 1014A may have a marker 1016A that indicates a point mapping to the value of the editable probability of failure field 1010B and the editable failure time field 1012B (e.g., a point (25.5917, 0.3812)). Likewise, response distribution curve 1014B may have a marker 1016B that indicates a point mapping to the value of the editable probability of failure field 1010D and the editable failure time field 1012D; response distribution curve 1014C may have a marker

1016C that indicates a point mapping to the value of the editable probability of failure field 1010C and the editable failure time field 1012C; and response distribution curve 1014D may have a marker 1016D that indicates a point mapping to the value of the editable probability of failure field 1014A and the editable failure time field 1012A.

Additionally, each response distribution curve may illustrate a relationship between a probability of failure and a time that corresponds to the editable factors for a respective editable failure setting row. For instance, response distribution curve 1014A may represent an extrapolation, from the point indicated by marker 1016A, of a relationship between a probability of failure and a failure time assuming the current values for editable factor fields 1005B, 1006B, and 1008B. Likewise, response distribution curve 1014B may represent an extrapolation, from point indicated by marker 1016B, of a relationship between a probability of failure and a failure time assuming the current values for editable factor fields 1005D, 1006D, and 1008D; response distribution curve 1014C may represent an extrapolation, from point indicating by marker 1016C, of a relationship between a probability of failure and a failure time assuming the current values for editable factor fields 1005C, 1006C, and 1008C; and response distribution curve 1014D may represent an extrapolation, from point indicated by marker 1016D, of a relationship between a probability of failure and a failure time assuming the current values for editable factor fields 1005A, 1006A, and 1008A.

Figure 10A:
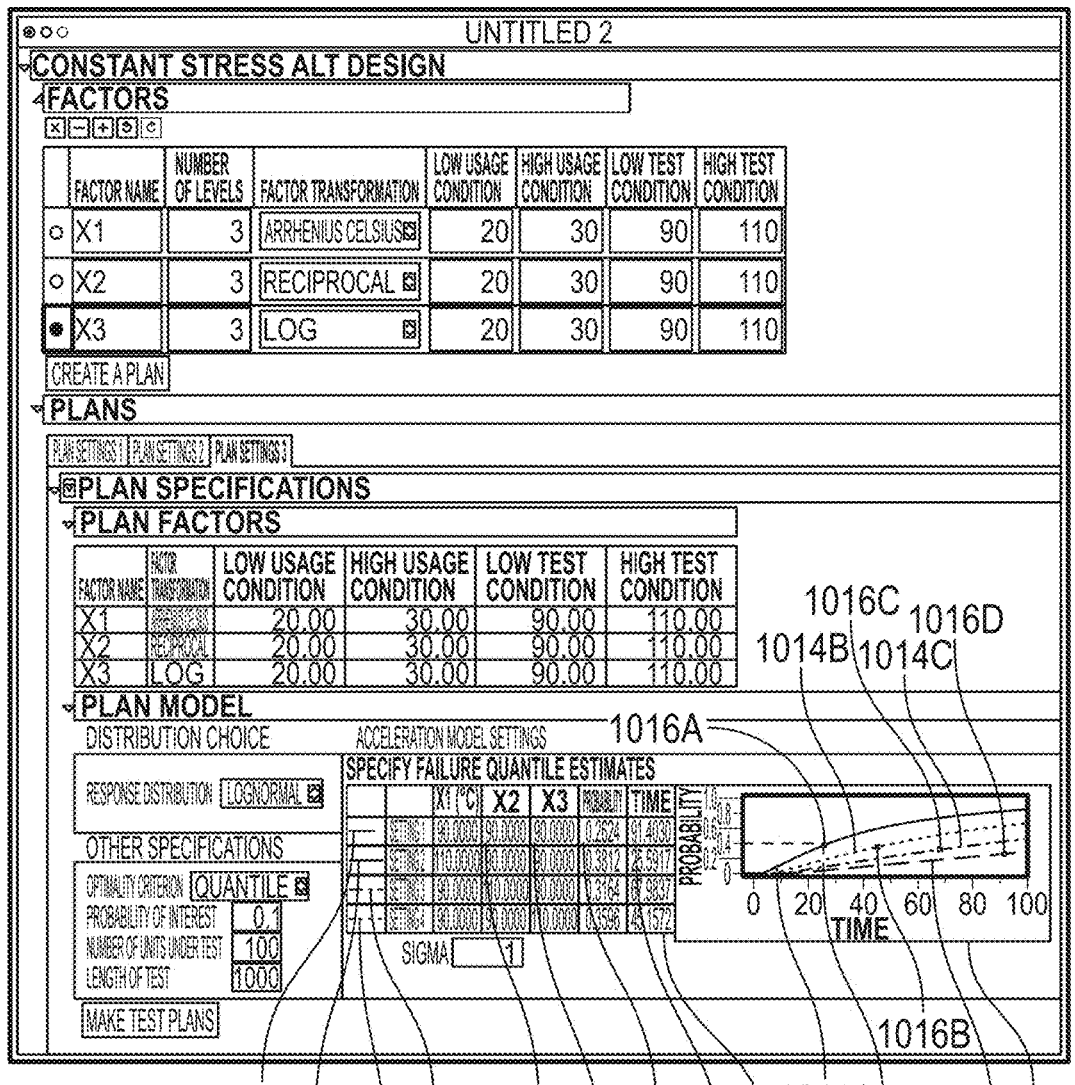
Figure 10B:
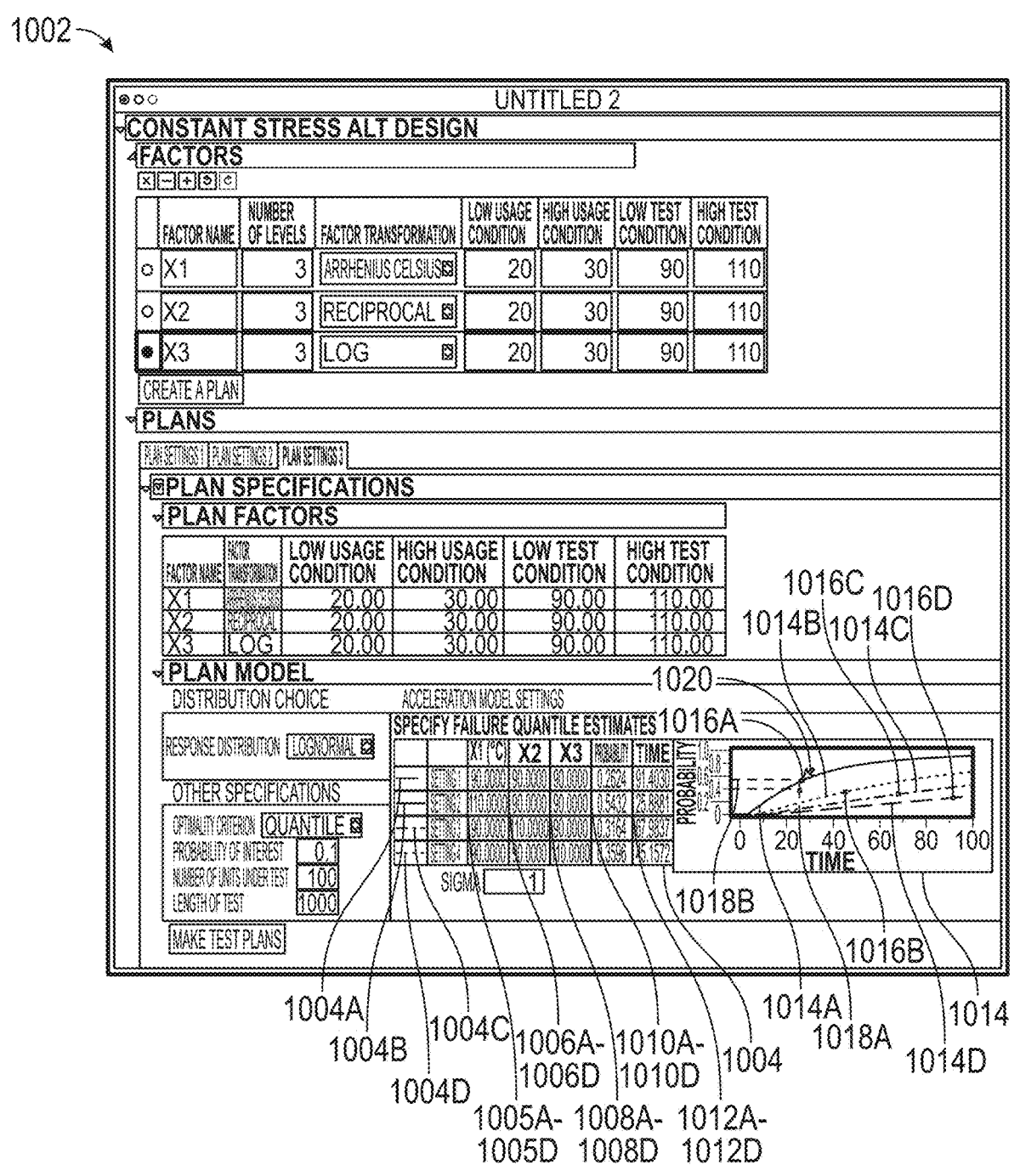

As shown in FIG. 9, process 930 of method 900 may detect, via the user interface, an input moving the draggable marker from the point on the respective response distribution curve to a new point on the interactive failure probability graph that corresponds to a new probability of failure value and a new failure time value. In a non-limiting example, markers 1016A, 1016B, 1016C, and 1016D of FIGS. 10A through 10F may be draggable markers. As depicted in FIG. 10A, marker 1016A of response distribution curve 1014A may initially be located at point 1018A corresponding to an initial value for editable probability of failure field 1010B and editable failure time field 1012B (e.g., point 1018A may have the value (25.5917, 0.3812)). However, an input may be provided (e.g., via a user) that drags the marker from point 1018A to point 1018B, as depicted in FIG. 10B, where point 1018B may correspond to a new probability of failure value (e.g., 0.5432) and a new failure time value (e.g., 25.8881). Similar techniques may be performed for markers 1016B, 1016C, and 1016D without deviating from the scope of the disclosure.

As shown in FIG. 9, process 940 of method 900 may dynamically update (e.g., compute, recompute) the editable probability of failure field to the new probability of failure value and the editable failure time field to the new failure time value in response to detecting the input moving the draggable marker. In a non-limiting example, upon marker 1016A being dragged from point 1018A to point 1018B, editable probability of failure field 1010B may be updated to have the new probability of failure value (e.g., 0.5432) and editable failure time field 1012B may be updated to have the new failure time value (e.g., 25.8881).

In some examples, the process 930 may detect that the draggable marker is located at the new point on the interactive failure probability graph. In such examples, in response to detecting that the draggable marker is located at the new point on the interactive failure probability graph, process 930 may dynamically update (e.g., compute, recompute) the respective response distribution curve to recompute (e.g., fit) the new point on the interactive failure probability graph. After dynamically updating the respective response distribution curve to recompute (e.g., fit) the new point on the interactive failure probability graph, the respective response distribution curve includes the new point, and the respective response distribution curve does not include the point initially included on the respective response distribution curve before the input was detected.

In a non-limiting example, a response distribution curve of the interactive failure probability graph 1014 may be updated in response to a marker being dragged to a new point. For instance, when marker 1016A is dragged from point 1018A to point 1018B, as depicted in FIG. 10B, response distribution curve 1014A may be updated to account for (e.g., include) the point 1018B. In some examples, response distribution curve 1014A, upon being updated to account for (e.g., include) the point 1018B, the response distribution curve 1014A may no longer include point 1018A.

In some examples, process 930 of method 900 may detect that the input moves the draggable marker across one or more intermediate points locate between the point on the respective response distribution curve and the new point on the interactive failure probability graph. In such examples, process 940 may dynamically update (e.g., compute, recompute) the editable probability of failure field and the editable failure time field as the draggable marker moves across the one or more intermediate points. Additionally, or alternatively, process 940 may update respective response distribute curve to recompute (e.g., fit) the one or more intermediate points as the input is moving the draggable marker to the new point. Processes 930 and 940 may perform the respective detecting and dynamic updating while process 930 detects the input moving the draggable marker from the point on the respective response distribution curve to the new point. The dynamically updating of the editable probability of failure field and the editable failure time field as the draggable marker moves across the one or more intermediate points may occur in real-time or near real-time.

Figure 10C:
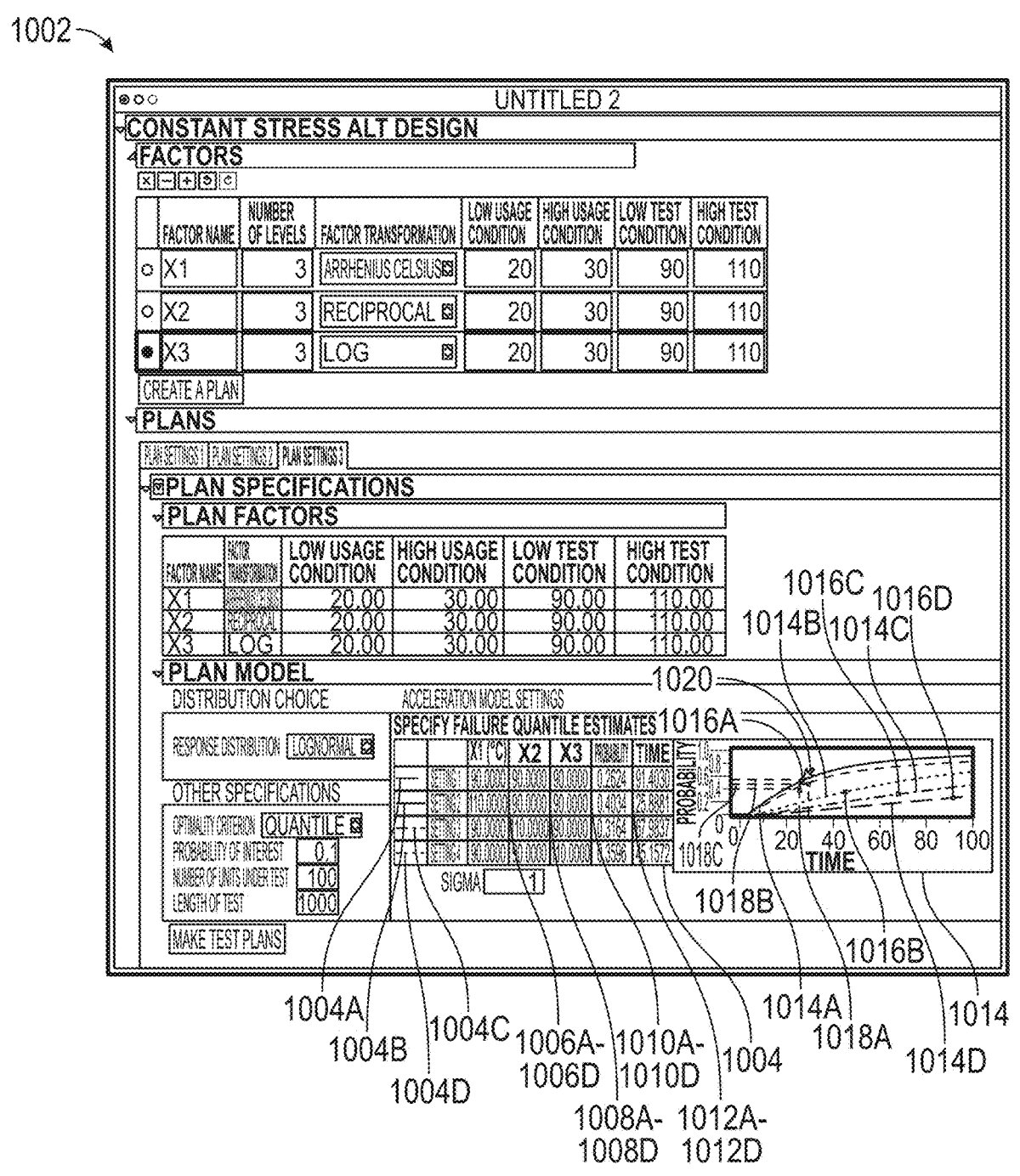

In a non-limiting example, while marker 1016A is being dragged from point 1018A to point 1018B (e.g., via a mouse 1020), as depicted in FIG. 10B, the marker 1016A may move across one or more intermediate points. For instance, the marker 1016A may move across point 1018C, as depicted in FIG. 10C, before it arrives at point 1018B. Point 1018C may be considered an intermediate point due to marker 1016A not being released while going through 1018C (e.g., whereas the marker 1016A may be released upon arriving at 1018B). When marker 1016A arrives at point 1018C, an intermediate probability of failure value (e.g., 0.4034) and an intermediate failure time value (e.g., 25.7124). may be computed corresponding to point 1018C. The editable probability of failure field 1010B may be updated with the intermediate probability of failure value and the editable failure time field 1012B may be updated with the intermediate failure time value. Additionally, the response distribution curve 1014A may be dynamically updated to account for (e.g., include) the point 1018C. The editable probability of failure field 1010B and editable failure time field 1012B may be updated for a subset of the intermediate points that marker 1016A visits between points 1018A and 1018B (e.g., including point 1018C).

In some examples, process 930 may detect, via the user interface, an input for changing the current value of the editable probability of failure field and the editable failure time field to a different value. In such examples, process 940 may dynamically update (e.g., compute, recompute) the respective response distribution curve in response to detecting the input for changing the editable probability of failure field and the editable failure time field to the different value. In such examples, dynamically updating the respective response distribution curve may include process 940 moving, in the interactive failure probability graph, the draggable marker associated with the respective response distribution curve to a point on the interactive failure probability graph that corresponds to the different value of the editable probability of failure field and the editable failure time field. Additionally, dynamically updating the respective response distribution curve may include recomputing (e.g., re-fitting) the respective response distribution curve to include the point on the interactive failure probability graph that corresponds to the different value of the editable probability of failure field and the editable failure time field.

Figure 10D:
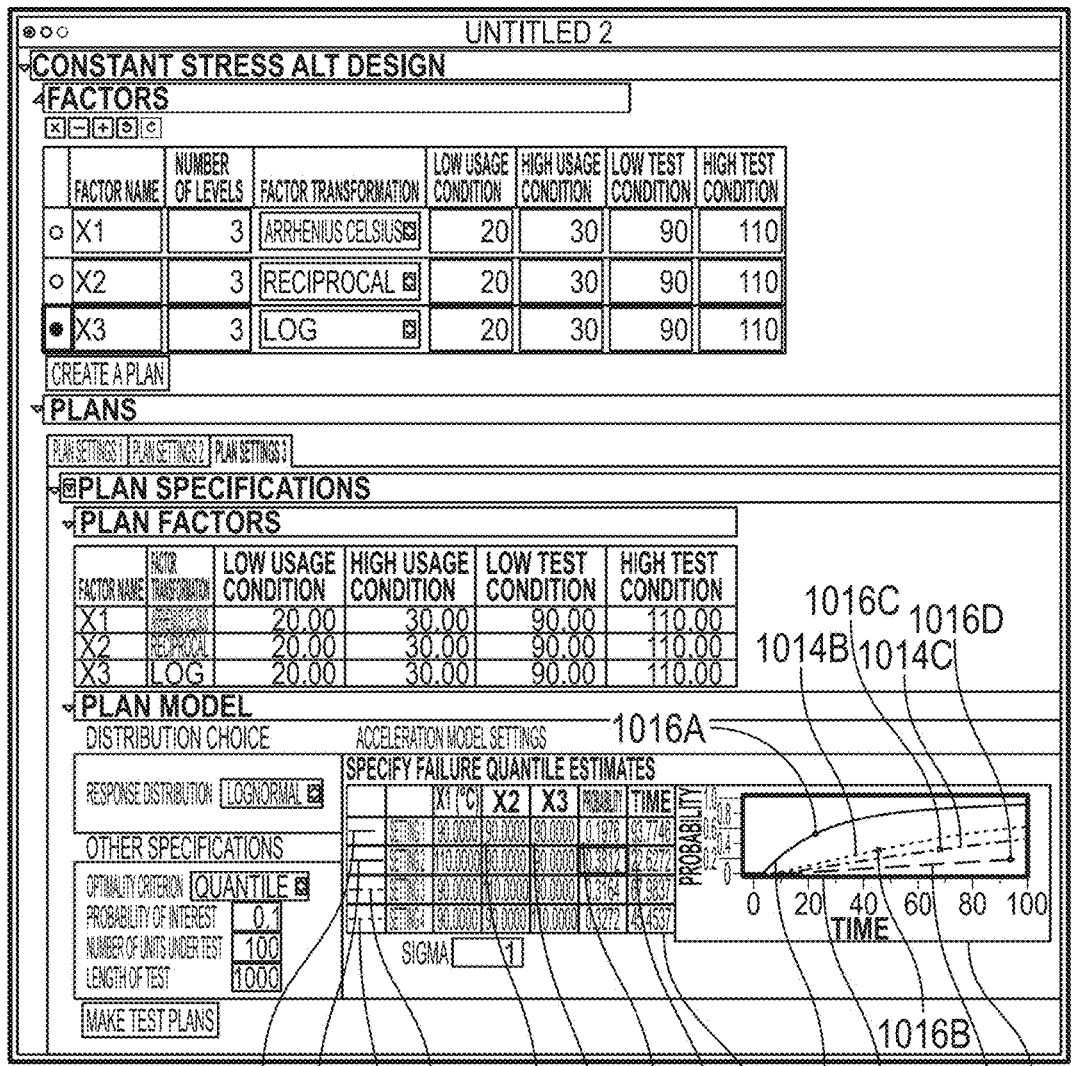
Figure 10E:
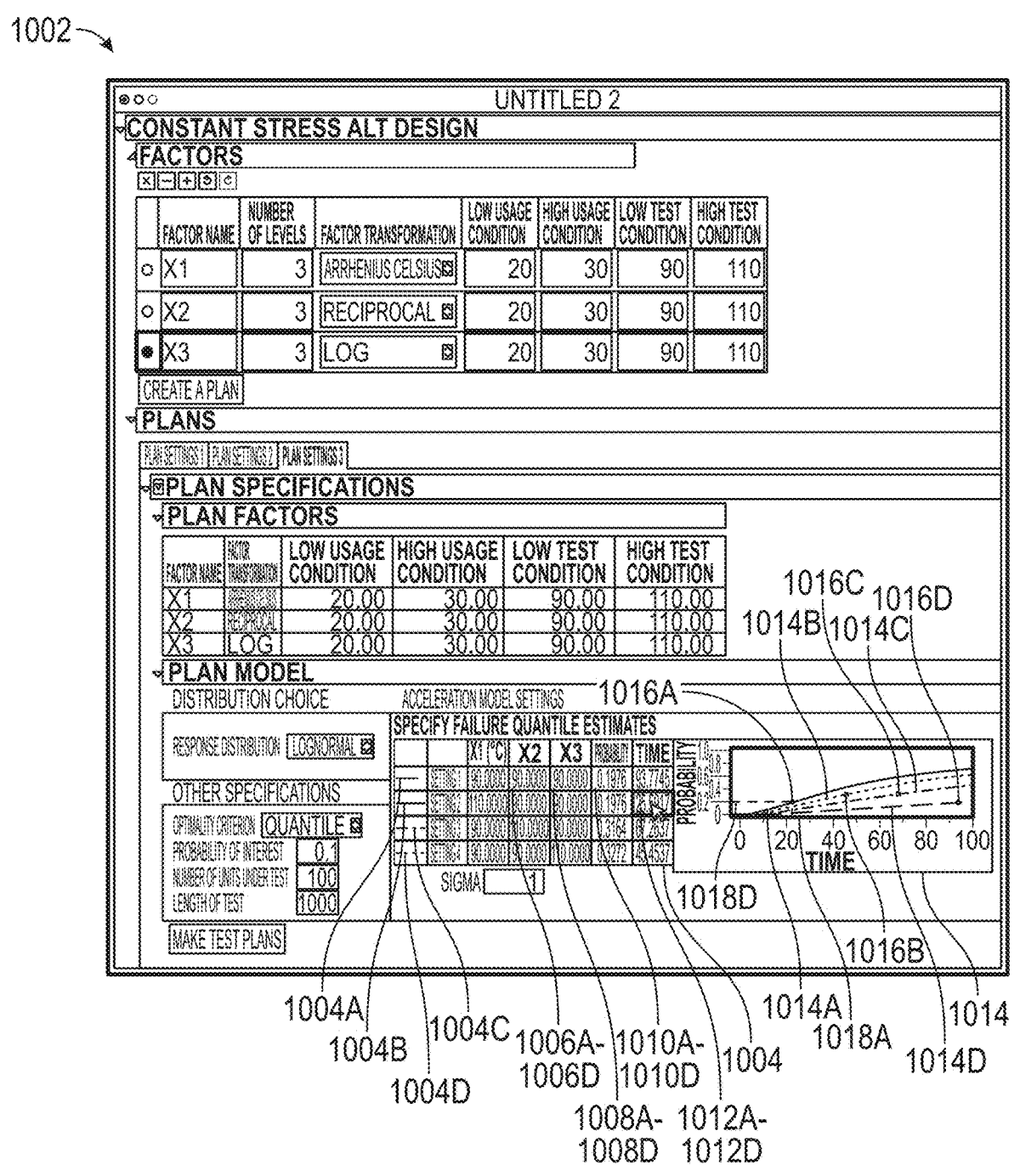

In a non-limiting example, as illustrated in FIGS. 10D and 10E, marker 1016A may be moved from point 1018B to point 1018D based on an input for changing the value of editable probability of failure field 1010B. For instance, a user may select the editable probability of failure field 1010B (e.g., via mouse 1020) and an input may be provided to the editable probability of failure field 1010B that changes the value (e.g., from 0.5432 to 0.1976). Additionally, the response distribution curve 1014A may be dynamically updated (e.g., computed, recomputed) to account for (e.g., include) the point 1018D. Likewise, marker 1016A may be moved from point 1018D to another point based on an input for changing the value of editable failure time field 1012B. For instance, a user may select the editable failure time field 1012B and an input may be provided to the editable time field 1012B that changes the value (e.g., from 22.6272 to another value, such as 93.7746 in FIG. 10F). Additionally, the response distribution curve 1014A may be dynamically updated (e.g., computed, recomputed) to account for (e.g., include) the new point.

Figure 10F:
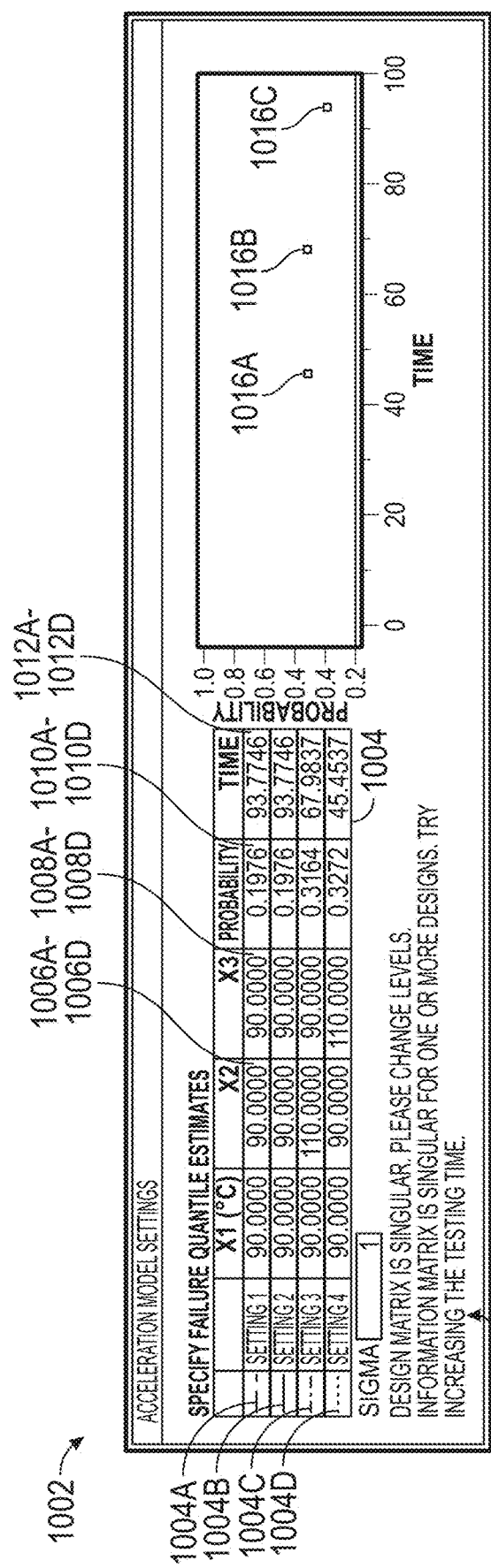

FIG. 10F may depict an example in which no response distribution curves are displayed on interactive failure probability graph 1014 due to a user error. For instance, as depicted in FIG. 10F, editable factor field 1005B may be updated to have a new value (e.g., via selection by a user and a corresponding input) as compared to FIG. 10E (e.g., may be changed from 110.0000 to 90.0000). Accordingly, the factor fields of editable failure setting row 1004A (e.g., editable factor fields 1005A, 1006A, and 1008A) may have the same value as the factor fields of editable failure setting row 1004B (e.g., editable factor fields 1005B, 1006B, and 1008B). By these factor fields having the same value (and/or by the values of the probability of failure field and failure time field being the same), a corresponding design matrix associated with the factor fields may be singular or rank-deficient. An error message 1022 may be displayed to indicate to a user of the error and/or to provide instruction on how to rectify the error.

FIG. 11 illustrates an example process flow for comparing a plurality of models via computer-implemented method 1100. It shall be appreciated that other embodiments contemplated within the scope of the present disclosure may involve more processes, fewer processes, different processes, or a different order of processes than illustrated in FIG. 11.

One of ordinary skill in the art will appreciate that method 1100 may provide many technical advantages and practical applications over conventional model management methods. In conventional statistical model management, users often need to fit numerous models, evaluate their performance, and decide which ones to retain or discard. As the number of models increases, along with the complexity of the comparisons, the process becomes increasingly cumbersome. The decision-making process regarding which models to retain can become increasingly complex, and certain beneficial functionalities that would make this process more efficient and user-friendly are necessary to handle these complexities effectively.

Conventional platforms generally lack flexibility to allow users to add or remove models at arbitrary times. Additionally, these platforms often do not support undoing or redoing previous actions, thus preventing users from efficiently correcting mistakes or exploring different models without significant backtracking. These limitations constrain the model management process and make it difficult for users to interactively explore and compare multiple models.

Method 1100 addresses these limitations by introducing a more flexible and interactive model management approach. Specifically, method 1100 allows users to add or remove models at any point. Additionally, method 1100 enables users to correct mistakes by undoing previous actions, as well as the ability to redo actions that were undone. This undo/redo functionality ensures that users can explore different modeling approaches without being locked into earlier decisions or forced to start over if they change their minds.

As illustrated in FIG. 11, process 1110 of method 1100 may receive one or more inputs that correspond to a request to compare a plurality of models. In some embodiments, the one or more inputs of process 1110 may include input 1204 illustrated in FIG. 12A (e.g., an input selecting selectable option 1202G). Additionally, or alternatively, in some embodiments, the one or more inputs of process 1110 may include an input for selecting one or more of the other selectable options 1202A-1202F illustrated in FIG. 12A. It shall be noted that a model, as generally used herein, may refer to a mathematical, statistical, or predictive model used for analyzing data, making predictions, or performing simulations (e.g., fatigue life models).

Figure 12A:
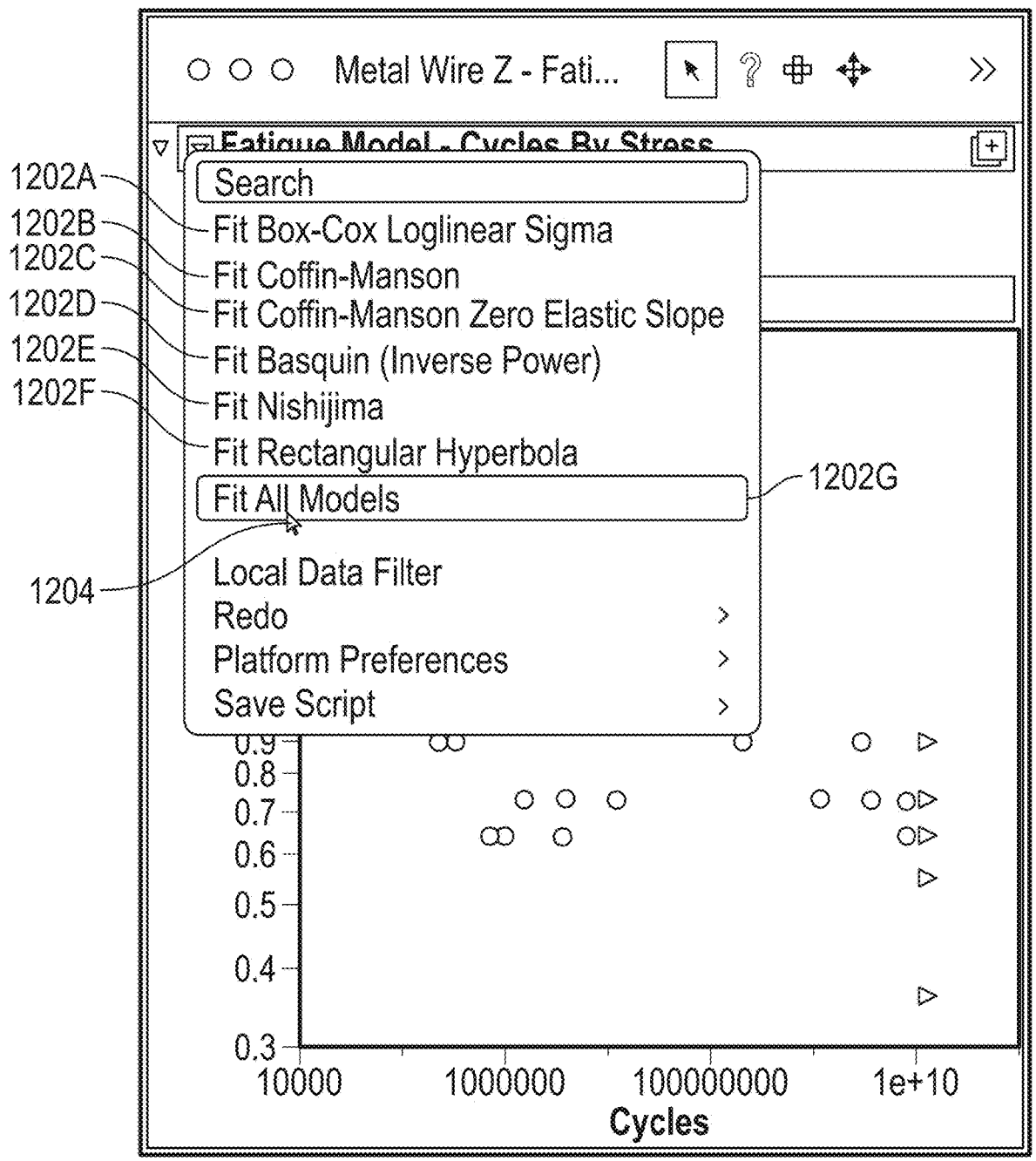
FIGS. 12A-12H illustrate exemplary ways for comparing a plurality of models, according to at least one embodiment of the present technology.

In some embodiments, an input selecting one of the selectable options 1202A-1202F may correspond to a request to compare one or more models of a specific type, such as one or more Box-Cox Loglinear Sigma models, one or more Coffin-Manson models, one or more Coffin-Manson Zero Elastic Slope models, one or more Basquin (Inverse Power) models, one or more Nishijima models, one or more Rectangular Hyperbola models, respectively. Conversely, in some embodiments, an input selecting selectable option 1202G may correspond to a request to compare a plurality of models associated with selectable options 1202A-1202F (e.g., all models associated with selectable options 1202A-1202F). It shall be noted that selectable options 1202A-1202F illustrated in FIG. 12A are not intended to be limiting and that process 1110 may receive inputs for comparing other types of models beyond those illustrated by selectable options 1202A-1202F without departing from the scope of the disclosure.

Additionally, in some embodiments, process 1110 may detect one or more inputs that specify one or more model distributions to compare for a selected model (e.g., a selected model type). For instance, after receiving, via selectable option 1202A in FIG. 12A, an input that requests a comparison of one or more Box-Cox Loglinear Sigma models, process 1110 may receive further input(s) that specify one or more distributions to use for comparing such models, such as a Lognormal distribution, a Frechet distribution, a Weibull distribution, a Gaussian distribution, and/or or the like. Thus, in some embodiments, an input selecting selectable option 1202G may correspond to a request to compare "all" (e.g., fatigue life) models associated with selectable options 1202A-1202G using "all" available distributions associated with such models.

It shall be noted that, in some embodiments, method 1100 may perform fitting of the selected models in response to receiving input(s) specifying model types and corresponding distributions. Specifically, in some embodiments, when method 1100 detects one or more inputs selecting one or more model types, method 1100 may interact with a model fitting platform (e.g., a fatigue model platform), to fit the selected models using one or more of the aforementioned distributions.

Referring to FIG. 11, in some embodiments, process 1120 of method 1100 may display a model comparison user interface in response to receiving the request to compare the plurality of models. For instance, as described previously in FIG. 12A, process 1110 may receive, via selectable option 1202G, an input 1204 that corresponds to a request to compare the models (e.g., all models) associated with selectable options 1202A-1202G. Accordingly, in response to receiving input 1204, process 1120 may display a model comparison user interface for comparing such models (as will be described with reference to FIG. 12B).

Alternatively, in a second non-limiting example, if process 1110 instead detected, via selectable option 1202A of FIG. 12A, an input corresponding to a request to compare one or more Box-Cox Loglinear Sigma models, process 1120, in turn, may display (or update) a model comparison user interface for comparing the one or more Box-Cox Loglinear Sigma models. It shall be noted that process 1120 may perform analogous behavior for the other selectable options 1202B-1202F illustrated in FIG. 12A.

Figure 12B:
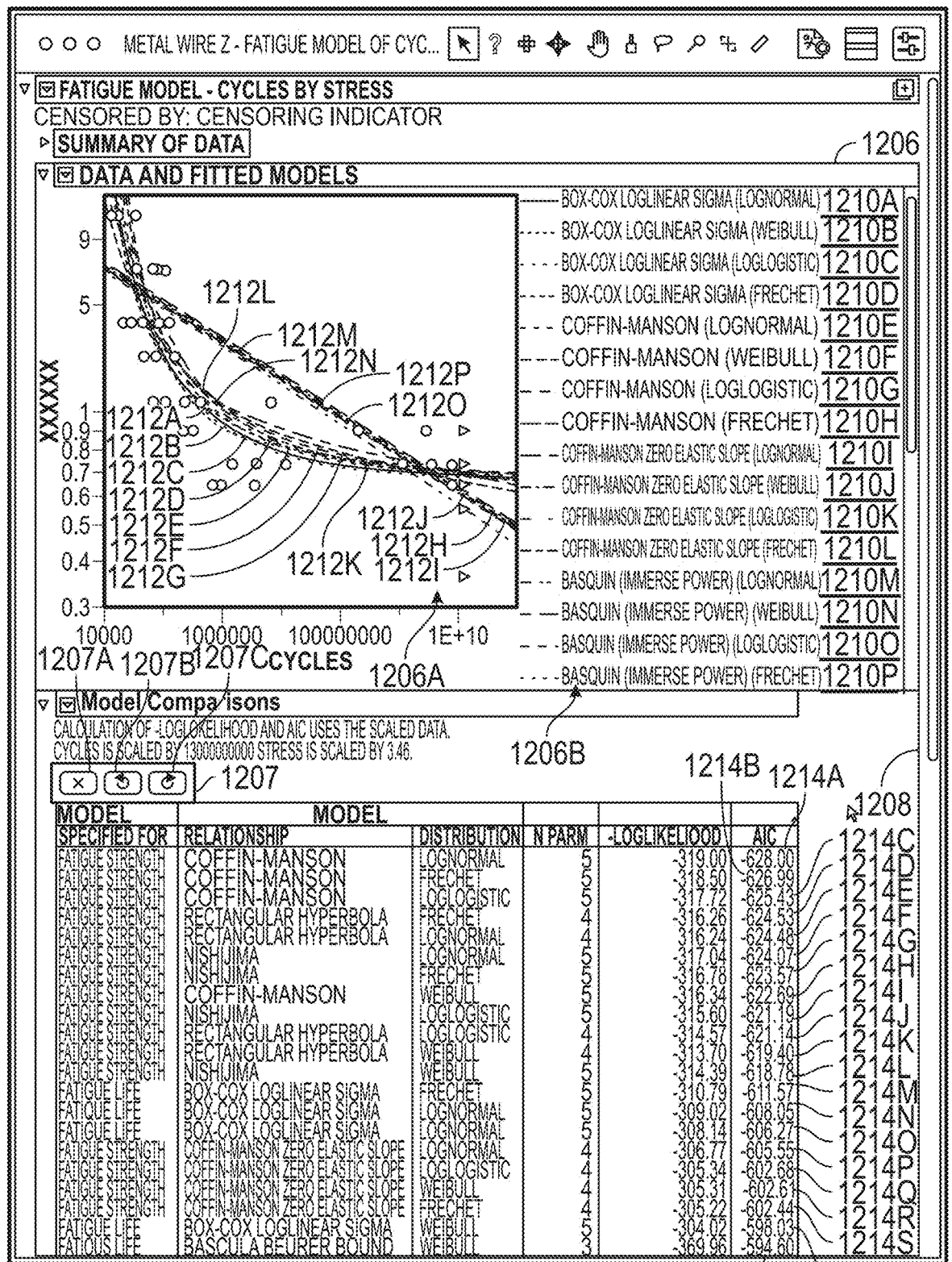

In some embodiments, the model comparison user interface of process 1120 may be similar to the model comparison user interface 1205 illustrated in FIG. 12B. As shown in FIG. 12B, the model comparison user interface 1205 may include one or more user interface elements, such as an interactive model comparison graph 1206, a model control toolbar 1207, and/or an interactive model comparison table 1208. Non-limiting examples of the interactive model comparison graph 1206, model control toolbar 1207, and the interactive model comparison table 1208 will be described in greater detail below. However, it shall be noted that, in one or more other embodiments, model comparison user interface 1205 may include additional, fewer, or different user interface elements beyond those illustrated in FIG. 12B without departing from the scope of the disclosure.

In some embodiments, interactive model comparison graph 1206 may plot an efficacy of the plurality of models requested to be compared in process 1110 (e.g., a non-limiting example of block 1120A of FIG. 11). As described previously with reference to FIG. 12A, in some embodiments, process 1110 may receive an input 1204 that corresponds to a request to compare a plurality of models associated with selectable options 1202A-1202F. Thus, in some embodiments, interactive model comparison graph 1206 may plot an efficacy of the plurality of models associated with selectable options 1202A-1202F. It shall be noted that the above example is not intended to be limiting and that if process 1110 received a different input than illustrated in FIG. 12A (e.g., an input selecting one of the other selectable options 1202A-1202F), interactive model comparison graph 1206 may instead plot an efficacy of the models associated with the different input.

Specifically, as shown in FIG. 12B, interactive model comparison graph 1206 may plot a plurality of graph elements 1212A-1212P (e.g., fitted curves, regression curves, etc.) corresponding to the plurality of models associated with selectable options 1202A-1202F. As generally referred to herein, a respective graph element of the plurality of graph elements 1212A-1212P may correspond to (e.g., represent an efficacy of) a respective model of the plurality of models associated with selectable options 1202A-1202F. For instance, as shown in FIG. 12B, graph element 1212A may correspond to a Box-Cox Loglinear Sigma model with a Lognormal distribution—as indicated by legend item 1210A—and represent an efficacy of such model in predicting outcomes under various conditions (e.g., stress per cycles). Conversely, as also shown in FIG. 12B, graph element 1212B may correspond to a Box-Cox Loglinear Sigma model with a Weibull distribution—as indicated by legend item 1210B—and represent an efficacy of such model in predicting outcomes under various conditions (e.g., stress per cycles). It shall be noted that the reminder of legend items 1210C-1210P may correspond to graph elements 1212C-1212P in analogous ways.

Furthermore, as shown in FIG. 12B, interactive model comparison table 1208 may include a plurality of selectable model comparison rows 1214A-1214U corresponding to the plurality of models selected for comparison by process 1110 (e.g., a non-limiting example of block 1120B in FIG. 11). For example, as described previously in FIG. 12A, process 1110 may receive, via selectable option 1202G, an input 1204 that corresponds to a request to compare a plurality of models associated with selectable options 1202A-1202F. Thus, in some embodiments, the plurality of selectable model comparison rows 1214A-1214U may correspond to the plurality of models associated with selectable options 1202A-1202F.

It shall be noted that the above example is not intended to be limiting and that if process 1110 received a different input than illustrated in FIG. 12A (e.g., an input selecting one of the other selectable options 1202A-1202F), interactive model comparison table 1208 may instead include selectable model comparison rows that correspond to the model(s) associated with the different input. For example, if process 1110 received input 1204 via selectable option 1202A (instead of selectable option 1202G), interactive model comparison table 1208 may instead display selectable model comparison rows corresponding to models associated with that input (instead of displaying selectable model comparison rows 1214A-1214U). Process 1120 may similarly adjust interactive model comparison table 1208 to display selectable model comparison rows corresponding to the models associated with any other selectable options 1202B-1202F illustrated in FIG. 12A.

In some embodiments, a respective selectable model comparison row of the plurality of selectable model comparison rows 1214A-1214U may correspond to a respective model that was requested to be compared in process 1110. For instance, as shown in the non-limiting example of FIG. 12B, the respective model corresponding to selectable model comparison row 1214A may be a Coffin-Manson model with a Lognormal distribution. Additionally, in some embodiments, a respective selectable model comparison row of the plurality of selectable model comparison rows 1214A-1214U may include one or more values that specify characteristics of the respective corresponding model (e.g., values specifying a type of the respective model) and/or may include one or more values that indicate an efficacy of the respective corresponding model.

For instance, as also shown in FIG. 12B, the one or more values in selectable model comparison row 1214A that specify characteristics of the respective corresponding model may include, but should not be limited to, a model purpose value (e.g., "Fatigue Strength"), a relationship/model type value (e.g., "Coffin-Manson"), a distribution type value (e.g., "Lognormal"), and/or the like. Furthermore, as also shown in FIG. 12B, the one or more values in selectable model comparison row 1214A that indicate an efficacy of the respective corresponding model may include, but should not be limited to, a number of model parameters value (e.g., "5"), a negative loglikelihood score (e.g., "−319.00"), a Akaike Information Criterion (AIC) score (e.g., "−628.00"), and/or the like. It shall be noted that the other selectable model comparison rows 1214B-1214U illustrated in FIG. 12B may include values corresponding to their respective model in analogous ways described above.

In some embodiments, process 1120 may detect an input selecting a respective selectable model comparison row. For example, as illustrated in FIG. 12E, process 1120 may detect input 1224 selecting model comparison row 1214B. Alternatively, in one or more other embodiments of FIG. 12E, process 1120 may detect an input selecting one of the other selectable model comparison rows 1214A-1214D.

In some embodiments, in response to detecting an input selecting a respective selectable model comparison row, process 1120 may visually highlight (e.g., emphasize) the respective selectable model comparison row in the interactive model comparison table 1208. For instance, as described above, process 1120 may detect an input 1224 selecting selectable model comparison row 1214B in FIG. 12E. Thus, in some embodiments, in response detecting input 1224, process 1120 may display selectable model comparison row 1214B in association with visual emphasis 1226. Alternatively, in one or more other embodiments, if process 1120 detects an input selecting a different selectable model comparison row than illustrated in FIG. 12E, process 1120 may instead display the different selectable model comparison row in association with visual emphasis 1226.

Additionally, in some embodiments, in response to detecting an input selecting a respective selectable model comparison row, process 1120 may visually highlight (e.g., emphasize) a graph element of interactive model comparison graph 1206 that is associated with such selectable model comparison row. For instance, as described previously in FIG. 12E, process 1120 may detect input 1224 selecting selectable model comparison row 1214B. Thus, in some embodiments, in response to detecting input 1224 in FIG. 12E, process 1110 may display a graph element 1212C corresponding to selectable model comparison row 1214B with visual emphasis 1228.

In some embodiments, interactive model comparison graph 1206 may include a graph plot and a legend for the graph plot. For instance, as shown in FIG. 12E, interactive model comparison graph 1206 may include graph plot 1206A and legend 1206B. As shown in the example of FIG. 12E, graph plot 1206A may include graph elements 1212A-1212D corresponding to selectable model comparison rows 1214A-1214D, respectively, and legend 1206B may include legend items 1210A-1210D corresponding to graph elements 1212A-1212D, respectively. It shall be noted that FIG. 12E is not intended to be limiting and that if interactive model comparison table 1208 included additional, different, or fewer selectable model comparison rows, graph plot 1206A and legend 1206B may analogously include additional, different, or fewer graph elements and legend items, respectively.

In some embodiments, in response to detecting an input selecting a respective selectable model comparison row, process 1120 may visually highlight (e.g., emphasize) a corresponding legend item in legend 1206B. The corresponding legend item in legend 1206B, as generally used herein, may refer to the legend item that is linked to (e.g., associated with) the graph element in graph plot 1206A that is associated with the selected model comparison row. For instance, as described above, process 1120 may detect an input 1224 selecting selectable model comparison row 1214B in FIG. 12E. Thus, in some embodiments, in response to detecting input 1224 selecting selectable model comparison row 1214B, process 1120 may visually emphasize the corresponding legend item 1210C with visual emphasis 1230 and graph element 1212D with visual emphasis 1228. Alternatively, in one or more other embodiments, if process 1120 detects an input selecting a different selectable model comparison row than illustrated in FIG. 12E, process 1120 may instead visually highlight (e.g., emphasize) the legend item and graph element corresponding to the different selectable model comparison row.

In some embodiments, process 1120 may detect an input selecting a respective legend item in legend 1206B. For example, as illustrated in FIG. 12F, process 1120 may detect an input 1232 selecting a legend item 1210B corresponding to graph element 1212B in graph plot 1206A. Alternatively, in one or more other embodiments of FIG. 12F, process 1120 may detect an input selecting one of the other legend items 1210A, 1210C, or 1210D in legend 1206B.

In some embodiments, in response to detecting an input selecting a respective legend item in legend 1206B, process 1120 may visually highlight (e.g., emphasize) a corresponding graph element in graph plot 1206A and/or may visually highlight (e.g., emphasize) a corresponding selectable model comparison row in interactive model comparison table 1208. For instance, as described previously with reference to FIG. 12F, process 1120 may detect an input 1232 selecting legend item 1210B (e.g., the legend item with the label "Coffin-Manson (Loglogistic)"). Thus, in some embodiments, in response to detecting input 1232 selecting legend item 1210B, process 1120 may change from displaying visual emphasis 1228 in association with graph element 1212C in FIG. 12E to displaying visual emphasis 1228 in association with graph element 1212B in FIG. 12F. Similarly, as also shown in FIG. 12F, in response to detecting input 1232 selecting legend item 1210B, process 1120 may change from displaying visual emphasis 1226 in association with selectable model comparison row 1214B in FIG. 12E to displaying visual emphasis 1226 in association with selectable model comparison row 1214C in FIG. 12F.

Referring to FIG. 11, in some embodiments, the model comparison user interface of process 1120 may include a model control toolbar that includes one or more selectable control elements for dynamically controlling which of the plurality of models are under comparison in the interactive model comparison graph and the interactive model comparison table (e.g., block 1120C in FIG. 11). For instance, in a non-limiting example, the model comparison user interface may be comparing a plurality of models in an interactive model comparison graph and an interactive model comparison table. Thus, in some embodiments, the one or more selectable control elements of the model control toolbar may receive input(s) for interactively transitioning the model comparison user interface from comparing the plurality of models to comparing a new set of models (e.g., a second plurality of models).

As generally used herein, a model may be considered by process 1120 to be "under comparison" if the interactive model comparison graph and/or table includes a graph element or row corresponding to such model. For instance, as described previously, the interactive model comparison table 1208 illustrated in FIG. 12B may include a plurality of selectable model comparison rows 1214A-1214U. Accordingly, in some embodiments, the plurality of models under comparison in FIG. 12B may correspond to the models associated with the plurality of selectable model comparison rows 1214A-1214U (e.g., as indicated by the "Model" column, the "Relationship" sub-column, and the "Distribution" sub-column).

In some embodiments, the model control toolbar of process 1120 may be similar to model control toolbar 1207 illustrated in FIG. 12B. As illustrated in FIG. 12B, model control toolbar 1207 may include one or more selectable control elements 1207A-1207C. In some embodiments, selectable control element 1207A may be selectable via user input and, when selected, may execute a model delete operation as will be described in greater detail in processes 1130 and 1140 of method 1100. Conversely, in some embodiments, selectable control element 1207B may be selectable via user input and, when selected, may execute a model undo operation as will also be described in greater detail in processes 1130 and 1140 of method 1100. Lastly, in some embodiments, selectable control element 1207C may be selectable via user input and, when selected, may execute a model redo operation, which will also be described in greater detail in processes 1130 and 1140 of method 1100.

Referring to FIG. 11, in some embodiments, process 1130 of method 1100 may detect, at the model control toolbar, a selection of a respective selectable control element of the one or more selectable control elements to transition the interactive model comparison graph and the interactive model comparison table from comparing the plurality of models to comparing a new set of models. The new set of models, as generally used herein, may represent a subset, a superset, or an entirely different set of models compared to the original plurality of models. For example, if the new set of models is a subset of the original plurality of models, only a portion of previously compared models will remain under comparison in the interactive model comparison table of process 1120 and the interactive model comparison graph of process 1120.

Conversely, if the new set of models is a superset of the original plurality of models, additional models may be added to the existing models already being displayed in the interactive model comparison table of process 1120 and the interactive model comparison graph of process 1120. Alternatively, in some embodiments, if the new set of models is entirely different from the original set of models, method 1100 may replace the original plurality of models with the new set of models in the interactive model comparison table of process 1120 and the interactive model comparison graph of process 1120.

Figure 12C:
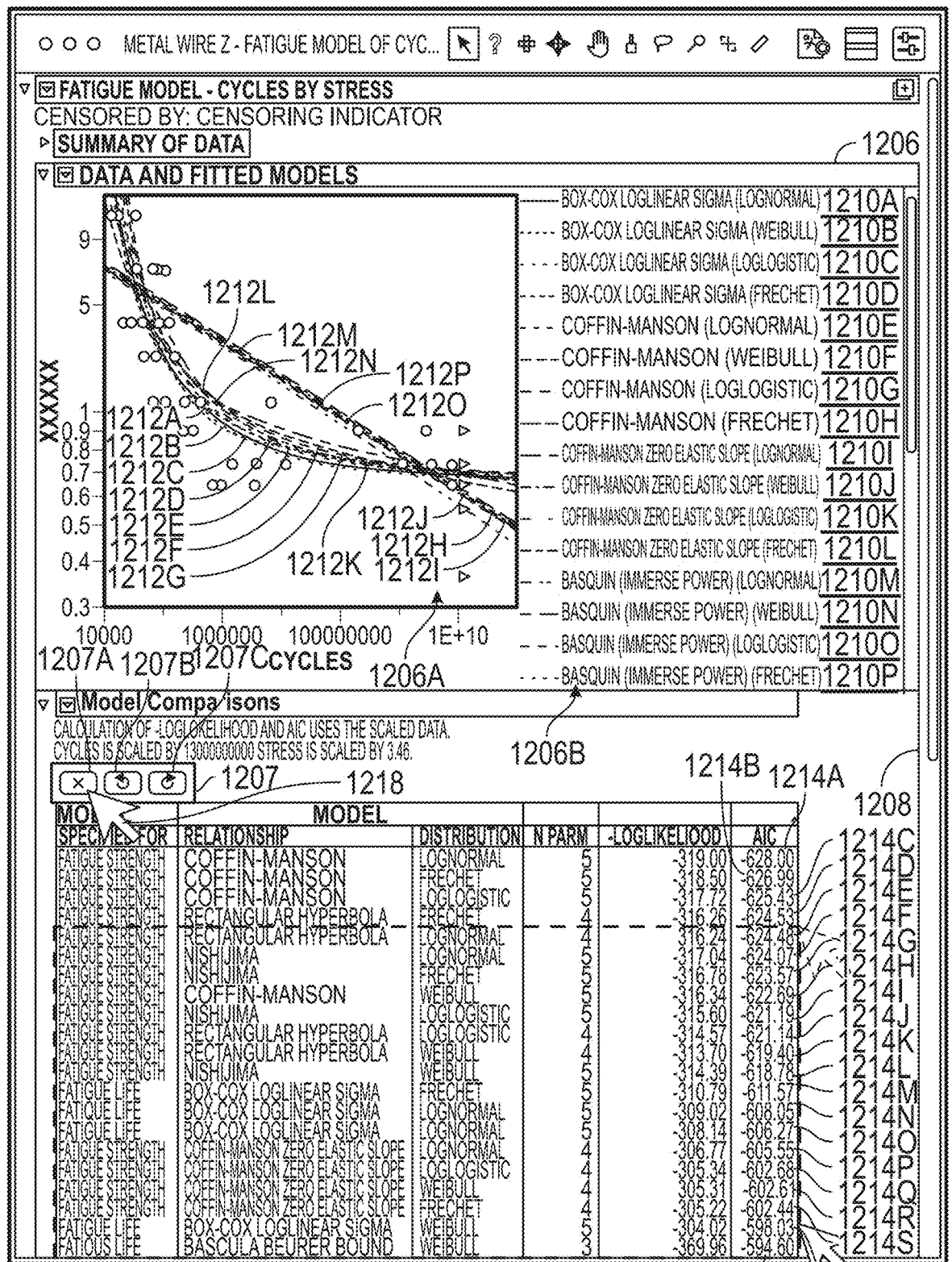

In some embodiments, the selection detected by process 1130 may be similar to selection 1218 illustrated in FIG. 12C (e.g., a selection selecting selectable control element 1207A). Alternatively, in some embodiments, the selection detected by process 1130 may correspond to a selection of one or more of the other selectable control elements 1207B-1207C. It shall be noted that while the above example describes process 1130 as detecting a single selection of a selectable control element, process 1130 may additionally be configured to detect and process multiple selections. For instance, in a non-limiting example, process 1130 may detect a first selection of selectable control element 1207A followed by one or more subsequent selections of selectable control elements 1207B-1207C.

In some embodiments, process 1130 may detect selection 1218 while one or more selectable model comparison rows are selected in interactive model comparison table 1208. For instance, in the example of FIG. 12C, process 1130 may detect selection 1218 after receiving input 1216 selecting selectable model comparison rows 1214E-1214U. Thus, in some embodiments, in response to detecting selection 1218, selectable control element 1207A may, in turn, execute a model delete operation for transitioning interactive model comparison table 1208 and interactive model comparison graph 1206 from comparing the plurality of models associated with selectable model comparison rows 1214A-1214U in FIG. 12C to comparing the plurality of models associated with selectable model comparison rows 1214A-1214D in FIG. 12D (e.g., removing the models associated with selectable model comparisons rows 1214E-1214U from comparison in interactive model comparison table 1206 and interactive model comparison graph 1208).

In some embodiments, after detecting a selection of a respective selectable control element in the model control toolbar, process 1140 of method 1100 may concurrently modify the interactive model comparison graph and the interactive model comparison table in accordance with the selection detected at the model control toolbar. For example, in some embodiments, process 1140 of method 1100 may concurrently modify interactive model comparison graph 1206 and interactive model comparison table 1208 in accordance with the selection 1218 of selectable control element 1207A.

In some embodiments, concurrently modifying interactive model comparison graph 1206 and interactive model comparison table 1208 for a model delete operation (e.g., the operation corresponding to selectable option 1207A) may include deleting one or more selectable model comparison rows currently selected in the interactive model comparison table 1208 and deleting one or more graph elements that are associated with such selectable model comparison rows in interactive model comparison graph 1206. For example, as described previously with reference to FIG. 12C, process 1130 may detect selection 1218 for transitioning interactive model comparison graph 1206 and interactive model comparison table 1208 from comparing the models associated with selectable model comparison rows 1214A-1214U to comparing the models associated with selectable model comparison rows 1214A-1214D (e.g., a subset of the models). Thus, as shown in FIG. 12D, in accordance with selection 1218 in FIG. 12C, process 1140 may delete the selectable model comparison rows 1214E-1214U and delete graph elements corresponding to the selectable model comparison rows 1214E-1214U.

Figure 12D:
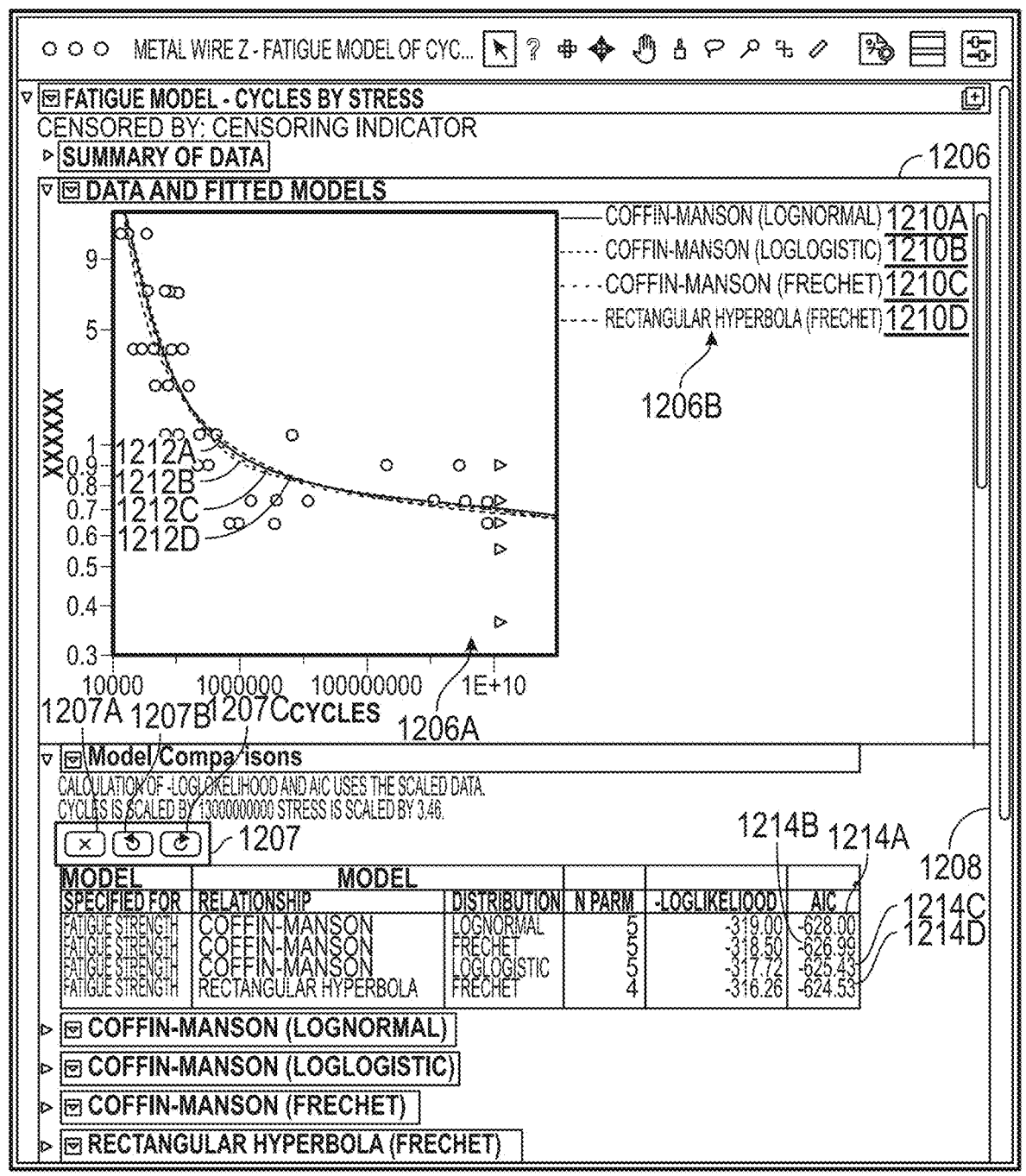
Figure 12E:
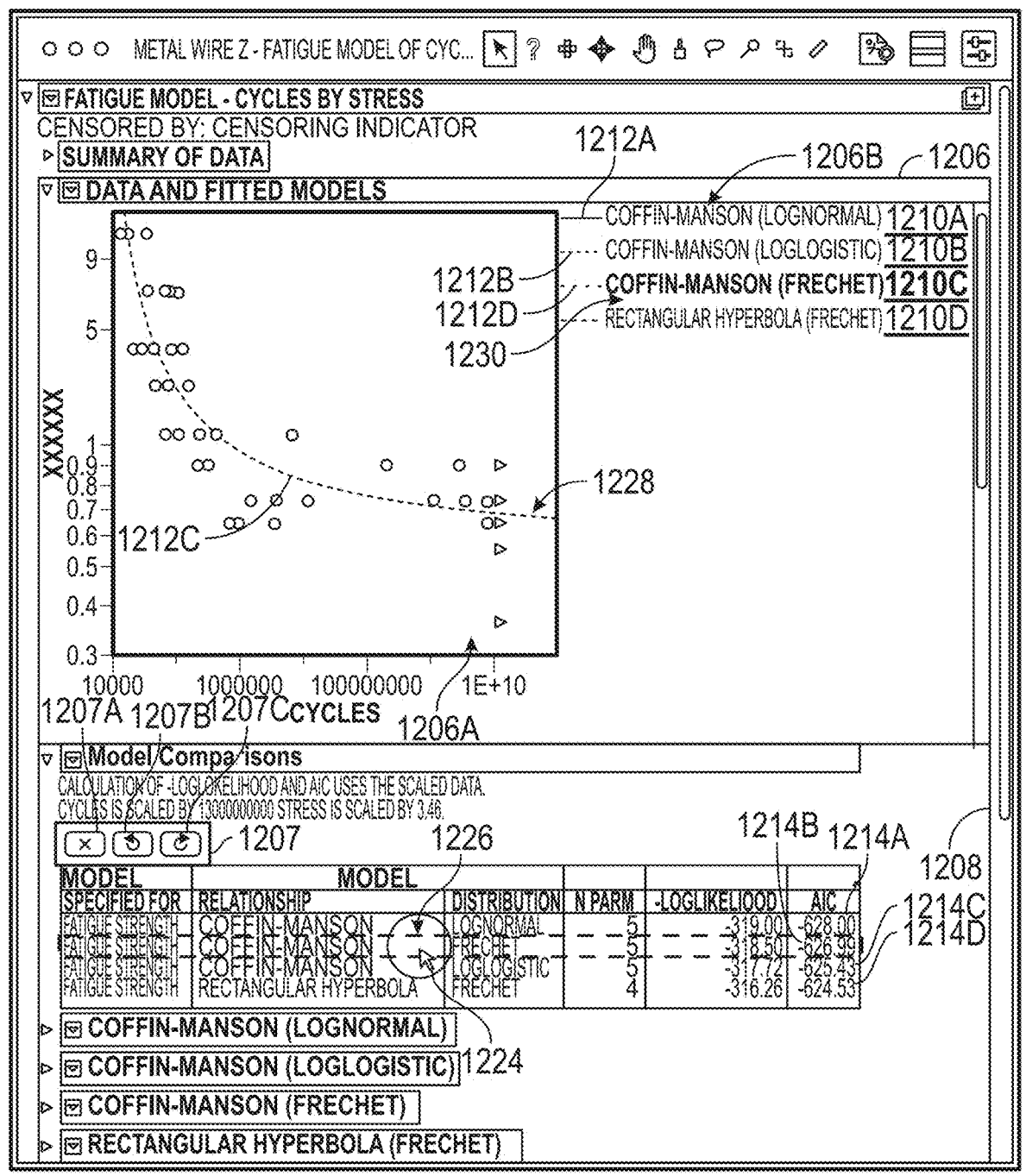
Figure 12F:
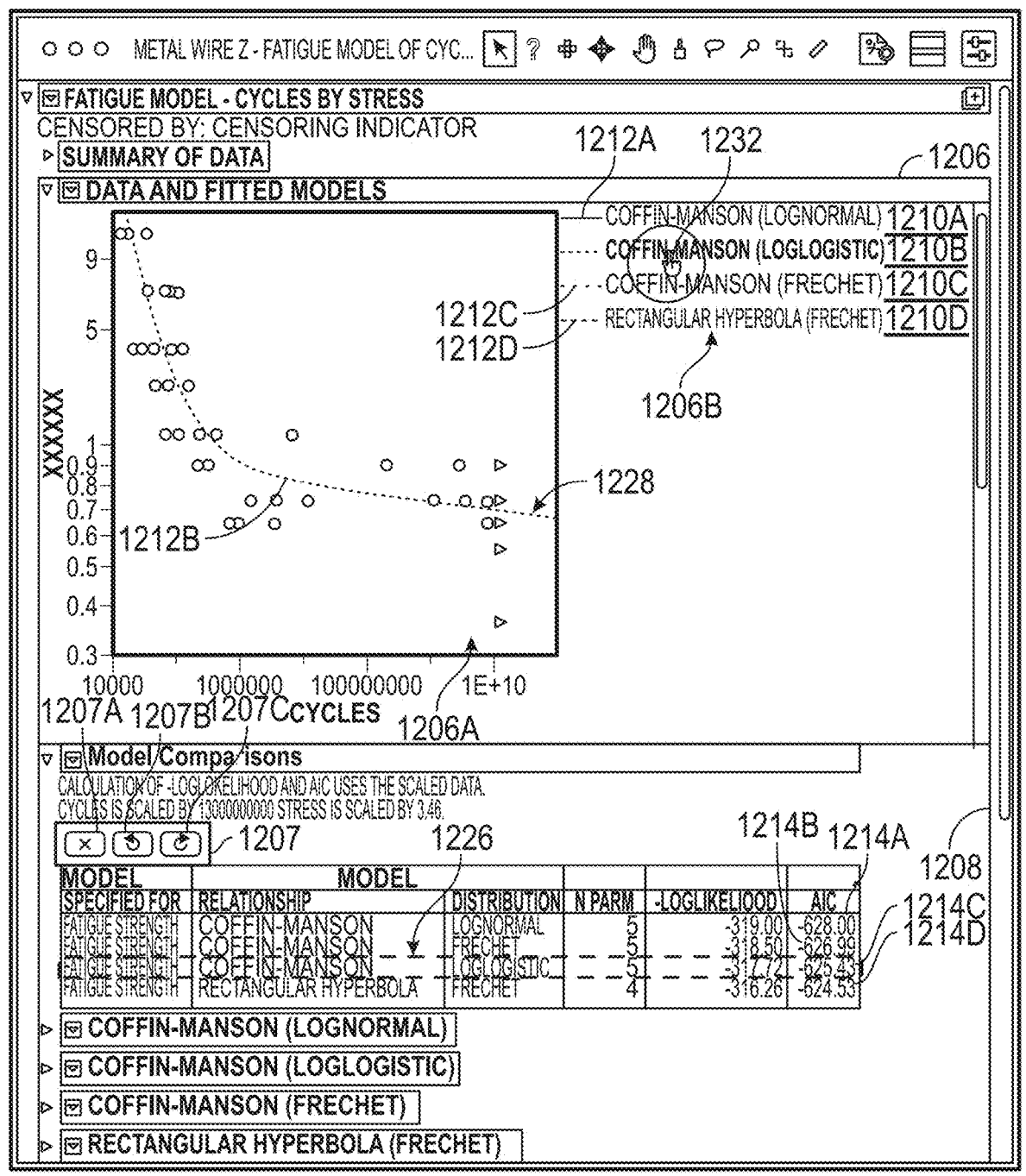
Figure 12G:
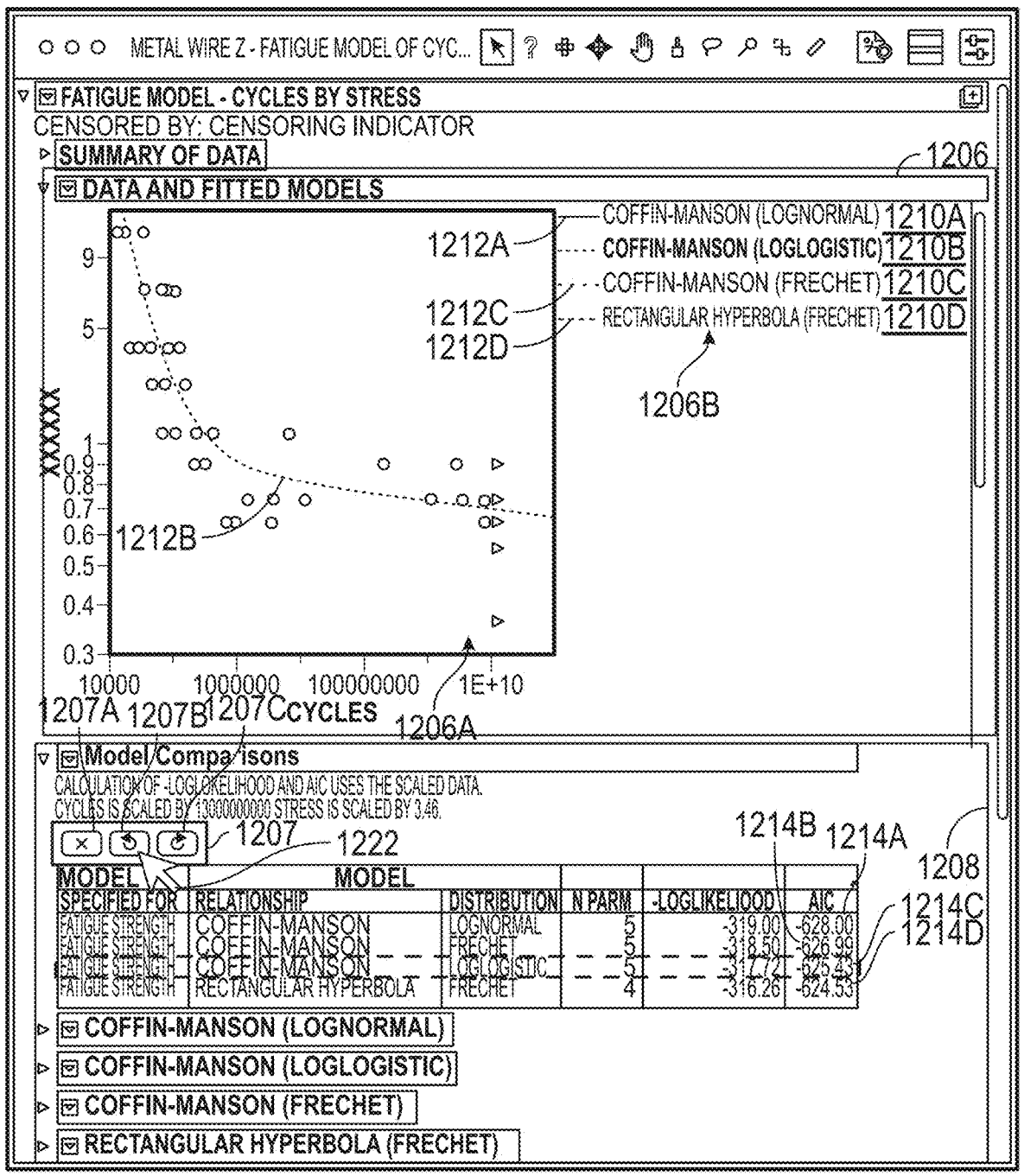

Alternatively, in some embodiments, the selection detected by process 1130 may be similar to selection 1222 in FIG. 12G. As illustrated in FIG. 12G, selection 1222 may select selectable option 1207B. Selectable option 1207B, in some embodiments, may execute a model undo operation that transitions interactive model comparison table 1208 and interactive model comparison graph 1206 from comparing the models associated with selectable model comparison rows 1214A-1214D to comparing a new set of models.

In some embodiments, concurrently modifying interactive model comparison graph 1206 and interactive model comparison table 1208 for a model undo operation (e.g., a non-limiting example of process 1140) may include reversing a previous operation performed in the interactive model comparison graph 1206 and interactive model comparison table 1208. If the previous operation deleted one or more selectable model comparison rows from the interactive model comparison table 1208 and one or more graph elements associated with the deleted selectable model comparison rows from interactive model comparison graph 1206, reversing the previous operation may include re-inserting the previously deleted selectable model comparison rows and graph elements into interactive model comparison table 1208 and interactive model comparison graph 1206, respectively.

For instance, in the example of FIGS. 12C and 12D, the previous operation may correspond to the deletion of selectable model comparison rows 1214A-1214U and corresponding graph elements. Thus, as shown in FIG. 12H, in response to detecting selection 1222 in FIG. 12G, process 1140 may re-insert, into interactive model comparison table 1208 and interactive model comparison graph 1206, the selectable model comparison rows 1214A-1214U and the graph elements corresponding to selectable model comparison rows 1214A-1214U deleted in FIGS. 12C and 12D, respectively.

Conversely, if the previous operation added one or more selectable model comparison rows to the interactive model comparison table 1208 and one or more corresponding graph elements to model comparison graph 1206, reversing the previous operation may include removing (e.g., deleting) the previously added selectable model comparison rows and graph elements in analogous ways described above. For instance, if the previous operation instead added selectable model comparison rows 1214E-1214U and corresponding graph elements to interactive model comparison table 1208 and interactive model comparison graph 1206, process 1140 may instead concurrently delete such elements when selection 1222 is detected in FIG. 12G.

Figure 12H:
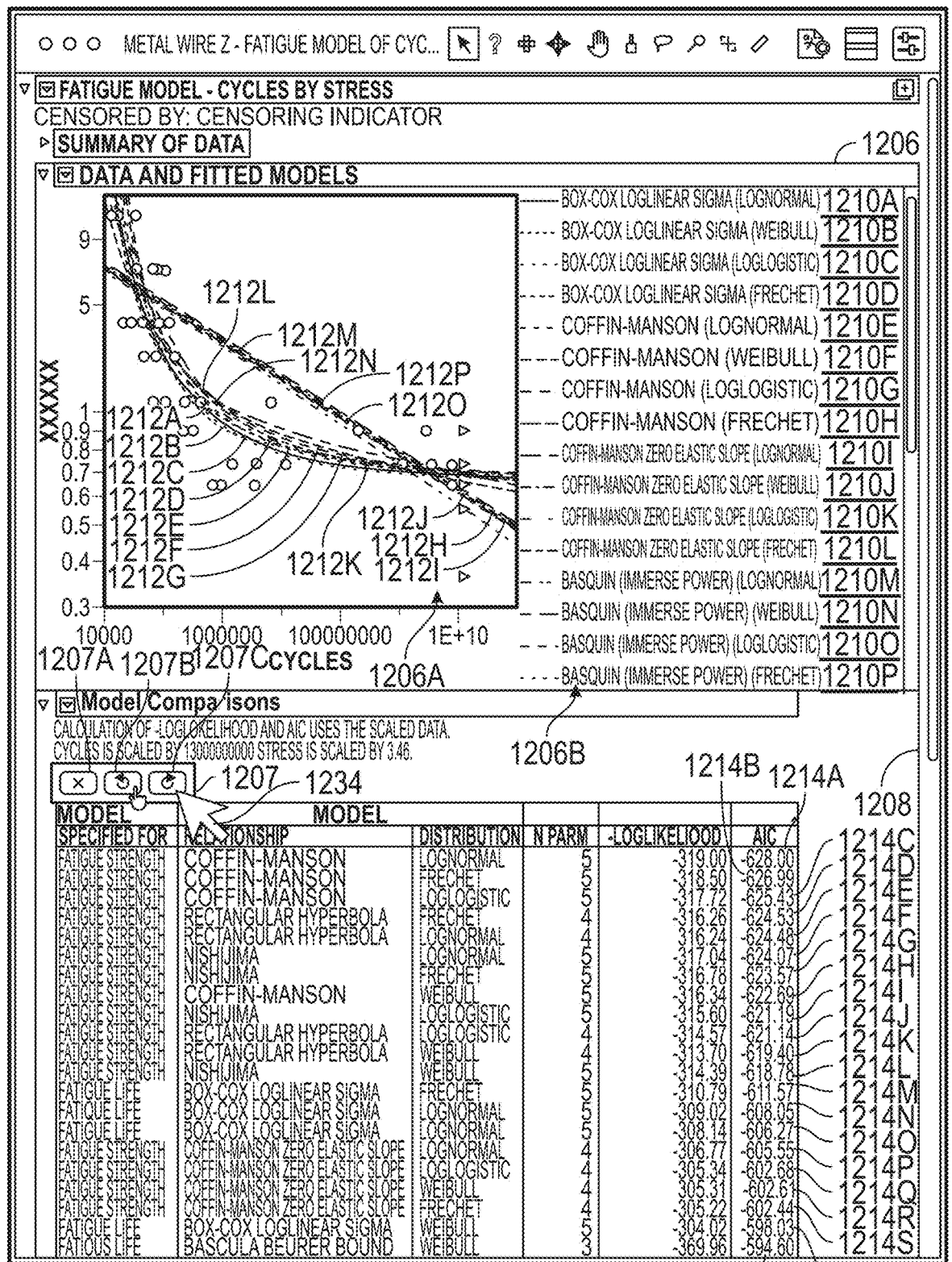

Alternatively, in some embodiments, the selection detected by process 1130 may be similar to selection 1234 in FIG. 12H. As illustrated in FIG. 12H, selection 1234 may select selectable option 1207C. Selectable option 1207C, in some embodiments, may execute a model redo operation that transitions interactive model comparison table 1208 and interactive model comparison graph 1206 from comparing the models associated with selectable model comparison rows 1214A-1214U to comparing a new set of models.

In some embodiments, concurrently modifying interactive model comparison graph 1206 and interactive model comparison table 1208 for a model undo operation (e.g., a non-limiting example of process 1140) may include re-performing an operation that was previously undone in the interactive model comparison graph 1206 and interactive model comparison table 1208. If the previous undone operation added one or more selectable model comparison rows to the interactive model comparison table 1208 and one or more graph elements associated with the added selectable model comparison rows to interactive model comparison graph 1206, re-performing the previously undone operation may include removing (e.g., deleting) the previously added selectable model comparison rows and graph elements from interactive model comparison table 1208 and interactive model comparison graph 1206, respectively.

For instance, in the example of FIGS. 12G and 12H, the previous undone operation may correspond to the addition of selectable model comparison rows 1214A-1214U and corresponding graph elements to interactive model comparison table 1208 and interactive model comparison graph 1206, respectively. Thus, in the example of FIG. 12H, in response to detecting selection 1234, process 1140 may remove, from interactive model comparison table 1208 and interactive model comparison graph 1206, the selectable model comparison rows 1214E-1214U and corresponding graph elements (e.g., revert back to the state illustrated in FIG. 12G).

Conversely, if the previous operation removed one or more selectable model comparison rows from the interactive model comparison table 1208 and one or more corresponding graph elements from model comparison graph 1206, reversing the previous operation may include re-inserting the previously removed selectable model comparison rows and graph elements in analogous ways described above. For instance, if the previous undone operation instead removed selectable model comparison rows 1214E-1214U and corresponding graph elements to interactive model comparison table 1208 and interactive model comparison graph 1206 FIGS. 12G and 12H, process 1140 may instead concurrently re-insert such elements when selection 1234 is detected in FIG. 12H.

It shall be noted that, in the method(s) described herein where one or more steps (e.g., processes) are contingent upon one or more conditions having been met, it should be understood that the described method can be repeated in multiple repetitions so that over the course of the repetitions all of the conditions upon which steps in the method are contingent have been met in different repetitions of the method. For example, if a method requires performing a first step if a condition is satisfied, and a second step if the condition is not satisfied, then a person of ordinary skill would appreciate that the claimed steps are repeated until the condition has been both satisfied and not satisfied, in no particular order. Thus, a method described with one or more steps that are contingent upon one or more conditions having been met could be rewritten as a method that is repeated until each of the conditions described in the method has been met. This, however, is not required of system or computer readable medium claims where the system or computer readable medium contains instructions for performing the contingent operations based on the satisfaction of the corresponding one or more conditions and thus is capable of determining whether the contingency has or has not been satisfied without explicitly repeating steps of a method until all of the conditions upon which steps in the method are contingent have been met. A person having ordinary skill in the art would also understand that, similar to a method with contingent steps, a system or computer readable storage medium can repeat the steps of a method as many times as are needed to ensure that all of the contingent steps have been performed.

It shall be appreciated that other embodiments contemplated within the scope of the present disclosure may involve more processes, fewer processes, different processes, or a different order of processes than illustrated in FIG. 9. It should be noted that a computer-program product may include a non-transitory machine-readable storage medium storing computer instructions that, when executed by one or more operations, may perform operations corresponding to the processes and sub-processes of method 1100. Additionally, or alternatively, a computer-implemented method may include operations corresponding to processes and sub-processes of 1100. Additionally, or alternatively, a computer-implemented system may include one or more processors, a memory, and a computer-readable medium operably coupled to the one or more processors, the computer-readable medium having computer-readable instructions stored thereon that, when executed by the one or more processors, cause a computing device to perform operations corresponding to the processes and sub-processes of method 1100.

It shall also be noted that the system and methods of the embodiments and variations described herein can be embodied and/or implemented at least in part as a machine comprising a computer-readable medium storing computer-readable instructions. The instructions may be executed by computer-executable components integrated with the system and one or more portions of the processors and/or the controllers. The computer-readable medium can be stored on any suitable computer-readable media such as RAMs, ROMs, flash memory, EEPROMs, optical devices (CD or DVD), hard drives, floppy drives, memory sticks (e.g., SD cards, USB flash drives), cloud-based services (e.g., cloud storage), magnetic storage devices, Solid-State Drives (SSDs), or any suitable device. The computer-executable component is preferably a general or application-specific processor, but any suitable dedicated hardware or hardware/firmware combination device can alternatively or additionally execute the instructions.

The systems and methods of the preferred embodiments may additionally, or alternatively, be implemented on an integrated data analytics software application and/or software architecture such as those offered by SAS Institute Inc. or JMP Statistical Discovery LLC of Cary, N.C., USA. Merely for illustration, the systems and methods of the preferred embodiments may be implemented using or integrated with one or more software tools such as JMP®, which is developed and provided by JMP Statistical Discovery LLC.

Although omitted for conciseness, the preferred embodiments include every combination and permutation of the implementations of the systems and methods described herein.

As a person skilled in the art will recognize from the previous detailed description and from the figures and claims, modifications and changes can be made to the embodiments of the disclosure without departing from the scope of the various described embodiments.

What is claimed is:

1. A computer-program product comprising a non-transitory machine-readable storage medium storing computer instructions that, when executed by one or more processors, perform operations comprising:
   receiving a selection of a single selectable option, wherein the selection of the single selectable option specifies a plurality of model types and a plurality of distributions for the plurality of model types;
   displaying a model comparison user interface in response to receiving the selection of the single selectable option, wherein the model comparison user interface includes:
      an interactive model comparison graph that plots an efficacy of a plurality of models corresponding to the selection of the single selectable option,
      an interactive model comparison table that includes a plurality of selectable model comparison rows corresponding to the plurality of models, and
      a model control toolbar that includes one or more selectable control elements for dynamically controlling which of the plurality of models are under comparison in the interactive model comparison graph and the interactive model comparison table;
   detecting, at the model control toolbar, a selection of a respective selectable control element of the one or more selectable control elements to transition the interactive model comparison graph and the interactive model comparison table from comparing the plurality of models to comparing a new set of models; and
   concurrently modifying the interactive model comparison graph and the interactive model comparison table in accordance with the selection of the respective selectable control element.

2. The computer-program product according to claim 1, wherein:
   the selection of the single selectable option results in one selectable option being selected,
   the respective selectable control element executes a model delete operation to transition the interactive model comparison graph and the interactive model comparison table from comparing the plurality of models to comparing the new set of models, and
   concurrently modifying the interactive model comparison graph and the interactive model comparison table in accordance with the selection of the respective selectable control element includes:
      deleting, from the interactive model comparison table, one or more selectable model comparison rows currently selected in the interactive model comparison table, and
      deleting, from the interactive model comparison graph, one or more graph elements associated with the one or more selectable model comparison rows currently selected in the interactive model comparison table.

3. The computer-program product according to claim 1, wherein:
   the plurality of model types include a Box-Cox Loglinear Sigma model type, a Coffin-Manson model type, a Coffin-Manson Zero Elastic Slope model type, a Basquin (Inverse Power) model type, a Nishijima model type, and a Rectangular Hyperbola model type,
   the plurality of distributions include a Lognormal distribution, a Frechet distribution, and a Weibull distribution,
   the plurality of models corresponding to the selection of the single selectable option includes a model corresponding to each combination of a model type from the plurality of model types and a distribution from the plurality of distributions,
   the respective selectable control element executes a model undo operation to transition the interactive model comparison graph and the interactive model comparison table from comparing the plurality of models to comparing the new set of models, and
   concurrently modifying the interactive model comparison graph and the interactive model comparison table in accordance with the selection of the respective selectable control element includes:
      reversing a previous operation performed in the interactive model comparison table and the interactive model comparison graph.

4. The computer-program product according to claim 3, wherein:
   the previous operation deleted one or more selectable model comparison rows from the interactive model comparison table and one or more graph elements associated with the one or more selectable model comparison rows in the interactive model comparison graph, and
   reversing the previous operation performed in the interactive model comparison table and the interactive model comparison graph includes:
      re-inserting, into the interactive model comparison table, the one or more selectable model comparison rows deleted from the interactive model comparison table in the previous operation, and re-inserting, into the interactive model comparison graph, the one or more graph elements deleted from the interactive model comparison graph in the previous operation.

5. The computer-program product according to claim 3, wherein:
the previous operation added one or more new selectable model comparison rows to the interactive model comparison table and one or more new graph elements associated with the one or more new selectable model comparison rows to the interactive model comparison graph, and
reversing the previous operation performed in the interactive model comparison table and the interactive model comparison graph includes:
deleting the one or more new selectable model comparison rows added to the interactive model comparison table in the previous operation, and
deleting the one or more new graph elements added to the interactive model comparison table in the previous operation.

6. The computer-program product according to claim 1, wherein:
the respective selectable control element executes a model redo operation to transition the interactive model comparison graph and the interactive model comparison table from comparing the plurality of models to comparing the new set of models, and
concurrently modifying the interactive model comparison graph and the interactive model comparison table in accordance with the selection of the respective selectable control element includes:
re-performing an operation that was previously undone in the interactive model comparison table and the interactive model comparison graph.

7. The computer-program product according to claim 1, wherein the computer instructions, when executed by the one or more processors, perform operations further comprising:
fitting the plurality of models using a fatigue model platform, wherein the plurality of models measure stress per cycles.

8. The computer-program product according to claim 7, wherein:
the interactive model comparison graph corresponds to a stress per cycles graph,
the plurality of models corresponds to a plurality of fatigue life models, and
the fatigue model platform fits the plurality of fatigue life models using the plurality of distributions.

9. The computer-program product according to claim 1, wherein the computer instructions, when executed by the one or more processors, perform operations further comprising:
detecting, at the interactive model comparison table, an input selecting a respective selectable model comparison row of the plurality of selectable model comparison rows, and
in response to detecting the input selecting the respective selectable model comparison row:
visually highlighting the respective selectable model comparison row selected in the interactive model comparison table, and
visually highlighting a graph element associated with the respective selectable model comparison row selected in the interactive model comparison graph.

10. The computer-program product according to claim 9, wherein:
the interactive model comparison graph includes a graph plot and a legend for the graph plot,
the graph element associated with the respective selectable model comparison row is displayed in the graph plot, and
in response to detecting the input selecting the respective selectable model comparison row further includes:
visually highlighting a legend entry corresponding to the graph element associated with the respective selectable model comparison row that is selected in the interactive model comparison graph.

11. The computer-program product according to claim 1, wherein a respective selectable model comparison row corresponds to a respective model of the plurality of models and includes:
one or more values that specifies a type and a distribution of the respective model, and
one or more values that indicate an efficacy of the respective model, wherein the one or more values indicating the efficacy of the respective model include a number of model parameters value, a negative log-likelihood score value, and a Akaike Information Criterion score value.

12. A computer-implemented method comprising:
receiving a selection of a single selectable option, wherein the selection of the single selectable option specifies a plurality of model types and a plurality of distributions for the plurality of model types;
displaying a model comparison user interface in response to receiving the selection of the single selectable option, wherein the model comparison user interface includes:
an interactive model comparison graph that plots an efficacy of a plurality of models corresponding to the selection of the single selectable option,
an interactive model comparison table that includes a plurality of selectable model comparison rows corresponding to the plurality of models, and
a model control toolbar that includes one or more selectable control elements for dynamically controlling which of the plurality of models are under comparison in the interactive model comparison graph and the interactive model comparison table;
detecting, at the model control toolbar, a selection of a respective selectable control element of the one or more selectable control elements to transition the interactive model comparison graph and the interactive model comparison table from comparing the plurality of models to comparing a new set of models; and
concurrently modifying the interactive model comparison graph and the interactive model comparison table in accordance with the selection of the respective selectable control element.

13. The computer-implemented method according to claim 12, wherein:
the selection of the single selectable option results in one selectable option being selected,
the respective selectable control element executes a model delete operation to transition the interactive model comparison graph and the interactive model comparison table from comparing the plurality of models to comparing the new set of models, and
concurrently modifying the interactive model comparison graph and the interactive model comparison table in accordance with the selection of the respective selectable control element includes:
   deleting, from the interactive model comparison table, one or more selectable model comparison rows currently selected in the interactive model comparison table, and
   deleting, from the interactive model comparison graph, one or more graph elements associated with the one or more selectable model comparison rows currently selected in the interactive model comparison table.

14. The computer-implemented method according to claim 12, wherein:
   the plurality of model types include a Box-Cox Loglinear Sigma model type, a Coffin-Manson model type, a Coffin-Manson Zero Elastic Slope model type, a Basquin (Inverse Power) model type, a Nishijima model type, and a Rectangular Hyperbola model type,
   the plurality of distributions include a Lognormal distribution, a Frechet distribution, and a Weibull distribution,
   the plurality of models corresponding to the selection of the single selectable option includes a model corresponding to each combination of a model type from the plurality of model types and a distribution from the plurality of distributions,
   the respective selectable control element executes a model undo operation to transition the interactive model comparison graph and the interactive model comparison table from comparing the plurality of models to comparing the new set of models, and
   concurrently modifying the interactive model comparison graph and the interactive model comparison table in accordance with the selection of the respective selectable control element includes:
      reversing a previous operation performed in the interactive model comparison table and the interactive model comparison graph.

15. The computer-implemented method according to claim 14, wherein:
   the previous operation deleted one or more selectable model comparison rows from the interactive model comparison table and one or more graph elements associated with the one or more selectable model comparison rows in the interactive model comparison graph, and
   reversing the previous operation performed in the interactive model comparison table and the interactive model comparison graph includes:
      re-inserting, into the interactive model comparison table, the one or more selectable model comparison rows deleted from the interactive model comparison table in the previous operation, and
      re-inserting, into the interactive model comparison graph, the one or more graph elements deleted from the interactive model comparison graph in the previous operation.

16. The computer-implemented method according to claim 14, wherein:
   the previous operation added one or more new selectable model comparison rows to the interactive model comparison table and one or more new graph elements associated with the one or more new selectable model comparison rows to the interactive model comparison graph, and
   reversing the previous operation performed in the interactive model comparison table and the interactive model comparison graph includes:
      deleting the one or more new selectable model comparison rows added to the interactive model comparison table in the previous operation, and
      deleting the one or more new graph elements added to the interactive model comparison table in the previous operation.

17. The computer-implemented method according to claim 12, wherein:
   the respective selectable control element executes a model redo operation to transition the interactive model comparison graph and the interactive model comparison table from comparing the plurality of models to comparing the new set of models, and
   concurrently modifying the interactive model comparison graph and the interactive model comparison table in accordance with the selection of the respective selectable control element includes:
      re-performing an operation that was previously undone in the interactive model comparison table and the interactive model comparison graph.

18. The computer-implemented method according to claim 12, wherein the computer-implemented method further comprises:
   fitting the plurality of models using a fatigue model platform, wherein the plurality of models measure stress per cycles.

19. The computer-implemented method according to claim 18, wherein:
   the interactive model comparison graph corresponds to a stress per cycles graph,
   the plurality of models corresponds to a plurality of fatigue life models, and
   the fatigue model platform fits the plurality of fatigue life models using the plurality of distributions.

20. The computer-implemented method according to claim 12, wherein the computer-implemented method further comprises:
   detecting, at the interactive model comparison table, an input selecting a respective selectable model comparison row of the plurality of selectable model comparison rows, and
   in response to detecting the input selecting the respective selectable model comparison row:
      visually highlighting the respective selectable model comparison row selected in the interactive model comparison table, and
      visually highlighting a graph element associated with the respective selectable model comparison row selected in the interactive model comparison graph.

21. The computer-implemented method according to claim 20, wherein:
   the interactive model comparison graph includes a graph plot and a legend for the graph plot,
   the graph element associated with the respective selectable model comparison row is displayed in the graph plot, and
   in response to detecting the input selecting the respective selectable model comparison row further includes:
      visually highlighting a legend entry corresponding to the graph element associated with the respective selectable model comparison row that is selected in the interactive model comparison graph.

22. A computer-implemented system comprising:
   one or more processors;
   a memory;
   a computer-readable medium operably coupled to the one or more processors, the computer-readable medium having computer-readable instructions stored thereon that, when executed by the one or more processors, cause a computing device to perform operations comprising:

receiving a selection of a single selectable option, wherein the selection of the single selectable option specifies a plurality of model types and a plurality of distributions for the plurality of model types;

displaying a model comparison user interface in response to receiving the selection of the single selectable option, wherein the model comparison user interface includes:
an interactive model comparison graph that plots an efficacy of a plurality of models corresponding to the selection of the single selectable option,
an interactive model comparison table that includes a plurality of selectable model comparison rows corresponding to the plurality of models, and
a model control toolbar that includes one or more selectable control elements for dynamically controlling which of the plurality of models are under comparison in the interactive model comparison graph and the interactive model comparison table;

detecting, at the model control toolbar, a selection of a respective selectable control element of the one or more selectable control elements to transition the interactive model comparison graph and the interactive model comparison table from comparing the plurality of models to comparing a new set of models; and concurrently modifying the interactive model comparison graph and the interactive model comparison table in accordance with the selection of the respective selectable control element.

23. The computer-implemented system according to claim 22, wherein:
the selection of the single selectable option results in one selectable option being selected,
the respective selectable control element executes a model delete operation to transition the interactive model comparison graph and the interactive model comparison table from comparing the plurality of models to comparing the new set of models, and
concurrently modifying the interactive model comparison graph and the interactive model comparison table in accordance with the selection of the respective selectable control element includes:
deleting, from the interactive model comparison table, one or more selectable model comparison rows currently selected in the interactive model comparison table, and
deleting, from the interactive model comparison graph, one or more graph elements associated with the one or more selectable model comparison rows currently selected in the interactive model comparison table.

24. The computer-implemented system according to claim 22, wherein:
the plurality of model types include a Box-Cox Loglinear Sigma model type, a Coffin-Manson model type, a Coffin-Manson Zero Elastic Slope model type, a Basquin (Inverse Power) model type, a Nishijima model type, and a Rectangular Hyperbola model type,
the plurality of distributions include a Lognormal distribution, a Frechet distribution, and a Weibull distribution,
the plurality of models corresponding to the selection of the single selectable option includes a model corresponding to each combination of a model type from the plurality of model types and a distribution from the plurality of distributions,
the respective selectable control element executes a model undo operation to transition the interactive model comparison graph and the interactive model comparison table from comparing the plurality of models to comparing the new set of models, and
concurrently modifying the interactive model comparison graph and the interactive model comparison table in accordance with the selection of the respective selectable control element includes:
reversing a previous operation performed in the interactive model comparison table and the interactive model comparison graph.

25. The computer-implemented system according to claim 24, wherein:
the previous operation deleted one or more selectable model comparison rows from the interactive model comparison table and one or more graph elements associated with the one or more selectable model comparison rows in the interactive model comparison graph, and
reversing the previous operation performed in the interactive model comparison table and the interactive model comparison graph includes:
re-inserting, into the interactive model comparison table, the one or more selectable model comparison rows deleted from the interactive model comparison table in the previous operation, and
re-inserting, into the interactive model comparison graph, the one or more graph elements deleted from the interactive model comparison graph in the previous operation.

26. The computer-implemented system according to claim 24, wherein:
the previous operation added one or more new selectable model comparison rows to the interactive model comparison table and one or more new graph elements associated with the one or more new selectable model comparison rows to the interactive model comparison graph, and
reversing the previous operation performed in the interactive model comparison table and the interactive model comparison graph includes:
deleting the one or more new selectable model comparison rows added to the interactive model comparison table in the previous operation, and
deleting the one or more new graph elements added to the interactive model comparison table in the previous operation.

27. The computer-implemented system according to claim 22, wherein:
the respective selectable control element executes a model redo operation to transition the interactive model comparison graph and the interactive model comparison table from comparing the plurality of models to comparing the new set of models, and
concurrently modifying the interactive model comparison graph and the interactive model comparison table in accordance with the selection of the respective selectable control element includes:
re-performing an operation that was previously undone in the interactive model comparison table and the interactive model comparison graph.

28. The computer-implemented system according to claim 22, wherein the computer-readable instructions cause the computing device to perform operations further comprising:
- fitting the plurality of models using a fatigue model platform, wherein the plurality of models measure stress per cycles.

29. The computer-implemented system according to claim 28, wherein:
- the interactive model comparison graph corresponds to a stress per cycles graph,
- the plurality of models corresponds to a plurality of fatigue life models, and
- the fatigue model platform fits the plurality of fatigue life models using the plurality of distributions.

30. The computer-implemented system according to claim 22, wherein the computer-readable instructions cause the computing device to perform operations further comprising:
- detecting, at the interactive model comparison table, an input selecting a respective selectable model comparison row of the plurality of selectable model comparison rows, and
- in response to detecting the input selecting the respective selectable model comparison row:
  - visually highlighting the respective selectable model comparison row selected in the interactive model comparison table, and
  - visually highlighting a graph element associated with the respective selectable model comparison row selected in the interactive model comparison graph.

* * * * *